United States Patent [19]

Imazeki et al.

[11] Patent Number: 4,679,245
[45] Date of Patent: Jul. 7, 1987

[54] RADIO RECEIVER

[75] Inventors: Kazuyoshi Imazeki; Nobuaki Yokoyama, both of Tokyo, Japan

[73] Assignee: General Research of Electronics, Inc., Tokyo, Japan

[21] Appl. No.: 853,472

[22] Filed: Jun. 20, 1986

Related U.S. Application Data

[62] Division of Ser. No. 661,025, Oct. 15, 1984, abandoned.

[51] Int. Cl.⁴ ............................................. H04B 1/16
[52] U.S. Cl. .................................... 455/155; 455/200; 455/234
[58] Field of Search ............... 455/155, 200, 226, 234; 330/2

[56] References Cited

U.S. PATENT DOCUMENTS

| 2,101,891 | 12/1937 | Beers | 455/155 |
| 3,821,649 | 6/1974 | Grosjean | 455/155 |
| 4,128,810 | 12/1978 | Ogita | 455/155 |
| 4,143,331 | 3/1979 | Page | 455/219 |

FOREIGN PATENT DOCUMENTS

| 5915 | 1/1978 | Japan | 455/155 |
| 28517 | 3/1981 | Japan | 455/155 |

Primary Examiner—Jin F. Ng
Attorney, Agent, or Firm—Trexler, Bushnell, Giangiorgi & Blackstone, Ltd.

[57] ABSTRACT

A linearity control system comprises a current controlling circuit responsive to a meter control signal for controlling the current flow through the meter so as to increase the range of linear response of the meter.

4 Claims, 14 Drawing Figures

RADIO RECEIVER

This is a divisional of co-pending application Ser. No. 661,025 filed on Oct. 15, 1984 now abandoned.

BACKGROUND OF THE INVENTION

This invention is directed generally to the field of radio receivers, and more particularly to a novel noise blanking system for eliminating impulse-type noise from the audio output signal of a radio receiver, to a novel signal strength meter response linearizing system, and to a novel tuning system for a radio receiver.

The problem of adequate noise suppression with respect to a number of potential noise or spurious signal sources has been often encountered in the radio receiver arts. In a radio receiver of the type capable of receiving radio signals over multiple bands or over a relatively broad bandwidth, maintaining reception capability while rejecting noise and spurious signals invariably presents problems in receiver design. While the prior art has addressed the problem of suppression of noise or spurious signals from a variety of sources, there is room for improvement in addressing the problem of eliminating impulse-type noise from the audio output signal of a radio receiver.

Such impulse noise signals are especially bothersome in short wave (SW) receivers, which may receive signals in single side band (SSB) transmissions comprising either upper side band (USB) or lower side band (LSB) as well as continuous wave (CW) transmissions of the type generally utilized to transmit Morse code. Such impulse noise (also referred to as pulsating or pulse-type noises) may come from various sources. For example, motors, fluorescent lamps, and the like, may produce pulsating signals or noise pulses which may be picked up by a radio receiver and reproduced in the audio output signal.

Another source of such pulse-type noise particularly in short wave type receivers is the pulse noises associated with "over the horizon radar" ("the woodpecker"). Since such impulse or pulse-type noises are of relatively short duration, they are difficult to detect and eliminate from the audio output of a radio receiver. However, since such noises are often repetitive and randomly occurring, they are irritating and often obscure portions of the desired signal transmission, when they are reproduced in the audio signal output of the receiver.

Radio receivers often include a signal strength meter for producing an indication of the relative strength of the received signal. Such a signal strength indication is useful in aiding manual tuning of the received signal to attain the maximum signal strength and the optimum tuning closest to the center frequency of the received signal. However, the range of signal strength of received signals generally varies over a relatively wide range. Hence, to permit stable receiver operation and provide a reliable audio signal output well above the noise level, most receivers incorporate an automatic gain control circuit. Such an automatic gain control circuit generally controls the gain at one or more amplifiers which process the received signal. That is, the gain is increased for relatively weak received signals and decreased for relatively strong received signals. This process tends to compress the range of signal strength of the resulting demodulated or discriminated audio signals. Signal strength meters in most receivers reflect the effects of the automatic gain control circuit and hence give only an abbreviated or compressed indication of the range of signal strength of the received radio signals.

In this regard, such signal strength meters may be coupled to receive a gain control signal of the automatic gain control circuit, which bears an inverse relation to the received signal strength. However, the automatic gain control circuit signal generally has a greatly abbreviated linear range compared with the range of received signal strength. Hence, use of this signal at the meter results in a greatly abbreviated or compressed indication of received signal strength.

Heretofore, radio receiver tuning systems have generally utilized either conventional heterodyne or phase-locked loop circuits and techniques. Such techniques generally provide continuous tuning of frequencies over a given range. However, in many applications such continuous frequency tuning is not necessary. We have found that an incremental frequency tuning system can aid in eliminating spurious signals and in eliminating disturbances such as beat frequencies or "birdies".

OBJECTS AND SUMMARY OF THE INVENTION

Accordingly, it is a general object of this invention to provide a novel and improved radio receiver.

A more particular object is to provide a radio receiver employing a novel noise blanking system particularly adapted to eliminate impulse-type noises from the audio output of a radio receiver.

An additional object is to provide a radio receiver employing a novel signal strength meter response linearizing system for greatly increasing the linear range of response of a signal strength meter of a radio receiver.

Yet a further object is to provide a radio receiver employing a novel incremental frequency tuning system for tuning radio signals at predetermined increments over a predetermined range of frequencies.

In accordance with a first aspect of the invention, there is provided a noise blanking system for a radio receiver comprising switching means interposed in a predetermined portion of a signal path in the radio receiver and having a first state for allowing signals in said signal path to pass through said switching means and selectively actuatable to a second state for preventing said signals from passing through said switching means. The switching means includes control input means and is responsive to a predetermined signal condition at said control input means for actuation to said second state. The switching means assumes the first state in the absence of the predetermined signal condition at the control input means. Blanking signal producing means are operatively coupled with the control input means and also coupled to receive signals from a portion of said signal path ahead of said switching means. The blanking signal producing means are responsive to predetermined noise signals received by the radio receiver for producing a blanking signal comprising the predetermined signal condition in a predetermined systematic fashion to thereby prevent the noise signal from passing through the switching means and hence from passing through the signal path.

In accordance with a further aspect of the invention, there is provided a signal strength meter linearity control system for a radio receiver including an automatic gain control circuit for producing an automatic gain control signal and a signal strength meter coupled for response to the automatic gain control signal. The control system comprises current controlling circuit means coupled with the signal strength meter and responsive to a predetermined meter control signal for controlling the current flow through the signal strength meter so as to increase the range of linear response of the meter to the signal from the automatic gain control circuit. Signalling circuit means are coupled with the automatic gain control circuit and with the current controlling circuit means and are responsive to the automatic gain control signal for producing the predetermined meter control signal in a predetermined systematic fashion.

In accordance with a further aspect of the invention there is provided a tuning system for a radio receiver comprising first local oscillator means for producing first local oscillator signals at frequencies over a predetermined range of frequencies; said first local oscillator means being responsive to first predetermined oscillator control signals for varying the frequency of said first local oscillator signals at first predetermined increments. Second local oscillator means are provided for normally producing a second local oscillator signal at a predetermined frequency. Frequency varying means are coupled with the second local oscillator means and responsive to second predetermined oscillator control signals for varying the frequency of the second local oscillator signals over a second predetermined range of frequencies relative to said predetermined frequency normally produced thereby and at second predetermined increments, the second predetermined increments being smaller than the first predetermined increments. Control circuit means are provided for producing the first and second predetermined oscillator control signals.

BRIEF DESCRIPTION OF THE DRAWINGS

The features of the present invention which are believed to be novel are set forth with particularity in the appended claims. The organization and manner of operation of the invention, together with further objects and advantages thereof, may best be understood by reference to the following description taken in connection with the accompanying drawings in the several figures of which like reference numerals identify like elements, and in which:

DETAILED DESCRIPTION OF THE ILLUSTRATED EMBODIMENT

Figure 1A:
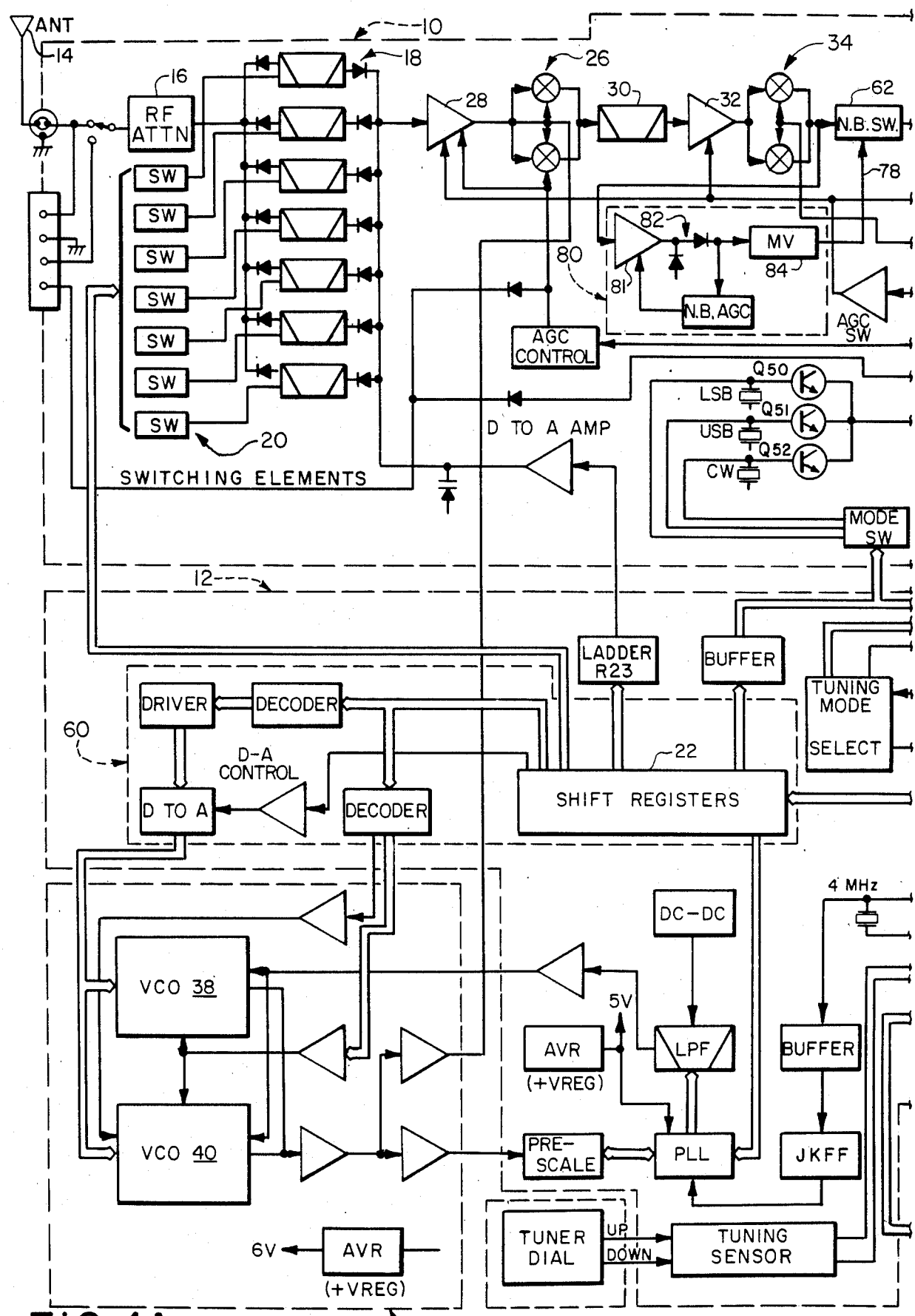
FIGS. 1A and 1B taken together form a block diagram of a radio receiver employing novel systems in accordance with the invention.
Figure 1B:
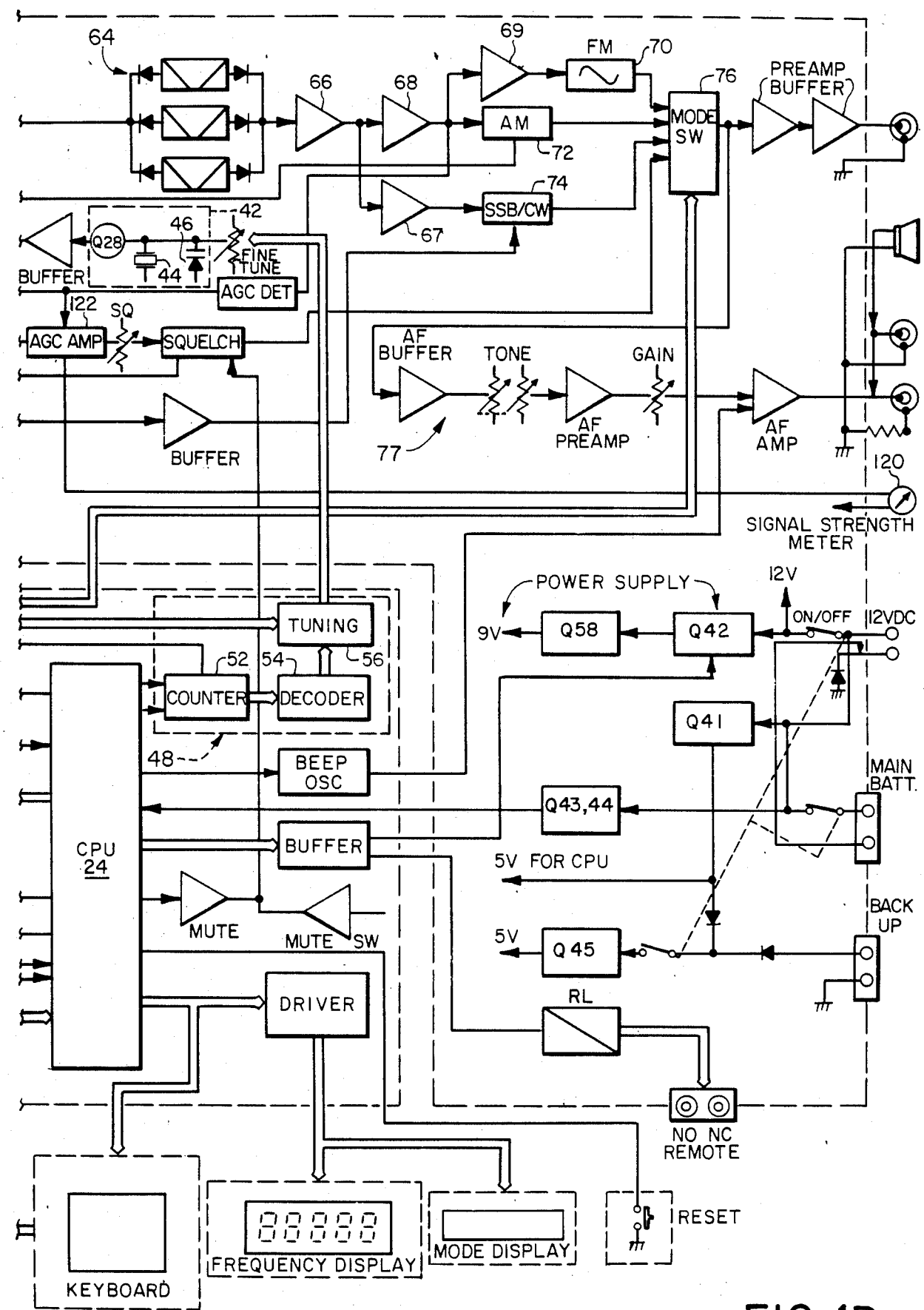

Referring now to the drawings and initially to FIG. 1, a novel radio receiver including features in accordance with the present invention is illustrated in block diagrammatic form. Generally speaking, the receiver includes a linear circuit portion enclosed in dashed line generally indicated at reference numeral 10 and a logic circuit portion enclosed in dashed line indicated generally by reference numeral 12. The schematic circuit diagram formed by FIGS. 2A-2D inclusive illustrates further details of the linear circuit portion 10, while the schematic circuit diagram of FIGS. 3A-3D inclusive illustrates further details of the logic circuit portion 12.

Generally speaking, the linear circuit 10 receives radio signals by way of an antenna (ANT) 14 at a radio frequency attenuator circuit (RF ATTN) 16. This RF attenuator circuit feeds the received radio frequency (RF) signal to a selectable one of a plurality of crystal tuning elements designated generally by reference numeral 18. A corresponding plurality of switching elements designated generally by reference numeral 20 selects a suitable one of the crystal elements 18 for receiving the desired or selected radio signal. These switching elements 20 are in turn controlled by a shift register 22 in the logic circuit 12 which is in turn controlled by a CPU, microprocessor or microcomputer 24. In the illustrated embodiment, the crystals 18 are seven in number and cover the radio frequencies from substantially 10 KHz to 30 MHz. Other ranges of operation, as well as other methods and apparatus for RF tuning in this fashion may be utilized without departing from the invention.

The selected and tuned RF signal is fed to a first mixer circuit 26 by way of an RF amplifier 28. Here, a first local oscillator signal, produced in a manner which will be presently described, is mixed with the received radio frequency signal to produce a first intermediate frequency (IF) signal. This first IF signal is fed through a crystal filter, which in the illustrated embodiment is a 40.455 MHz crystal filter 30 and thence through a first IF amplifier 32 to a second mixer circuit designated generally by the reference numeral 34. At the second mixer circuit 34, the first IF signal is further mixed with a second local oscillator signal to produce a second intermediate frequency (IF) signal.

In accordance with a first aspect of the invention, first local oscillator signals at frequencies over a first predetermined range of frequencies are produced by first local oscillator means in the form of a voltage-controlled oscillator circuit (VCO) 36 of the logic circuit portion 12. In the illustrated embodiment, this VCO circuit 36 comprises first and second VCO's 38, 40 for covering a range of first local oscillator signal frequencies from substantially 40.465 MHz to 70.455 MHz. However, fewer or more such VCO's may be utilized to produce local oscillator signals at other frequencies without departing from the invention. As previously indicated, these first local oscillator signals are utilized at the first mixer 26 to mix with the RF signals to form the first IF signals.

The first local oscillator means is responsive to first predetermined oscillator control signals for varying the frequency of the first local oscillator signals over a first predetermined range of frequencies at first predetermined increments. In the illustrated embodiment, this range of frequencies comprises the frequencies from 40.465 MHz to 70.455 MHz as discussed above, while the increments of tuning in this range comprise 1 KHz increments.

Further in accordance with this aspect of the invention, the second local oscillator signal utilized at the second mixer circuit 34 normally comprises a signal at a predetermined frequency. This signal is produced by second local oscillator means which in the illustrated embodiment comprise a second local oscillator circuit designated generally by reference numeral 42. This second local oscillator circuit 42 will be seen to include a reference crystal element 44 which in the illustrated embodiment comprises a 40 MHz crystal and a varactor element 46. However, other oscillator circuits may be utilized without departing from the invention.

Further in accordance with the first aspect of the invention, frequency varying means designated generally by reference numeral 48 and forming a part of the logic circuit 12 are coupled with the second local oscillator. These frequency varying means are responsive to second predetermined oscillator control signals for varying the frequency of the second local oscillator signal over a second predetermined range of frequencies relative to the predetermined frequency (40 MHz) normally produced thereby and at second predetermined increments. These second predetermined increments are smaller than the first predetermined increments (1 KHz), and in the illustrated embodiment comprise increments of frequency of substantially on the order of 100 Hz.

Control circuit means comprising the microprocessor or CPU 24 produce the first and second predetermined oscillator control signals for controlling the frequency variations and the frequency increments of the signals produced by the respective first and second local oscillators.

It will be understood that the second local oscillator 42 normally produces a 40 MHz second local oscillator signal. Accordingly, the tuning of the receiver will normally be at 1 KHz increments in response to the increments of frequency of the first local oscillator signal. However, selector means which here take the form of a selector switch 50 (see FIG. 3A) are selectively actuatable for causing the control circuit means or microprocessor 24 to produce the second predetermined control signals, thereby varying the second local oscillator signal at the second predetermined (100 Hz) increments. Hence, when the switch 50 is actuated to the "100 Hz" position, the receiver will tune received radio frequencies in smaller, 100 Hz increments. It should be noted that other increments of tuning for both the first local oscillator and second local oscillator may readily be utilized without departing from the invention.

Referring now again briefly to the frequency varying means or circuit 48, it will be seen that this circuit includes counter means or a counter circuit 52 which is coupled to receive the second predetermined oscillator control signals from the microprocessor or CPU 24, and decoder means or a decoder circuit 54 which is coupled to the counter means or circuit 52. This counter circuit 52 and decoder circuit 54 cooperate for counting and decoding the second predetermined oscillator control signals to form control voltages corresponding to the frequencies at predetermined increments to which the second local oscillator is to be tuned or varied with respect to its normal or nominal 40 MHz frequency.

In the illustrated embodiment, this tuning is further accomplished by a tuning circuit 56 comprising a plurality of variable resistors (see FIG. 3A) coupled with the decoder 54. Moreover, in the illustrated embodiment the tuning of the second local oscillator accomplished by the circuit 48 is over the range 40 MHz plus or minus 500 Hz in 100 Hz increments. Other ranges and increments may be selected without departing from the invention, so long as the second frequency increments are smaller than the first frequency increments provided by the first local oscillator.

In this regard, the second local oscillator also comprises a voltage controlled oscillator and includes control voltage producing means in the form of the previously mentioned crystal 44 and varactor 46 for producing a control voltage corresponding to the predetermined frequency normally produced (40 MHz). This control voltage producing means is responsive to the frequency varying circuit means 48 for varying the control voltage at increments and over a range corresponding to the second predetermined increments and range (40 MHz plus or minus 500 Hz at 100 Hz increments) as previously mentioned.

As also previously indicated the first local oscillator means comprises voltage controlled oscillator means in the form of VCO's 30 and 40 which produce the first local oscillator signal. The first local oscillator further includes control voltage producing means in the form of circuits designated generally by reference numeral 60 which include the previously mentioned shift register 22, which has multiple functions in the illustrated embodiment. This control voltage producing circuit is responsive to the oscillator control signals produced by the CPU or microprocessor 24 for producing control voltages corresponding to the previously mentioned first local oscillator signal frequencies over the previously mentioned frequency range thereof (40.465 MHz–70.455 MHz) and at the previously described 1 KHz increments.

Advantageously, the above-described incremental tuning system accomplishes tuning at increments as close as 100 Hz if desired, without utilizing conventional heterodyne or phase-locked loop (PLL) techniques and circuits. Rather, the circuits utilized are greatly simplified in the present invention. Moreover, these simplified circuits and the incremental tuning achieved thereby greatly facilitate the elimination of spurious received signals and disturbance of the received signals such as beat frequencies or "birdies".

Referring again to the block diagram of FIG. 1, the second mixer circuit 34 feeds the second IF signal to a noise blanking switching circuit (N.B. SW) 62 which feeds further second intermediate frequency (IF) filters 64. The second IF filter 64 in turn feeds second IF amplifier stages 66, 67, 68 and 69, which in turn feed respective detector or discriminator circuits 70, 72 and 74. In the illustrated embodiment, three such detector circuits including an FM discriminator 70, an AM detector 72 and a single side band/continuous wave (SSB/CW) detector 74 are utilized so as to properly detect or discriminate the audio in the bands included in the range of RF frequencies received in the illustrated embodiment (10 KHz–30 MHz). However, other arrangements and types of detectors and/or discriminators as suitable for other radio bands included in other selected ranges of frequencies may of course be selected without departing from the invention. The discriminator and detectors 70, 72 and 74 feed a switching or selection circuit 76 which in turn feeds the selected detected auido to audio output circuits designated generally by reference numeral 77.

Reference is further invited to FIGS. 2A-2D and 3A-3D wherein details of the circuit construction of the foregoing circuits in accordance with one practical and preferred form of the invention are illustrated. However, it will be recognized that changes and modifications may be made as to the details of the circuit construction without departing from the invention.

In accordance with a second aspect of the invention the noise blanking switching circuit 62 comprises a switching means portion of a novel noise blanking system. This switching means is interposed in a portion of the signal path in the radio receiver and has a first state for allowing the signals in the signal path to pass therethrough and is selectively actuatable to a second state for preventing passage of the signals therethrough. In this regard, it will be recognized that the second IF signals may be either passed through the signal path to the second IF filter 64 or prevented from passing thereto by actuation of the noise blanking switching circuit or switching means 62. In this regard the noise blanking switching circuit or switching means 62 includes control input means in the form of a control input 78 responsive to a predetermined signal condition for actuating the switching means 62 to the second state for preventing signals from passing therethrough. In the absence of this predetermined signal condition at the control input 78, the switching means 62 assumes the first state for allowing signals to pass therethrough.

Further in accordance with the second aspect of the invention, a blanking signal producing means or circuit designated generally by reference numeral 80 is coupled with the control input 78 and with a portion of the signal path prior to the switching means. In the illustrated embodiment the blanking signal producing means or circuit 80 is also coupled to receive the second IF signal at the output of the second mixer circuit 34. This blanking signal producing circuit is responsive to predetermined or preselected noise signals received by the radio receiver for producing a blanking signal which comprises the predetermined signal condition for actuating the switching means 62 to the second state by way of the control input 78 thereof. Accordingly, this actuation of the switching means 62 in response to a noise signal prevents this noise signal from passing through the switching means and hence through the signal path to be reproduced ultimately at the audio output.

The blanking signal producing means includes tuning means in the form of a noise blanking or tuning amplifier 81 coupled with the signal path (at the output of second mixer 34) for tuning the predetermined or preselected noise signals to be eliminated by the noise blanking system. The blanking signal producing means or circuit 80 also includes demodulating or detecting means in the form of a diode-type detector circuit 82 coupled with the tuning means 81 for demodulating or detecting the noise signals to form pulse signals. A multivibrator (MV) circuit or means 84 is responsive to these pulse signals for producing the blanking signal. In the illustrated embodiment, and referring to FIGS. 2A and 2B, this multivibrator means takes the form of a one-shot multivibrator 84 for producing blanking pulses of controllable width in response to the pulse signals from the detector 82, these blanking pulses comprising the blanking signal fed to the control input 78 of the noise blanking switch 62.

Figure 2A:
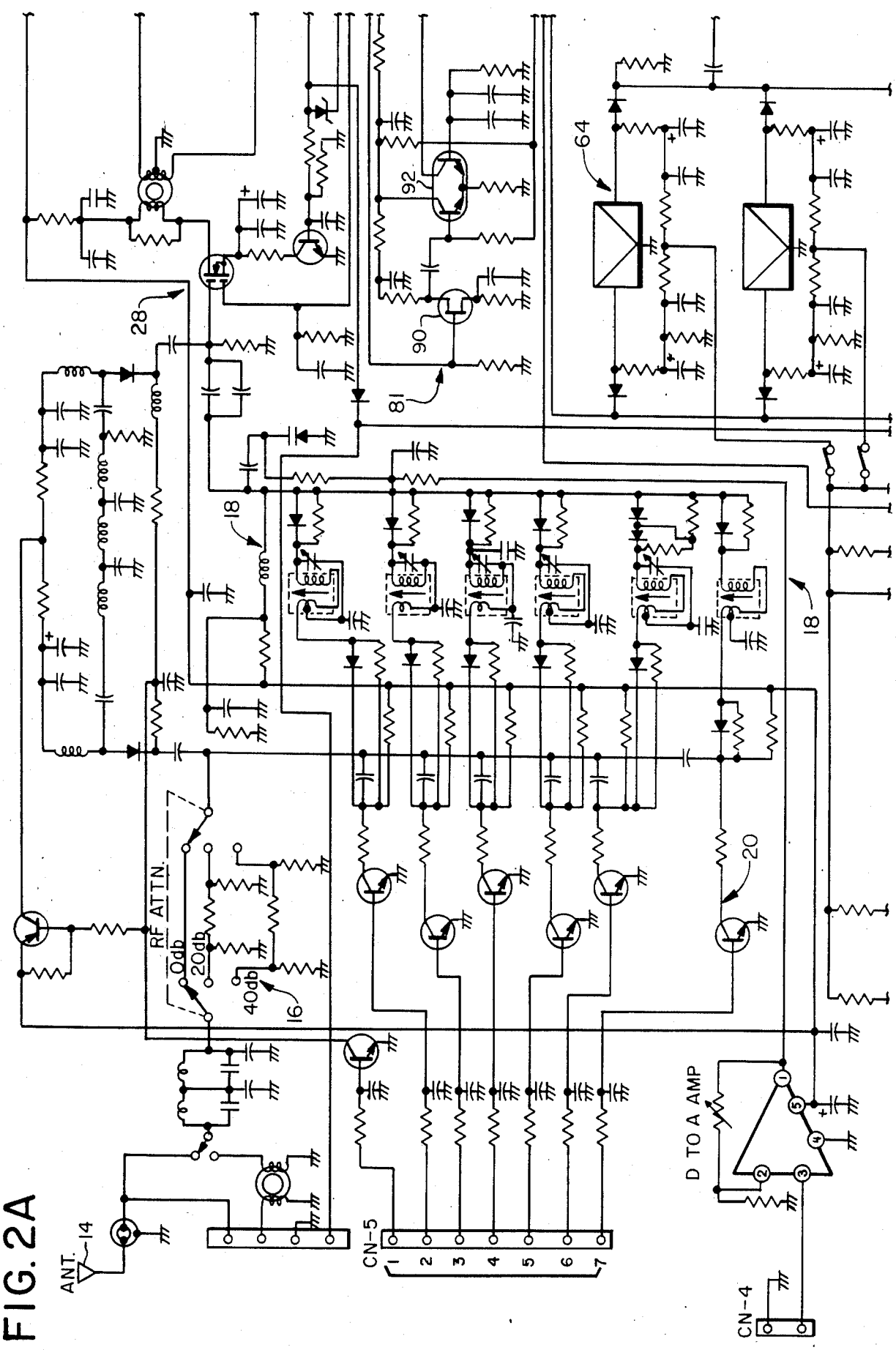
FIGS. 2A, 2B, 2C and 2D taken together form a schematic circuit diagram illustrating further details of the radio receiver of the invention.
Figure 2B:
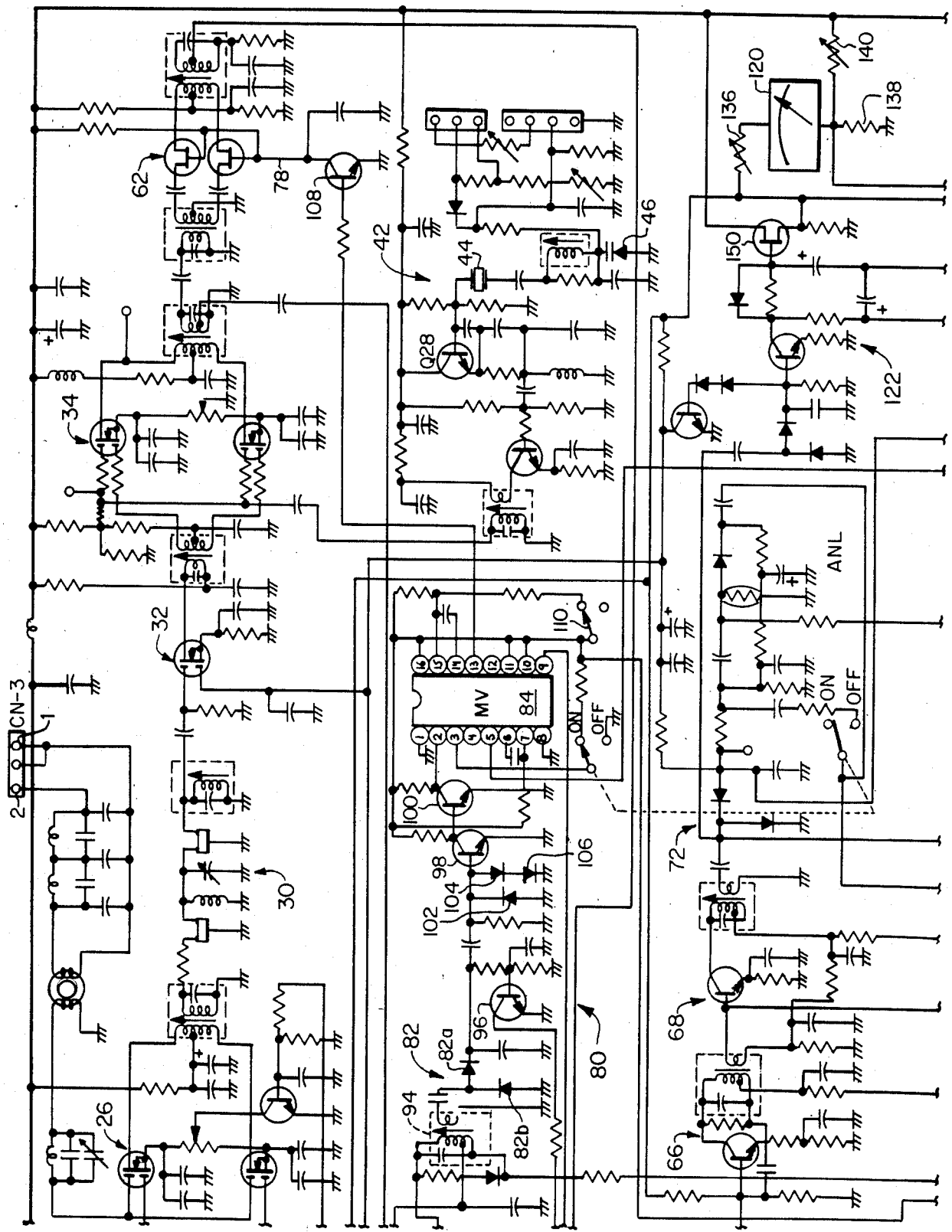
Figure 2C:
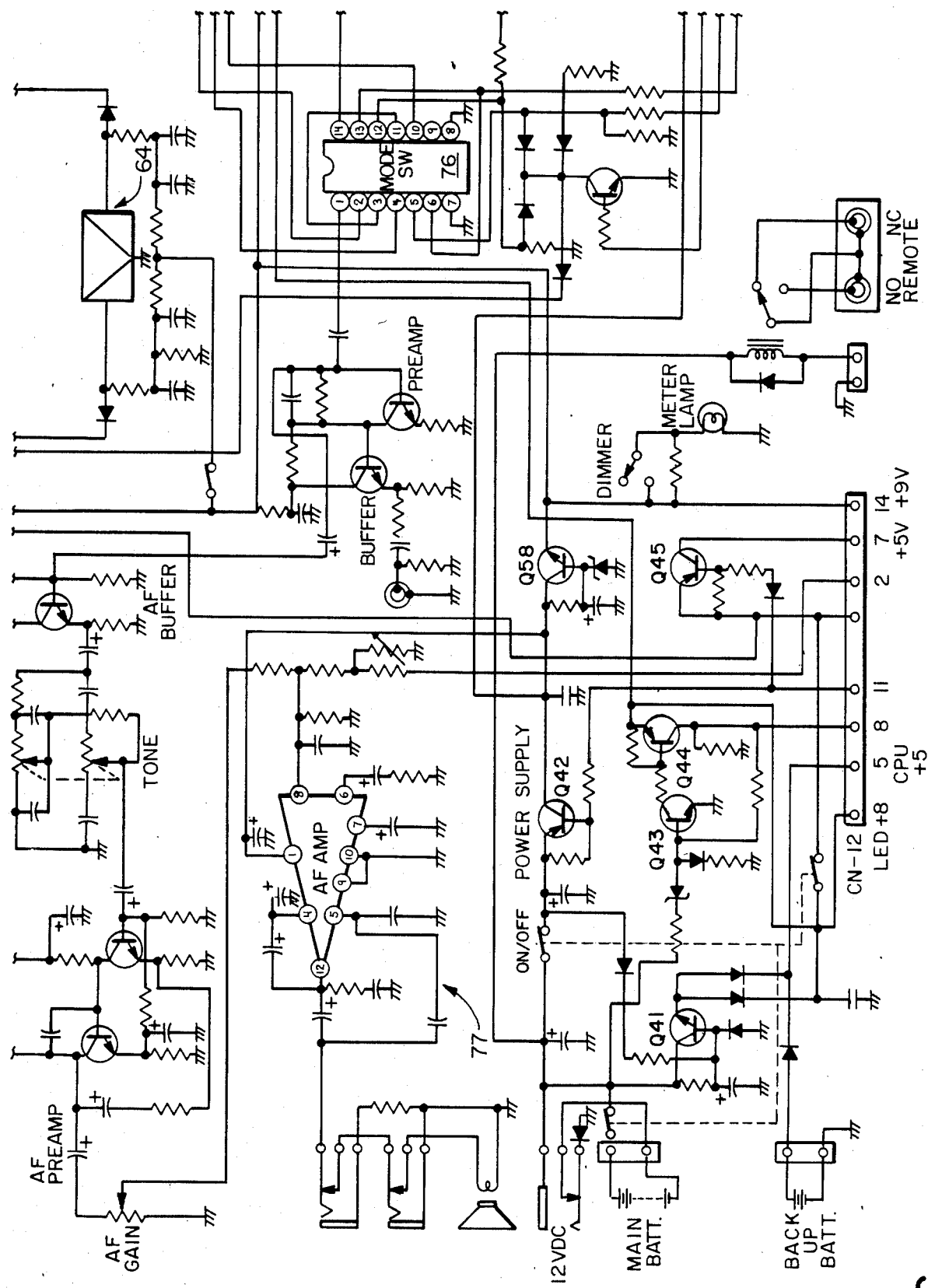
Figure 2D:
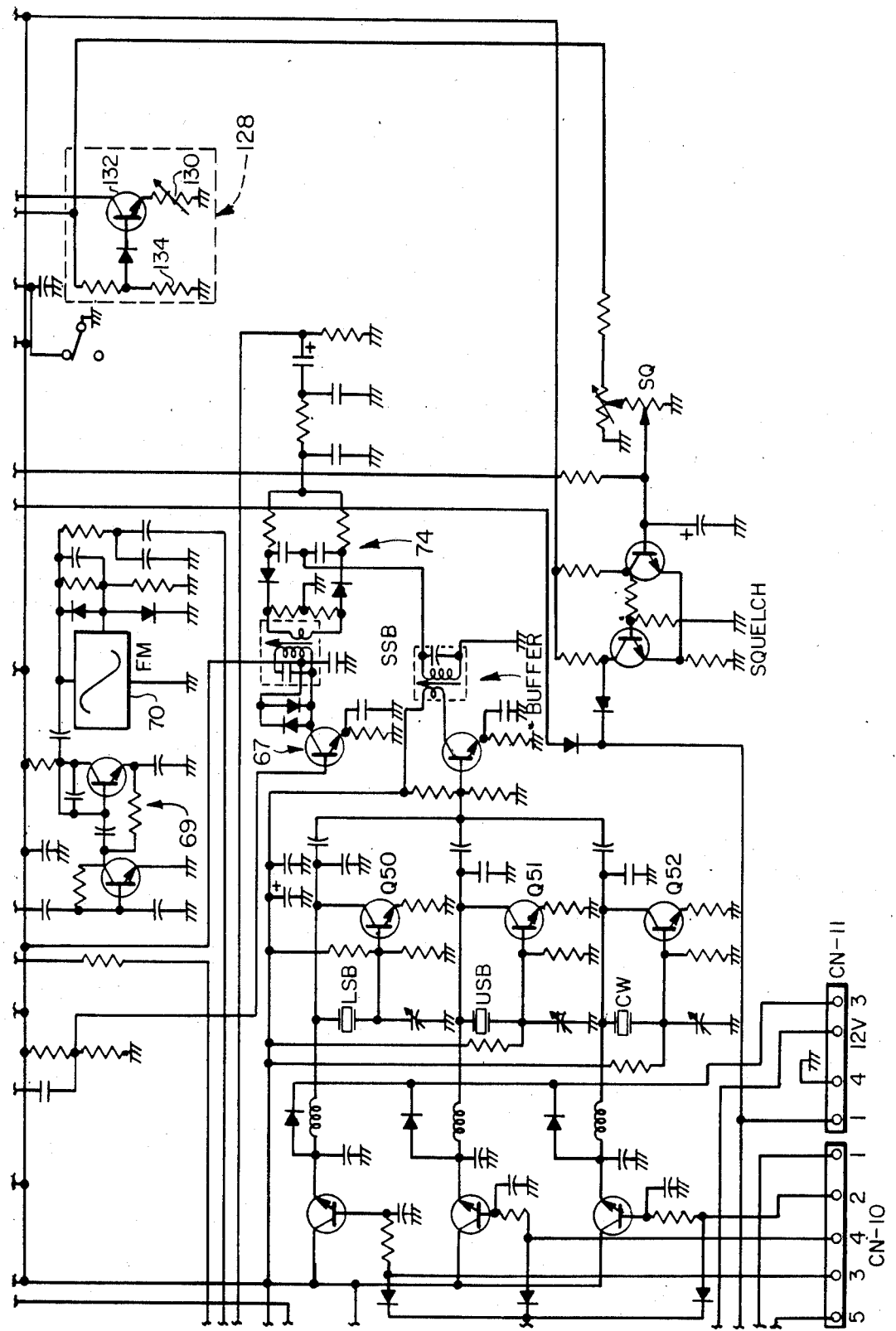
Figure 3A:
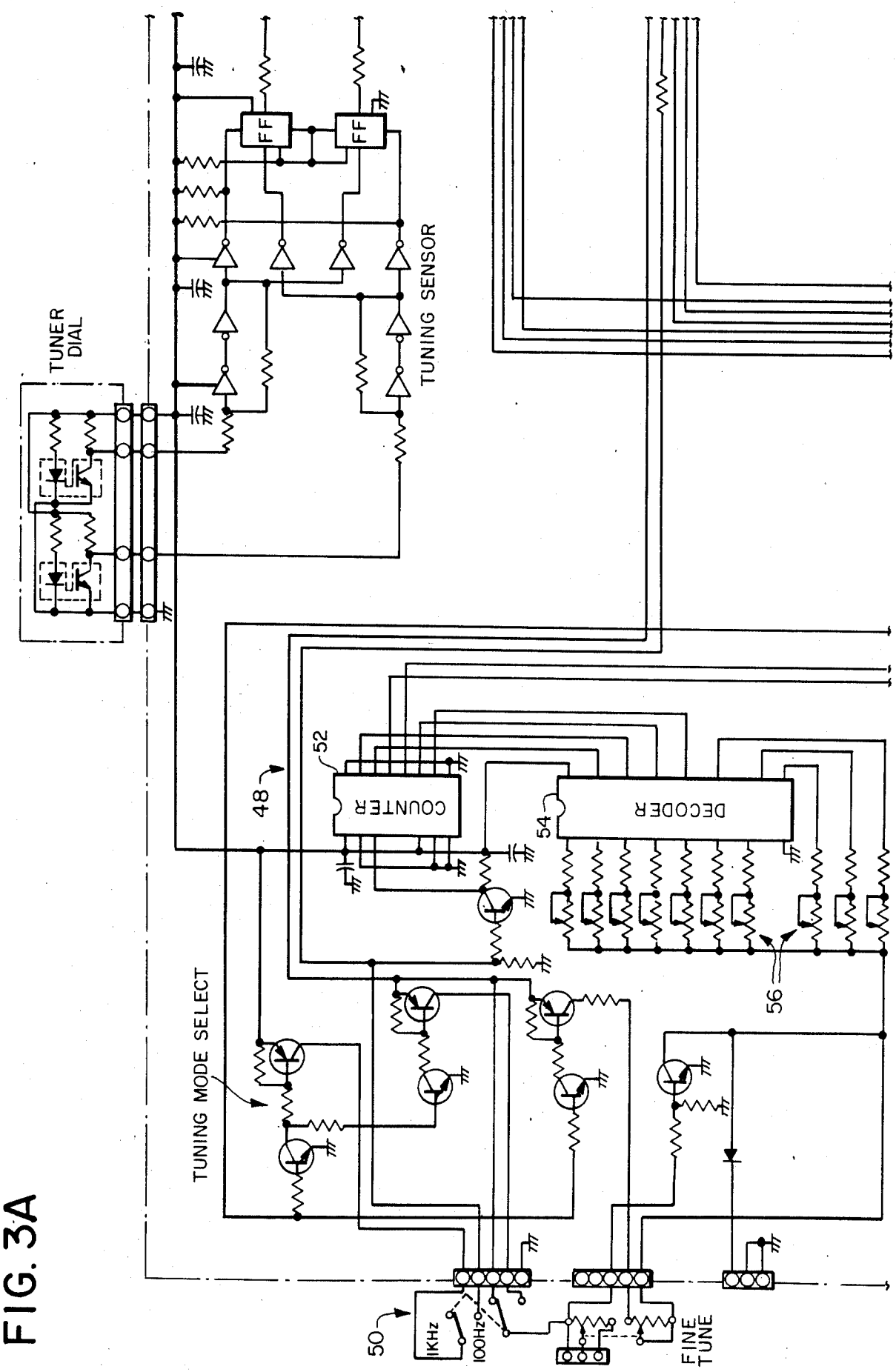
FIGS. 3A, 3B, 3C and 3D taken together form a schematic circuit diagram illustrating yet further details of the radio receiver of the invention.
Figure 3B:
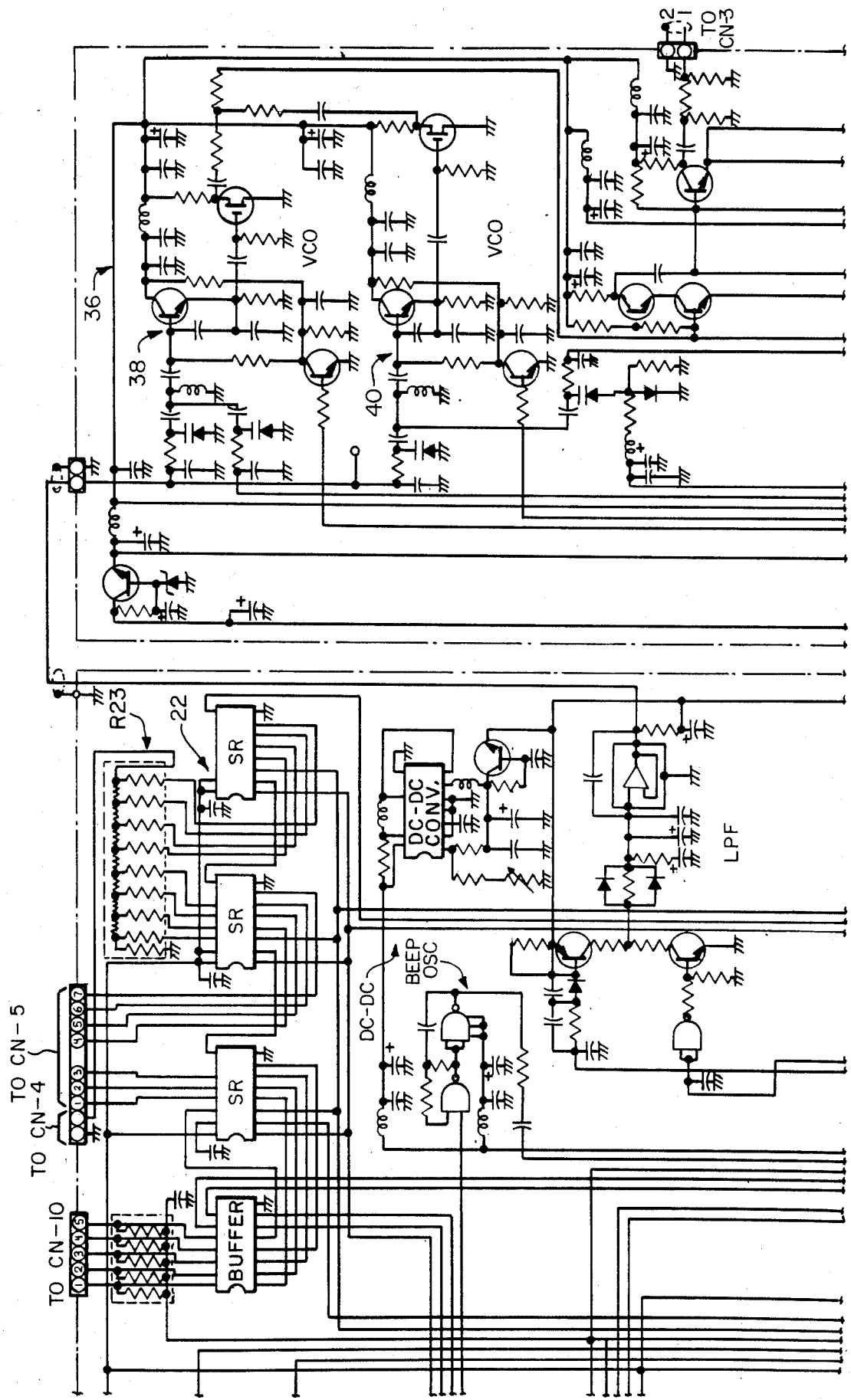
Figure 3C:
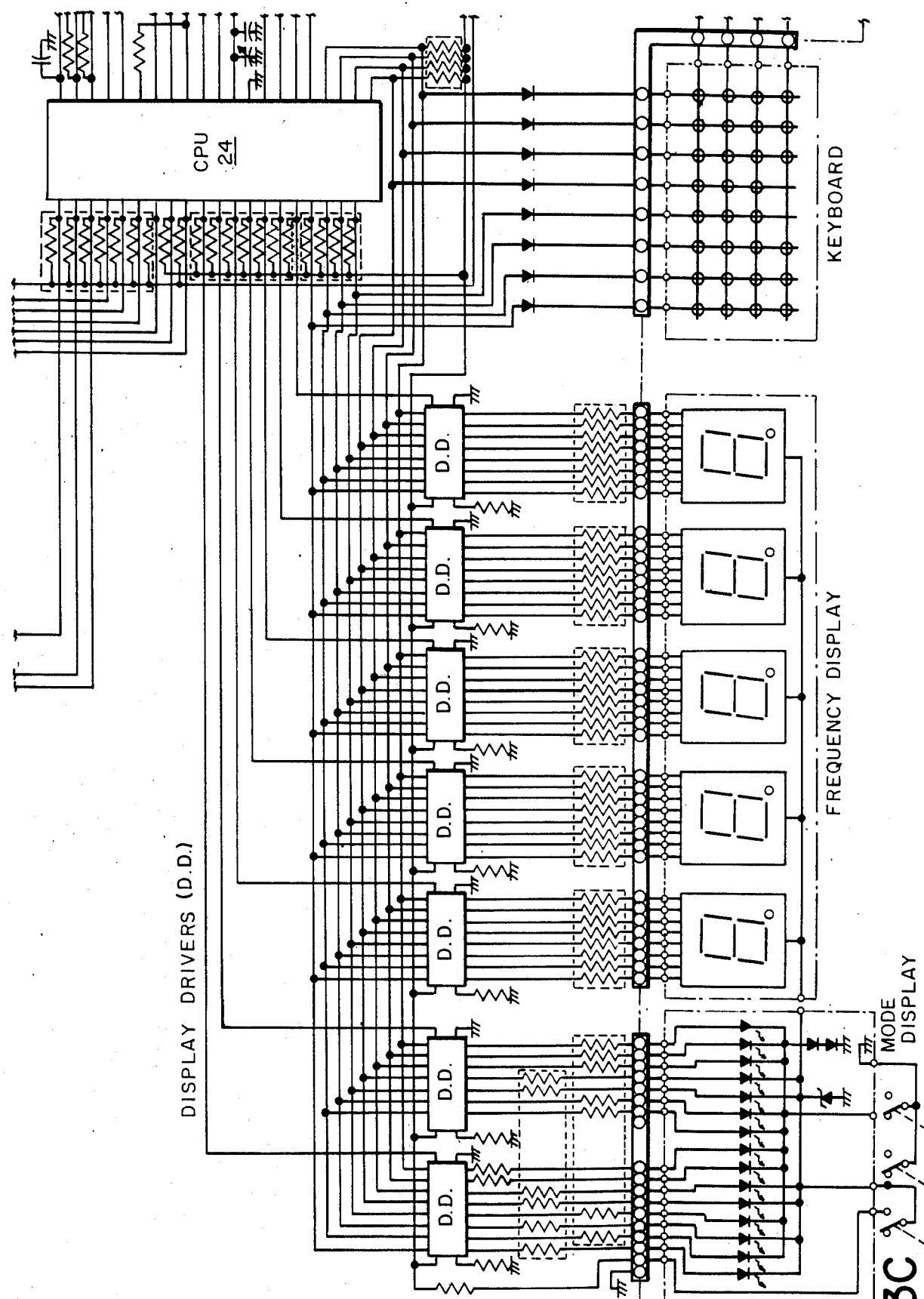
Figure 3D:
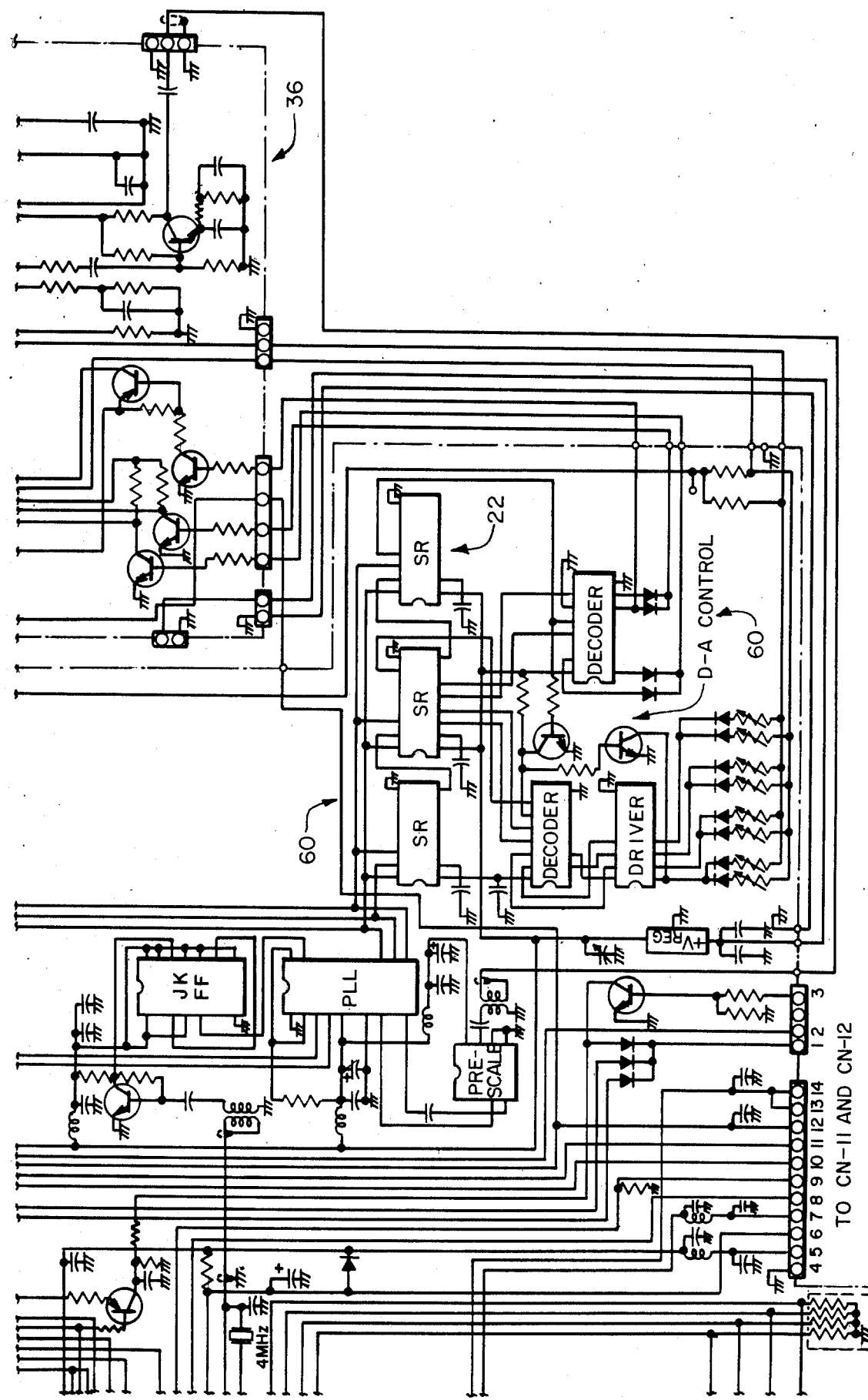
Figure 5:
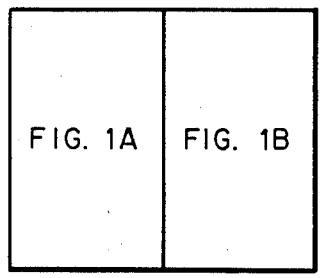
FIGS. 5, 6 and 7 illustrate respectively the manner in which the sheets of drawings bearing FIGS. 1A and 1B, FIGS. 2A, 2B, 2C and 2D, and FIGS. 3A, 3B, 3C and 3D may be respectively arranged to view the respective circuits thereof.
Figure 6:
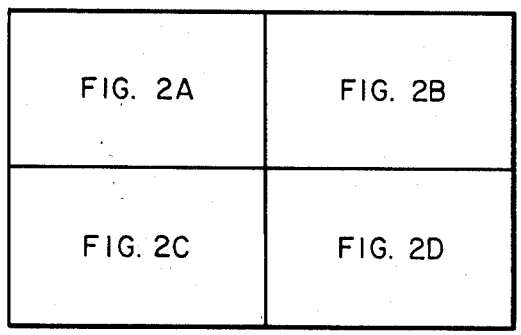
Figure 7:
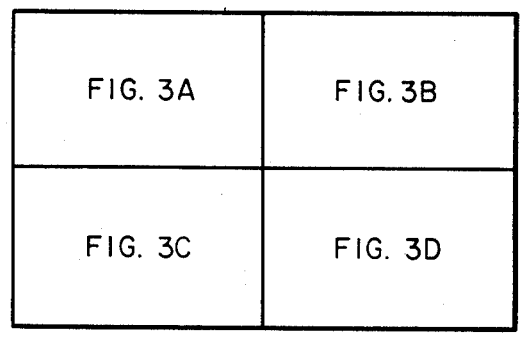

Referring still to FIGS. 2A and 2B, further details of the noise blanking system and related circuits will be described. The noise blanking or tuning amplifier 81 will be seen to comprise a transistorized amplifier circuit including an FET 90, a matched pair of transistors 92 and a tuning coil 94. The diode detector circuit 82 immediately follows tuning coil 94 and comprises diodes 82a and 82b. A further transistor 96 comprises an automatic gain control (AGC) feedback means while the demodulated signal is DC amplified by a further pair of transistors 98, 100. Diodes 102, 104 and 106 comprise a limiter circuit interposed between the demodulating means or circuit 82 and the multivibrator means or circuit 84. Coupling means comprising an additional or second switching means comprising a switching transistor 108 is interposed between the output of the multivibrator 84 and control input 78 of the noise blanking switching circuit 62.

Additionally, pulse width control means are provided for controlling the width of the blanking pulses produced by the multivibrator 84. The pulse width control means includes a selector or switch 110 for selecting either a first or a second predetermined pulse width by selecting resistive and capacitive elements for controlling the RC time constant of the multivibrator 84. This selection of the pulse width of the pulse signal from multivibrator 84 prevents passage through the blanking switching circuit 62 of noise signals of duration less than or equal to the selected pulse width. In the illustrated embodiment, two such pulse widths are provided, of on the order of substantially 20 milliseconds and 100 milliseconds, respectively. However, it will be recognized that more or other pulse widths may be selected without departing from the invention. In the illustrated embodiment, the faster or 20 millisecond pulse width is particularly advantageous in eliminating impulse-type noises from such sources as motors, fluorescent lamps and the like. Similarly the relatively slower or 100 millisecond pulse width is particularly useful in eliminating noise pulses from over-the-horizon radar, also known in the art as "the woodpecker".

In the illustrated embodiment, the predetermined noise signals to be eliminated comprise impulse or pulse-type noise signals. Accordingly, the tuning means or circuit 81 is operative for tuning carrier signals having such impulse noise signals superimposed thereon. Similarly, the demodulating means or circuit 82 operates to demodulate or detect these impulse noise signals to form noise pulses. The multivibrator acts as a one-shot multivibrator for responding to these noise pulses to produce a blanking pulse of a controllable, selected width in response to each such noise pulse. Hence, the second switching means or switching transistor 108 comprises coupling means for coupling these blanking pulses to the control input 78 of the noise blanking switching means or circuit 62. Advantageously, then, the noise impulses may be substantially eliminated from the signal path prior to discrimination or detection of the audio signal, by the novel noise blanking system just described.

In accordance with a further or third aspect of the invention, a signal strength meter linearity control system is also provided. As will be seen presently, this system advantageously extends the range of linear response of the signal strength meter 120. In this regard, in many receivers a signal strength meter such as meter 120 is provided to aid in achieving optimum tuning of the receiver to a desired signal by observing the meter indication of the strength of the signal being received.

To this end, such signal strength meters are often coupled to an automatic gain control (AGC) circuit (such as circuit 122) of the receiver for response to an automatic gain control signal. However, this automatic gain control signal is not linearly related to the signal strength, but rather varies over a rather limited or compressed range relative to the signal strength. The AGC circuit, as is well known in the art, is provided to generally increase the signal strength of relatively weak signals so as to generally compress the overall range of signal strengths, thereby compensating for differences in received signal strength between various channels at the audio output. This in turn obviates the need to frequently readjust the volume of the audio output. However, the effect of this AGC circuit on the signal strength meter is to provide a fairly limited range of linear response of the meter, thereby limiting its usefulness to the operator. That is, the meter tends to reach full scale or saturation very rapidly when driven by the AGC signal.

Figure 4:
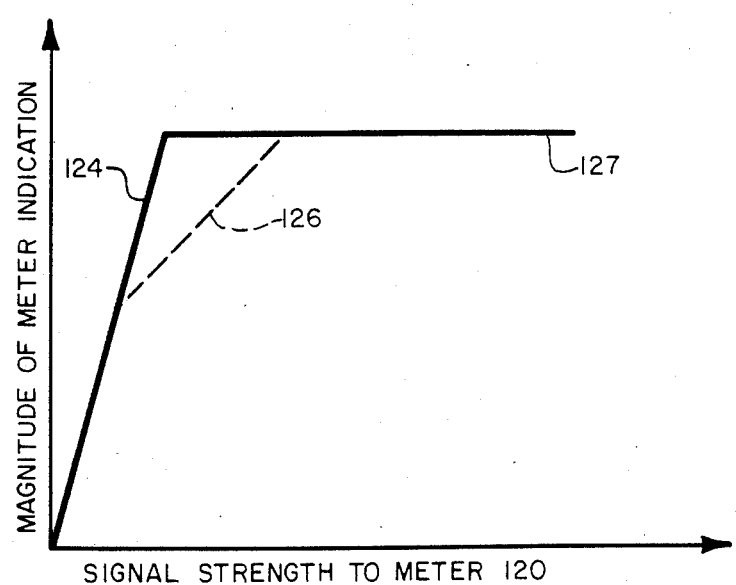
FIG. 4 is a graphic representation of waveforms associated with the signal strength meter linearizing system of the invention.

Advantageously, the signal strength meter linearity control system of the invention greatly extends this linear range of response of the meter 120. Reference is also invited to FIG. 4 wherein a graphical illustration shows the normal linear range of the signal strength meter in response to the normal output signals of the AGC circuit 122. This normal linear range is indicated generally at reference numeral 124, with saturation being indicated by reference numeral 127. The extended linear response provided by the linearity control system of the invention is designated generally at reference numeral 126.

In this regard, and referring again to FIG. 2D, the linearity control system of the invention is designated generally by reference numeral 128. This system 128 comprises current controlling circuit means in the form of a variable resistor 130 and a switching transistor 132 coupled to the signal strength meter 120 and responsive to a predetermined current control signal for controlling the current flow through the signal strength meter in a predetermined fashion to increase the linear range of response thereof. The system further includes signalling circuit means, here comprising a lambda-shaped negative resistance element 134 which is coupled with the AGC circuit and with the current controlling circuit at transistor 132 and is responsive to the AGC signal for producing the current control signal in a predetermined systematic fashion.

In the illustrated embodiment the transistor 132 operates as switching means responsive to the output of the lambda-shaped negative resistance element 134 for respectively switching the variable resistor 130 into and out of series circuit with the signal strength meter 120. In this regard, the signal strength meter is coupled to receive the AGC signal through a variable resistor 136 at one end thereof and at its opposite side or terminal is coupled to a voltage divider comprising a pair of resistors 138, 140 coupled between a positive potential and circuit ground. The transistor 132 is coupled in circuit for alternatively switching the variable resistor 130 into and out of parallel circuit with the resistor 138.

Accordingly, when variable resistor 130 is switched into parallel circuit with resistor 138, the voltage at this side of meter 120 decreases, thereby bringing the meter away from the saturation region indicated by the line 127 in the graph of FIG. 4 and into the extended linear range indicated by dashed line 126. Transistor 132 comprises switching means including control input means, namely, its base electrode, which is responsive to the predetermined current control signal comprising the current through the lambda-shaped negative resistance device 134 for switching the resistor 130 into circuit in this fashion. In this regard, the current-carrying base and emitter electrodes of the transistor 132 will be seen to be coupled respectively in series circuit between the signal strength meter 120 and the variable resistor 130.

In the illustrated embodiment, the lambda-shaped negative resistance device comprises a device of the type generally designated MA522, available for example from Matsushita Electric Products. This device passes current therethrough with about three volts DC applied to the anode electrode thereof. In this regard, the illustrated embodiment preferably uses a device designated MA522P, which has a voltage-to-current characteristic such that current is passed when the voltage at the anode electrode is from substantially 2.5 to 3.3 volts DC. Other equivalent circuits or devices may of course be utilized without departing from the invention. The voltage-to-current characteristic of such a device is such as to pass current therethrough during but a portion of the output voltage range of the AGC circuit 122, to thereby extend the linear portion of the curve as indicated by curve 126 of FIG. 4.

In the illustrated embodiment the AGC output appears at the source electrode of an FET 150, and is substantially 4.3 volts DC in the absence of a received radio signal. As the level of the received radio signal becomes larger, the AGC level decreases. At about 3 volts at the anode thereof, the lambda-shaped negative resistance device 134 conducts current to switch on the transistor 132 and thereby place the variable resistor 130 in parallel circuit with fixed resistor 138. This decreases the voltage at the junction of resistor 138 with meter 120. It will be remembered that the AGC voltage decreases with increasing signal strength. Accordingly, decreasing the voltage at the opposite side of the signal strength meter, that is at its junction with resistor 138, will generally decrease the voltage applied across the signal strength meter as the AGC signal decreases with increasing received radio signal strength. This effectively decreases the sensitivity of the signal strength meter and provides the increased linear range 126 of FIG. 4.

Further reference of FIGS. 2A through 2D inclusive and 3A through 3D inclusive is invited for further details of the receiver.

While particular embodiments of the invention have been shown and described in detail, it will be obvious to those skilled in the art that changes and modifications of the present invention, in its various aspects, may be made without departing from the invention in its broader aspects, some of which changes and modifications being matters of routine engineering or design, and others being apparent only after study. As such, the scope of the invention should not be limited by the particular embodiment and specific construction described herein but should be defined by the appended claims and equivalents thereof. Accordingly, the aim in the appended claims is to cover all such changes and modifications as fall within the true spirit and scope of the invention.

In the illustrated embodiment, CPU or microcomputer 24 comprises a microcomputer of the type designated Toshiba TMP47C40P. An exemplary program for this microcomputer is reproduced on the following pages.

```
LOC   OBJ        LINE          SOURCE STATEMENT

1 ;
                  2 ;
                  3 ;*        COPYRIGHT 1983 GENERAL RESEARCH OF ELECTRONICS
                  4 ;
                  5 ;

ROM PAGE NO. 0

0000              6
                  7 ;***********************************************************
                  8 ;*   NAME        RADIO RECEIVER
                  9 ;*   SYSTEM      TOSHIBA TMP47C40P
                 10 ;***********************************************************

ROM PAGE NO. 0

0000             11          ORG      000
0000 64C0        12          BS       START          ; A/C ON (INITIAL)
                 13 ;
0002 61A1        14          BS       INT1           ; HOLD PROC.
                 15 ;
0004 61FB        16          BS       ISIO           ; SERIAL EMPTY
                 17 ;
0006 8E          18          BSS      IOVF1          ; TIMER(1)
0007 00          19          NOP
0008 2B          20          RETI                    ; TIMER(2)
0009 00          21          NOP
000A 2B          22          RETI                    ; I-TIMER
000B 00          23          NOP
000C 61C4        24          BS       INT2           ; P/W OFF
                 25 ;
                 26 ;
                 27 ;***********************************************************
                 28 ;*
                 29 ;* 7-3)         TIMER(1) INTERRUPT ROUTINE
                 30 ;*
                 31 ;***********************************************************
000E 3F02        32 IOVF1:   ST       A,02           ; REGISTOR HOUSEKEEP
0010 2900        33          XCH      HL,00
0012 23FC        34          LD       HL,H'FC        ; D.C SAVE
0014 29D8        35          XCH      HL,H'D8
0016 CF          36          LD       H,#H'F         ; TIMER(1) INITIALIZE
0017 E4          37          LD       L,#H'4
0018 3848        38          ADD      @HL,#H'8
001A E5          39          LD       L,#H'5
001B FF          40          ST       #H'F,@HL+
001C FF          41          ST       #H'F,@HL+
001D 49          42          LD       A,#H'9         ; "EIR" OFF
001E 13          43          XCH      A,EIR
001F 367F        44          EICLR    IL,H'3F        ; "EIF" ON
0021 E6          45          LD       L,#H'6
0022 C7          46          LD       H,#H'7         ; 3-MS TIMER COUNT
0023 0A          47          INC      @HL
                 48 ;
                 49 ;
                 50 ; 7-3)-(1)      CLOCK COUNT
                 51 ;
0024 C2          52          LD       H,#H'2
0025 0A          53          INC      @HL            ; 10-MS CLOCK COUNT
0026 44          54          LD       A,#4           ; 10-MS ?
0027 16          55          CMPR     A,@HL
0028 04          56          TESTP    CF
0029 608D        57          BS       TR30
002B 384B        58          ADD      @HL,#H'B       ; 10-MS CLOCK <--- 0
                 59 ;
```

```
002D C3           60           LD      H,#H'3        ; 100MS CLOCK COUNT
002E 0A           61           INC     aHL
002F 4A           62           LD      A,#10         ; 100MS ?
0030 16           63           CMPR    A,aHL
0031 6063         64           BS      TR20
0033 3870         65           AND     aHL,#H'0      ; 100MS CLOCK <--- 0
0035 C2           66           LD      H,#H'2        ; 100MS CLOCK HOSEI
0036 0A           67           INC     aHL
0037 C4           68           LD      H,#H'4        ; 1-SEC CLOCK COUNT
0038 0A           69           INC     aHL
                  70 ;
0039 3C0E         71           LD      A,H'0E
003B 383E         72           AND     A,#H'E        ; FREQ. DISPLAY ?
003D 6040         73           BS      TR10
003F 9A           74           BSS     TR16
                  75 ;

ROM PAGE NO. 1

0040 39FE         76 TR10:     TESTP   H'E,3         ; ERROR DISPLAY ?
0042 9A           77           BSS     TR16
0043 39EE         78           TESTP   H'E,2         ; CLOCK(1) DISPLAY ?
0045 89           79           BSS     TR12
0046 39AC         80           TEST    H'C,2         ; CLOCK(2) INPUT ?
0048 9A           81           BSS     TR16
0049 0C           82 TR12:     LD      A,aHL
004A D5           83           CMPR    A,#5          ; 1-SEC CLOCK = 5 ?
004B 94           84           BSS     TR14          ;-NO-
004C 3CC0         85           LD      A,H'C0
004E D0           86           CMPR    A,#0          ; KETASU = 0 ?
004F A3           87           BSS     TR20          ;-NO-
0050 4F           88           LD      A,#H'F        ; DISPLAY OFF
0051 3FC3         89           ST      A,H'C3
0053 A3           90           BSS     TR20
                  91 ;
0054 DA           92 TR14:     CMPR    A,#10         ; 1-SEC CLOCK = 10 ?
0055 A3           93           BSS     TR20          ;-NO-
0056 4A           94           LD      A,#H'A        ; DISPLAY ON
0057 3FC3         95           ST      A,H'C3
0059 9D           96           BSS     TR18
                  97 ;
005A 0C           98 TR16:     LD      A,aHL
005B DA           99           CMPR    A,#10         ; 1-SEC CLOCK = 10 ?
005C A3           100          BSS     TR20          ;-NO-
005D C2           101 TR18:    LD      H,#H'2        ; 1-SEC CLOCK HOSEI
005E 0A           102          INC     aHL
005F CF           103          LD      H,#H'F
0060 E4           104          LD      L,#H'4
0061 3844         105          ADD     aHL,#4
                  106 ;
                  107 ;
                  108 ;  7-3)-(2)    TIMER COUNT
                  109 ;
0063 C6           110 TR20:    LD      H,#H'6
0064 3986         111          TEST    6,0           ; 50-MS TIMER REQUEST ?
0066 B1           112          BSS     TR21
0067 E6           113          LD      L,#H'6
0068 0A           114          INC     aHL           ; 50-MS TIMER COUNT
0069 45           115          LD      A,#5          ; 50-MS ?
006A 16           116          CMPR    A,aHL
006B B1           117          BSS     TR21
006C 3946         118          CLR     6,0           ; 50-MS REQUEST FLAG OF
006E 3865         119          CLR     %05,2         ; "PEEP" OFF
0070 BB           120          BSS     TR22          ;==DUMMY==
                  121 ;
0071 3996         122 TR21:    TEST    6,1           ; 100MS TIMER REQUEST ?
0073 BB           123          BSS     TR22
```

```
0074 E7       124           LD      L,#H'7        ; 100MS TIMER COUNT
0075 0A       125           INC     aHL
0076 4A       126           LD      A,#10         ; 100MS ?
0077 16       127           CMPR    A,aHL
0078 BB       128           BSS     TR22
0079 3917     129           SET     7,1           ; 100MS PASS FLAG ON
              130 ;
007B E8       131 TR22:     LD      L,#H'8        ; 300MS TIMER COUNT
007C 0A       132           INC     aHL
007D 6081     133           BS      TR23
007F E9       134           LD      L,#H'9

ROM PAGE NO. 2

0080 0A       135           INC     aHL
0081 E9       136 TR23:     LD      L,#H'9
0082 41       137           LD      A,#1          ; 300MS ?
0083 16       138           CMPR    A,aHL
0084 8D       139           BSS     TR30
0085 E8       140           LD      L,#H'8
0086 4E       141           LD      A,#14
0087 16       142           CMPR    A,aHL
0088 8D       143           BSS     TR30
0089 3927     144           SET     7,2           ; 300MS PASS FLAG ON
008B F0       145           ST      #0,aHL+
008C F0       146           ST      #0,aHL+
              147 ;
008D C1       148 TR30:     LD      H,#H'1        ; 8-TIMER COUNT
008E E6       149           LD      L,#H'6
008F 0A       150           INC     aHL
0090 0C       151           LD      A,aHL         ; 8-TIMER = 8 ?
0091 D8       152           CMPR    A,#8
0092 94       153           BSS     TR31
0093 B4       154           BSS     TR40
0094 CF       155 TR31:     LD      H,#H'F        ; D.C. <--- PORT ADDRE
0095 EC       156           LD      L,#H'C
0096 1A       157           ST      A,aHL+
0097 F6       158           ST      #6,aHL+
0098 D5       159           CMPR    A,#5          ; 8-TIMER = 6,7 ?
0099 06       160           TEST    CF
009A A5       161           BSS     TR32
              162 ;
009B CC       163           LD      H,#H'C        ; PLA DISPLAY
009C 31       164           XCH     A,L
009D 12       165           OUTB    aHL
009E 11       166           MOV     L,A           ; "." DISPLAY
009F 3EC6     167           CMPR    A,H'C6
00A1 AC       168           BSS     TR33
00A2 3B32     169           SET     %02,3
00A4 AC       170           BSS     TR33
              171 ;
00A5 30       172 TR32:     XCH     A,H           ; LED DISPLAY
00A6 EF       173           LD      L,#H'F
00A7 3AE1     174           OUT     aHL,%01
00A9 19       175           DEC     L
00AA 3AE2     176           OUT     aHL,%02
00AC 33       177 TR33:     LDL     A,aDC         ; SEGMENT OUTPUT
00AD 3AA6     178           OUT     A,%06
00AF 32       179           LDH     A,aDC+
00B0 3AA7     180           OUT     A,%07
00B2 6109     181           BS      TR50
              182 ;
              183 ;
              184 ;  7-3)-(4)      KEY INPUT
              185 ;
00B4 40       186 TR40:     LD      A,#0          ; 8-TIMER 0-CLEAR
00B5 0F       187           ST      A,aHL
```

```
00B6 C7         183           LD      H,#H'7
00B7 EB         189           LD      L,#H'B
00B8 39D8       190           TESTP   H'8,1       ; KEY-IN REQUEST : OFF
00BA BD         191           BSS     TR402
00BB 6109       192           BS      TR50
                193 ;
00BD 39D9       194 TR402:    TESTP   H'9,1       ; IN-FLAG : ON ?
00BF A3         195           BSS     TR44

ROM PAGE NO. 3

00C0 48         196           LD      A,#8        ; KEY OFF CHECK
00C1 16         197           CMPR    A,@HL
00C2 84         198           BSS     TR405
00C3 8D         199           BSS     TR41
00C4 04         200 TR405:    TESTP   CF
00C5 12         201           OUTB    @HL
00C6 00         202           NOP
00C7 00         203           NOP
00C8 00         204           NOP
00C9 00         205           NOP
00CA 3A20       206           IN      %00,A
00CC 88         207           BSS     TR46
00CD 3949       208 TR41:     CLR     H'9,0       ; L/I-FLAG RESET
00CF 40         209           LD      A,#0        ; PORT NO. <--- 0
00D0 0F         210           ST      A,@HL
                211 ;
00D1 04         212 TR42:     TESTP   CF          ; SEGMENT OUTPUT
00D2 12         213           OUTB    @HL
00D3 00         214           NOP
00D4 00         215           NOP
00D5 00         216           NOP
00D6 00         217           NOP
00D7 3A20       218           IN      %00,A       ; PORT (K0) INPUT
00D9 9E         219           BSS     TR43
00DA 0A         220           INC     @HL         ; PORT NO. COUNT
00DB 5B         221           TEST    @HL,3       ; PORT NO. =< 7 ?
00DC 91         222           BSS     TR42
00DD B8         223           BSS     TR46
                224 ;
00DE 19         225 TR43:     DEC     L           ; L/I VALUE <--- (IN)
00DF 0F         226           ST      A,@HL
00E0 3919       227           SET     H'9,1       ; IN-FLAG SET
00E2 B8         228           BSS     TR46
                229 ;
00E3 04         230 TR44:     TESTP   CF          ; SEGMENT OUTPUT
00E4 12         231           OUTB    @HL
00E5 00         232           NOP
00E6 00         233           NOP
00E7 00         234           NOP
00E8 00         235           NOP
00E9 3A20       236           IN      %00,A       ; PORT (K0) INPUT
00EB 19         237           DEC     L           ; (L/I.VALUE)&(IN)
00EC 1E         238           AND     A,@HL
00ED BA         239           BSS     TR47        ; IN-VALUE NOT ZERO ?
                240 ;
00EE 3989       241           TEST    H'9,0       ; L/I FLAG : OFF ?
00F0 B4         242           BSS     TR45
00F1 3949       243           CLR     H'9,0       ; L/I FLAG OFF
00F3 B3         244           BSS     TR46
                245 ;
00F4 3928       246 TR45:     SET     H'8,2       ; N/I FLAG ON
00F6 3959       247           CLR     H'9,1       ; IN-FLAG OFF
00F8 6109       248 TR46:     BS      TR50
                249 ;
00FA 0F         250 TR47:     ST      A,@HL       ; SET IN-KEY
00FB 39C9       251           TESTP   H'9,0       ; L/I FLAG : ON ?
```

```
00FD 6102      252            BS      TR48
00FF 3909      253            SET     H'9,0              ; L/I FLAG ON

ROM PAGE NO. 4 *

0101 89        254            BSS     TR50
               255 ;
0102 39F8      256 TR48:      TESTP   H'8,3              ; F-IN FLAG : ON ?
0104 89        257            BSS     TR50
0105 3958      258            CLR     H'8,1              ; KEY-IN REQUEST OFF
0107 3908      259            SET     H'8,0              ; DECORD REQUEST ON
               260 ;
               261 ;
               262 ;  7-3)-(5)     MANUAL PROC.
               263 ;
0109 2ECF      264 TR50:      CMPR    H'F,#H'C           ; S-MODE : MANUAL ?
010B 6194      265            BS      TR90               ;-NO-
010D 3988      266            TEST    H'8,0              ; KEY DECORD ?
010F 92        267            BSS     TR502
0110 6194      268            BS      TR90
               269 ;
0112 3BF8      270 TR502:     TESTP   %08,3              ; UP-DIAL : HIGH ?
0114 99        271            BSS     TR51
0115 395D      272            CLR     H'D,1              ; L-UP = OFF
0117 6150      273            BS      TR60
               274 ;
0119 39DD      275 TR51:      TESTP   H'D,1              ; L-UP = ON ?
011B 6194      276            BS      TR90
011D 391D      277            SET     H'D,1              ; L-UP = ON
011F 4A        278            LD      A,#10
0120 39CC      279            TESTP   H'C,0              ; C-MODE : 1KHZ ?
0122 AE        280            BSS     TR55
0123 3B54      281            CLR     %04,1              ; R41 = LOW
0125 3B14      282            SET     %04,1
0127 C9        283            LD      H,#H'9
0128 E6        284            LD      L,#H'6
0129 0A        285            INC     aHL                ; CTR = CTR + 1
012A 16        286            CMPR    A,aHL              ; CTR = 10 ?
012B 6194      287            BS      TR90               ;-NO-
012D F0        288            ST      #0,aHL+
012E 39FD      289 TR55:      TESTP   H'D,3              ; FREQ. = 30-MHZ ?
0130 6194      290            BS      TR90
               291 ;
0132 396D      292            CLR     H'D,2              ; RESET UNDER FLAG
0134 CC        293            LD      H,#H'C
0135 E1        294            LD      L,#H'1
0136 0A        295 TR56:      INC     aHL                ; CTR = CTR + 1
0137 B9        296            BSS     TR562              ; CTR : "F" ?
0138 BE        297            BSS     TR57
0139 16        298 TR562:     CMPR    A,aHL              ; CTR = 10 ?
013A 6146      299            BS      TR58               ;-NO-
013C F0        300            ST      #0,aHL+
013D B6        301            BSS     TR56
               302 ;
013E 0A        303 TR57:      INC     aHL
013F 3893      304            CMPR    L,#3               ; 4 KETA ?

ROM PAGE NO. 5 *

0141 8L        305            BSS     TR59               ;-NO-
0142 44        306            LD      A,#4               ; POINT SET
0143 3FC6      307            ST      A,H'C6
0145 8E        308            BSS     TR59
               309 ;
0146 3894      310 TR58:      CMPR    L,#4               ; 5 KETA ?
0148 8E        311            BSS     TR59
0149 43        312            LD      A,#3
```

```
014A 16        313            CMPR    A,@HL          ; 30-MHZ ?
014B 8E        314            BSS     TR59
014C 393D      315            SET     H'D,3          ; OVER-FLAG SET
014E 6194      316 TR59:      BS      TR90
               317 ;
0150 3BD3      318 TR60:      TESTP   %08,1          ; DOWN-DIAL : HIGH ?
0152 96        319            BSS     TR61
0153 394D      320            CLR     H'D,0          ; L-DOWN = OFF
0155 B3        321            BSS     TR665
               322 ;
0156 39CD      323 TR61:      TESTP   H'D,0          ; L-DOWN : ON ?
0158 B3        324            BSS     TR665
0159 390D      325            SET     H'D,0          ; L-DOWN = ON
015B 39CC      326            TESTP   H'C,0          ; 1/1 MODE ?
015D A7        327            BSS     TR65
015E 3B64      328            CLR     %04,2          ; R42 LOW
0160 3B24      329            SET     %04,2
0162 C9        330            LD      H,#H'9
0163 E6        331            LD      L,#H'6
0164 0B        332            DEC     @HL            ; CTR = CTR - 1
0165 B3        333            BSS     TR665
0166 F9        334            ST      #9,@HL+
0167 39ED      335 TR65:      TESTP   H'D,2          ; FREQ. = 10-KHZ ?
0169 B3        336            BSS     TR665
016A 397D      337            CLR     H'D,3          ; RESET OVER FLAG
016C CC        338            LD      H,#H'C
016D E1        339            LD      L,#H'1
016E 384F      340 TR66:      ADD     @HL,#H'F       ; FREQ. = FREQ. - 1
0170 B5        341            BSS     TR67           ; MINUS
0171 0E        342            TESTP   ZF
0172 B7        343            BSS     TR68
0173 6194      344 TR665:     BS      TR90
               345 ;
0175 F9        346 TR67:      ST      #9,@HL+
0176 AE        347            BSS     TR66
               348 ;
0177 18        349 TR68:      INC     L
0178 3896      350            CMPR    L,#6
017A 0E        351            TESTP   ZF
017B 6180      352            BS      TR685
017D 4F        353            LD      A,#H'F
017E 16        354            CMPR    A,@HL
017F 94        355            BSS     TR90

ROM PAGE NO. 6

0180 19        356 TR685:     DEC     L
0181 4F        357            LD      A,#H'F         ; ZERO SUPPRESS
0182 0F        358            ST      A,@HL
0183 3894      359            CMPR    L,#4           ; 4 KETA ?
0185 0E        360            TESTP   ZF
0186 88        361            BSS     TR69
0187 8B        362            BSS     TR695
0188 40        363 TR69:      LD      A,#0           ; POINT CLEAR
0189 3FC6      364            ST      A,H'C6
018B 3CC2      365 TR695:     LD      A,H'C2         ; 10 MIMAN ?
018D DF        366            CMPR    A,#H'F
018E 94        367            BSS     TR90           ;-NO-
018F E1        368            LD      L,#H'1
0190 F0        369            ST      #0,@HL+        ; 10 KHZ SET
0191 F1        370            ST      #1,@HL+
0192 392D      371            SET     H'D,2          ; UNDER FLAG SET
               372 ;
0194 36BF      373 TR90:      DICLR   IL,H'3F        ; "EIF" OFF
0196 4D        374            LD      A,#H'D         ; "EIR" ON
0197 13        375            XCH     A,EIR
0198 28D3      376            LD      HL,H'D8        ; D.C RECOVERY
```

```
019A 29FC      377           XCH     HL,H'FC
019C 3C02      378           LD      A,02         ; REGISTOR RECOVERY
019E 2900      379           XCH     HL,00
01A0 2B        380           RETI
               381 ;
               382 ;***********************************************************
               383 ;*                                                         *
               384 ;* 7-0)           HOLD PROC. ROUTINE                       *
               385 ;*                                                         *
               386 ;***********************************************************
01A1 2C01      387 INT1:     OUT     #0,%01       ; PORT(P1) RESET
01A3 2C02      388           OUT     #0,%02       ; PORT(P2) RESET
01A5 2C06      389           OUT     #0,%06       ; PORT(R6) RESET
01A7 2C07      390           OUT     #0,%07       ; PORT(R7) RESET
01A9 2C04      391           OUT     #0,%04       ; PORT(R4) RESET
01AB 3B78      392           CLR     %08,3        ; PORT(R8) RESET
01AD 3B58      393           CLR     %08,1
01AF 42        394           LD      A,#2         ; "ISIO" OFF
01B0 3A8F      395           OUT     A,%H'1F
01B2 3BFE      396 INT12:    TESTP   %H'0E,3      ; "ISIO" BUSY ?
01B4 B2        397           BSS     INT12
01B5 3B69      398           CLR     %09,2        ; PORT(R9) RESET
01B7 3B59      399           CLR     %09,1
01B9 2C05      400           OUT     #0,%05       ; PORT(R5) RESET
01BB 3979      401           CLR     H'9,3        ; "ISIO" OFF
01BD 40        402           LD      A,#H'0       ; OUT-CTR <--- 0
01BE 3FA6      403           ST      A,H'A6

ROM PAGE NO. 7

01C0 393C      404           SET     H'C,3        ; POWER OFF FLAG ON
01C2 64E8      405           BS      HOLD
               406 ;
               407 ;
               408 ;***********************************************************
               409 ;*                                                         *
               410 ;* 7-1)           POWER OFF PROC. ROUTINE                  *
               411 ;*                                                         *
               412 ;***********************************************************
01C4 3FFA      413 INT2:     ST      A,H'FA       ; REGISTER HOUSEKEEP
01C6 29F8      414           XCH     HL,H'F8
01C8 2C04      415           OUT     #0,%04       ; PORT(R4) RESET
01CA 3B78      416           CLR     %08,3        ; PORT(R8) RESET
01CC 3B58      417           CLR     %08,1
01CE 42        418           LD      A,#2         ; "ISIO" RESET
01CF 3A8F      419           OUT     A,%H'1F
01D1 3BFE      420 INT22:    TESTP   %H'0E,3      ; "ISIO" BUSY ?
01D3 91        421           BSS     INT22
01D4 3B69      422           CLR     %09,2        ; PORT(R9) RESET
01D6 3B59      423           CLR     %09,1
01D8 2C05      424           OUT     #0,%05       ; PORT(R5) RESET
01DA 3979      425           CLR     H'9,3        ; "ISIO" OFF
01DC 40        426           LD      A,#H'0       ; OUT-CTR <--- 0
01DD 3FA6      427           ST      A,H'A6
01DF 397F      428           CLR     H'F,3        ; S-MODE <--- POWER OF.
01E1 393C      429           SET     H'C,3        ; POWER OFF FLAG ON
01E3 3CFA      430           LD      A,H'FA       ; REGISTER RECOVERY
01E5 29F8      431           XCH     HL,H'F8
01E7 2B        432           RETI
               433 ;
               434 ;-------BUZZER ON(50-MS)-------
01E8 3B85      435 PEEP:     TEST    %05,3        ; SUPPLY OFF ?
01EA B2        436           BSS     PE1
01EB 3B25      437           SET     %5,2         ; PEEP HIGH
01ED 40        438           LD      A,#0         ; 50-MS TIMER SET
01EE 3F66      439           ST      A,H'66
01F0 3906      440           SET     H'6,0
```

```
01F2 2A      441 PE1:    RET
             442 ;
             443 ;-------TIMER  WAIT-------
01F3 40      444 WAITRT: LD      A,#0              ; WAIT RTN
01F4 3F76    445         ST      A,H'76
01F6 3E76    446 WAIT1:  CMPR    A,H'76
01F8 BA      447         BSS     WAIT2
01F9 B6      448         BSS     WAIT1
01FA 2A      449 WAIT2:  RET
             450 ;
             451 ;************************************************
             452 ;*
             453 ;* 7-2)         SERIAL OUTPUT ROUTINE
             454 ;*
             455 ;************************************************
01FB 3FFA    456 ISIO:   ST      A,H'FA            ; REGISTOR HOUSEKEEP
01FD 29F8    457         XCH     HL,H'F8
01FF 39B9    458         TEST    H'9,3             ; ISIO OFF ?

ROM PAGE NO. 8 *

0201 A2      459         BSS     ISIO9
             460 ;
0202 3CA6    461         LD      A,H'A6
0204 D0      462         CMPR    A,#0              ; CTR : 0 ?
0205 91      463         BSS     ISIO2             ;-NO-
0206 42      464         LD      A,#2              ; P(1F) = END CMMND
0207 3A8F    465         OUT     A,%H'1F
0209 3BFE    466 ISIO1:  TESTP   %H'0E,3           ; ISIO BUSY ?
020B 89      467         BSS     ISIO1
020C 3B06    468         SET     %06,0             ; SEND END-MARK
020E 3979    469         CLR     H'9,3             ; ISIO OFF
0210 A2      470         BSS     ISIO9
             471 ;
0211 D6      472 ISIO2:  CMPR    A,#6              ; CTR : 6 ?
0212 98      473         BSS     ISIO3             ;-NO-
0213 3CA7    474         LD      A,H'A7            ; P(0F) = LAST DATA
0215 3AAF    475         OUT     A,%H'0F
0217 40      476         LD      A,#0              ; CTR = 0
0218 3FA6    477         ST      A,H'A6
021A A2      478         BSS     ISIO9
             479 ;
021B 09      480 ISIO3:  DEC     A                 ; CTR = CTR - 1
021C 3FA6    481         ST      A,H'A6
021E CB      482         LD      H,#H'B            ; P(0F) = NEXT DATA
021F 31      483         XCH     A,L
0220 3AEF    484         OUT     @HL,%H'0F
0222 3CFA    485 ISIO9:  LD      A,H'FA            ; REGISTOR RECOVERY
0224 29F8    486         XCH     HL,H'F8
0226 2B      487         RETI
             488 ;
             489 ;-------SHIFT   RIGHT-------
0227 3F0A    490 RSHIFT: ST      A,H'0A
0229 40      491         LD      A,#0
022A 0D      492 RSFT1:  XCH     A,@HL
022B 19      493         DEC     L
022C 2FFA    494         ADD     H'A,#H'F
022E B0      495         BSS     RSFT2
022F AA      496         BSS     RSFT1
0230 2A      497 RSFT2:  RET
             498 ;
             499 ;-------SHIFT   LEFT-------
0231 3F0A    500 LSHIFT: ST      A,H'0A
0233 40      501         LD      A,#0
0234 0D      502 LSFT1:  XCH     A,@HL
0235 18      503         INC     L
0236 2FFA    504         ADD     H'A,#H'F
```

```
0238 BA         505          BSS    LSFT2
0239 B4         506          BSS    LSFT1
023A 2A         507 LSFT2:   RET
                508 ;
                509 ;-------CLEAR   MEMORY-------
023B F0         510 MCLER:   ST     #0,aHL+              ; MEMORY CLEAR
023C 09         511          DEC    A
023D BB         512          BSS    MCLER
023E 2A         513          RET
                514 ;
                515 ;
023F 3F0A       516 LOAD:    ST     A,H'0A               ; WORK <--- M(H,L-LA)

ROM PAGE NO. 9 *
0241 296C       517          XCH    HL,H'6C
0243 CB         518          LD     H,#H'B
0244 E1         519          LD     L,#H'1
0245 296C       520 LOAD1:   XCH    HL,H'6C
0247 0C         521          LD     A,aHL
0248 18         522          INC    L
0249 296C       523          XCH    HL,H'6C
024B 1A         524          ST     A,aHL+
024C 2FFA       525          ADD    H'A,#H'F
024E 90         526          BSS    LOAD2
024F 85         527          BSS    LOAD1
0250 2A         528 LOAD2:   RET
                529 ;
                530 ;
0251 296C       531 STORE:   XCH    HL,H'6C              ; M(H,L-LA) <--- WORK
0253 CB         532          LD     H,#H'B
0254 E1         533          LD     L,#H'1
0255 3F0A       534 MOVE:    ST     A,H'0A               ; M(I) <--- M(X)
0257 0C         535 STORE1:  LD     A,aHL
0258 18         536          INC    L
0259 296C       537          XCH    HL,H'6C
025B 1A         538          ST     A,aHL+
025C 296C       539          XCH    HL,H'6C
025E 2FFA       540          ADD    H'A,#H'F
0260 A2         541          BSS    STORE2
0261 97         542          BSS    STORE1
0262 2A         543 STORE2:  RET
                544 ;
                545 ;
0263 C9         546 RREAD:   LD     H,#H'9               ; W2 <--- DATA TABLE
0264 EA         547          LD     L,#H'A
0265 33         548 RR1:     LDL    A,aDC
0266 1A         549          ST     A,aHL+
0267 32         550          LDH    A,aDC+
0268 1A         551          ST     A,aHL+
0269 A5         552          BSS    RR1
026A 2A         553          RET
                554 ;
                555 ;
026B 3F0A       556 MOVEL:   ST     A,H'0A               ; WORK(1) <--- LOAD
026D 296C       557          XCH    HL,H'6C
026F C8         558          LD     H,#H'8
0270 EB         559          LD     L,#H'B
0271 296C       560          XCH    HL,H'6C
0273 0C         561 MOVEL1:  LD     A,aHL
0274 18         562          INC    L
0275 296C       563          XCH    HL,H'6C
0277 1A         564          ST     A,aHL+
0278 296C       565          XCH    HL,H'6C
027A 2FFA       566          ADD    H'A,#H'F
027C BE         567          BSS    MOVEL2
027D B3         568          BSS    MOVEL1
                569 ;
```

```
027E  2A        570 MOVEL2: RET
                571 ;
                572 ;
027F  3F0A      573 MOVES:  ST      A,H'0A            ; STORE <--- WORK(1)

ROM PAGE NO.10 *

0281  296C      574         XCH     HL,H'6C
0283  C8        575         LD      H,#H'8
0284  EB        576         LD      L,#H'B
0285  0C        577 MOVES1: LD      A,@HL
0286  18        578         INC     L
0287  296C      579         XCH     HL,H'6C
0289  1A        580         ST      A,@HL+
028A  296C      581         XCH     HL,H'6C
028C  2FFA      582         ADD     H'A,#H'F
028E  90        583         BSS     MOVES2
028F  85        584         BSS     MOVES1
0290  2A        585 MOVES2: RET
                586 ;
                587 ;
0291  CC        588 CLEAR:  LD      H,#H'C
0292  E0        589         LD      L,#H'0
0293  F0        590         ST      #0,@HL+
0294  FF        591 CLR1:   ST      #H'F,@HL+
0295  3895      592         CMPR    L,#5
0297  94        593         BSS     CLR1
0298  F0        594         ST      #0,@HL+
0299  2A        595         RET
                596 ;
                597 ;
029A  C6        598 LEDMCL: LD      H,#H'6            ; LED MODE CLEAR
029B  EE        599         LD      L,#H'E
029C  3871      600         AND     @HL,#1
029E  C7        601         LD      H,#H'7
029F  3873      602         AND     @HL,#3
02A1  2A        603         RET
                604 ;
                605 ;
02A2  3CB0      606 LEDMST: LD      A,H'B0            ; LED MODE CHENG
02A4  3828      607         OR      A,#H'8
02A6  C7        608         LD      H,#H'7
02A7  31        609         XCH     A,L
02A8  29FC      610         XCH     HL,H'FC
02AA  C7        611         LD      H,#H'7
02AB  EE        612         LD      L,#H'E
02AC  33        613         LDL     A,@DC
02AD  1D        614         OR      A,@HL
02AE  0F        615         ST      A,@HL
02AF  C6        616         LD      H,#H'6
02B0  32        617         LDH     A,@DC+
02B1  1D        618         OR      A,@HL
02B2  0F        619         ST      A,@HL
02B3  2A        620         RET
                621 ;
                622 ;       DISPLAY <--- WORK
02B4  21F3      623 FDSPLY: CALL    WAITRT
02B6  229A      624         CALL    LEDMCL            ; LED(JMODE) ON
02B8  22A2      625         CALL    LEDMST
02BA  EF        626         LD      L,#H'F            ; LED(CLOCK) OFF
02BB  C6        627         LD      H,#H'6
02BC  55        628         CLR     @HL,1
02BD  50        629         SET     @HL,0             ; LED(FREQ.) ON
02BE  C7        630         LD      H,#H'7
02BF  55        631         CLR     @HL,1
```

ROM PAGE NO.11

```
02C0 CC        632          LD      H,#H'C
02C1 E1        633          LD      L,#H'1
02C2 44        634          LD      A,#4
02C3 2251      635          CALL    STORE
02C5 CC        636          LD      H,#H'C
02C6 E5        637          LD      L,#H'5
02C7 40        638  FD1:    LD      A,#0
02C8 16        639          CMPR    A,@HL
02C9 8F        640          BSS     FD2
02CA 4F        641          LD      A,#H'F
02CB 1B        642          ST      A,@HL-
02CC 11        643          MOV     L,A
02CD D1        644          CMPR    A,#1
02CE 87        645          BSS     FD1
02CF 3CC4      646  FD2:    LD      A,H'C4
02D1 DF        647          CMPR    A,#H'F
02D2 95        648          BSS     FD3
02D3 40        649          LD      A,#0
02D4 96        650          BSS     FD4
02D5 44        651  FD3:    LD      A,#4
02D6 3FC6      652  FD4:    ST      A,H'C6
02D8 2A        653          RET
               654  ;
               655  ;       DISPLAY <--- WORK
02D9 21F3      656  TDSPLY: CALL    WAITRT
02DB EF        657          LD      L,#H'F
02DC C7        658          LD      H,#H'7
02DD 39AE      659          TEST    H'E,2                ; CLOCK(1) ?
02DF A4        660          BSS     TDS10                ;-NO-
02E0 55        661          CLR     @HL,1
02E1 C6        662          LD      H,#H'6
02E2 51        663          SET     @HL,1
02E3 AA        664          BSS     TDS20
02E4 399E      665  TDS10:  TEST    H'E,1                ; CLOCK(2) ?
02E6 AA        666          BSS     TDS20
02E7 51        667          SET     @HL,1
02E8 C6        668          LD      H,#H'6
02E9 55        669          CLR     @HL,1
02EA 54        670  TDS20:  CLR     @HL,0
02EB CC        671          LD      H,#H'C
02EC E5        672          LD      L,#H'5
02ED 3CB4      673          LD      A,H'B4
02EF 2EEF      674          CMPR    H'F,#H'E             ; TIME MODE ?
02F1 0E        675          TESTP   ZF
02F2 B6        676          BSS     TDS25
02F3 39DC      677          TESTP   H'C,1                ; BLINK FLAG ON ?
02F5 B9        678          BSS     TDS30
02F6 D0        679  TDS25:  CMPR    A,#0                 ; H.MM = 0.MM ?
02F7 B9        680          BSS     TDS30                ;-NO-
02F8 4F        681          LD      A,#H'F
02F9 1B        682  TDS30:  ST      A,@HL-
02FA 3CB3      683          LD      A,H'B3
02FC 1B        684          ST      A,@HL-
02FD 4A        685          LD      A,#H'A
02FE 1B        686          ST      A,@HL-
02FF 3CB2      687          LD      A,H'B2
```

ROM PAGE NO.12 *

```
0301 1B        688          ST      A,@HL-
0302 3CB1      689          LD      A,H'B1
0304 1B        690          ST      A,@HL-
0305 40        691          LD      A,#0
0306 3FC6      692          ST      A,H'C6
0308 2A        693          RET
```

```
                694 ;
                695 ;
                696 ;------F.CONV   WORK <--- DISPLAY-------
0309 21F3       697 FCONV:   CALL    WAITRT
030B CC         698          LD      H,#H'C
030C E1         699          LD      L,#H'1
030D 44         700          LD      A,#4
030E 223F       701          CALL    LOAD
0310 CB         702          LD      H,#H'B
0311 E5         703          LD      L,#H'5
0312 4F         704 FCONV1:  LD      A,#H'F
0313 16         705          CMPR    A,aHL
0314 98         706          BSS     FCONV2
0315 40         707          LD      A,#0
0316 1B         708          ST      A,aHL-
0317 92         709          BSS     FCONV1
0318 3CC6       710 FCONV2:  LD      A,H'C6
031A D0         711          CMPR    A,#0
031B 9D         712          BSS     FCONV4
031C 2A         713          RET
031D D4         714 FCONV4:  CMPR    A,#4
031E A0         715          BSS     FCONV5
031F 2A         716          RET
0320 03         717 FCONV5:  INC     A
0321 3FC6       718          ST      A,H'C6
0323 CB         719          LD      H,#H'B
0324 E1         720          LD      L,#H'1
0325 44         721          LD      A,#4
0326 2231       722          CALL    LSHIFT
0328 98         723          BSS     FCONV2
                724 ;
                725 ;
                726 ;-------T.CONV   WORK <--- DISPLAY-------
0329 3CC1       727 TCONV:   LD      A,H'C1
032B CB         728          LD      H,#H'B
032C E1         729          LD      L,#H'1
032D 1A         730          ST      A,aHL+
032E 3CC2       731          LD      A,H'C2
0330 1A         732          ST      A,aHL+
0331 3CC4       733          LD      A,H'C4
0333 1A         734          ST      A,aHL+
0334 3CC5       735          LD      A,H'C5
0336 1A         736          ST      A,aHL+
0337 40         737          LD      A,#0
0338 1B         738          ST      A,aHL-
                739 ;
0339 0C         740 TCONV2:  LD      A,aHL              ; "0" <--- "F"
033A DF         741          CMPR    A,#H'F
033B BF         742          BSS     TCONV9
033C 40         743          LD      A,#0
033D 1B         744          ST      A,aHL-
033E B9         745          BSS     TCONV2
                746 ;
033F 2A         747 TCONV9:  RET
                748 ;
                749 ;

ROM PAGE NO.13

0340 C8         750 WAVECH:  LD      H,#H'8             ; F-BAND CHECK
0341 EB         751          LD      L,#H'B
0342 44         752          LD      A,#4
0343 2251       753          CALL    STORE
0345 C6         754 WAVEC2:  LD      H,#H'6
0346 E8         755          LD      L,#H'8
0347 29FC       756          XCH     HL,H'FC
0349 2263       757          CALL    RREAD
```

```
034B 44        758              LD     A,#4
034C 247E      759              CALL   COMP
034E 06        760              TEST   CF
034F 9C        761              BSS    W2
0350 C6        762              LD     H,#H'6
0351 EB        763              LD     L,#H'B
0352 29FC      764              XCH    HL,H'FC
0354 2263      765              CALL   RREAD
0356 44        766              LD     A,#4
0357 247E      767              CALL   COMP
0359 9D        768              BSS    W3
035A 41        769   W1:        LD     A,#1
035B 0E        770              TESTP  ZF
035C 2A        771   W2:        RET
035D 04        772   W3:        TESTP  CF
035E 9C        773              BSS    W2
035F 9A        774              BSS    W1
               775   ;
               776   ;
               777   ;------TIME     CHECK-------
0360 3CC0      778   TCHK:      LD     A,H'C0
0362 D2        779              CMPR   A,#2           ; KETASU = 3,4 ?
0363 04        780              TESTP  CF
0364 B2        781              BSS    TCHK1          ;-NO-
0365 3CB2      782              LD     A,H'B2
0367 D5        783              CMPR   A,#5           ; MM >= 6. ?
0368 06        784              TEST   CF
0369 B2        785              BSS    TCHK1
036A 3CB4      786              LD     A,H'B4
036C D2        787              CMPR   A,#2           ; HH > 2. ?
036D 06        788              TEST   CF
036E B2        789              BSS    TCHK1
036F 0E        790              TESTP  ZF             ; HH = 2. ?
0370 B3        791              BSS    TCHK2
0371 04        792              TESTP  CF
0372 2A        793   TCHK1:     RET
0373 3CB3      794   TCHK2:     LD     A,H'B3
0375 D3        795              CMPR   A,#3           ; HH > 24 ?
0376 06        796              TEST   CF
0377 2A        797              RET
               798   ;
               799   ;
0378 0A        800   TIMCNT:    INC    @HL            ; 1-M CLOCK COUNT
0379 4A        801              LD     A,#10          ; 1-M CLOCK = 10 ?
037A 16        802              CMPR   A,@HL
037B 63B5      803              BS     TC40
037D 40        804              LD     A,#0           ; 1-M CLOCK 0-CLEAR
037E 1A        805              ST     A,@HL+
037F 389C      806              CMPR   L,#H'C         ; COUNT : CLOCK(1) ?

ROM PAGE NO.14 *

0381 83        807              BSS    TC10           ;-YES-
0382 8A        808              BSS    TC12
               809   ;
0383 29A8      810   TC10:      XCH    HL,H'A8
0385 C2        811              LD     H,#H'2         ; 10M CLOCK HOSEI
0386 E6        812              LD     L,#H'6
0387 0A        813              INC    @HL
0388 29A8      814              XCH    HL,H'A8
               815   ;
038A 0A        816   TC12:      INC    @HL            ; 10M CLOCK COUNT
038B 46        817              LD     A,#6           ; 10M CLOCK = 6  ?
038C 16        818              CMPR   A,@HL
038D B5        819              BSS    TC40
038E 40        820              LD     A,#0           ; 10M CLOCK 0-CLEAR
038F 1A        821              ST     A,@HL+
```

```
0390 389C        822         CMPR    L,#H'C          ; COUNT : CLOCK(1) ?
0392 94          823         BSS     TC20            ;-YES-
0393 A1          824         BSS     TC22
                 825 ;
0394 29A8        826 TC20:   XCH     HL,H'A8
0396 C2          827         LD      H,#H'2          ; 1-H CLOCK HOSEI
0397 E6          828         LD      L,#H'6
0398 0A          829         INC     @HL
0399 21F3        830         CALL    WAITRT
039B CF          831         LD      H,#H'F
039C E4          832         LD      L,#H'4
039D 3844        833         ADD     @HL,#4
039F 29A8        834         XCH     HL,H'A8
                 835 ;
03A1 0A          836 TC22:   INC     @HL             ; 1-H CLOCK COUNT
03A2 4A          837         LD      A,#10           ; 1-H CLOCK = 10 ?
03A3 16          838         CMPR    A,@HL
03A4 A9          839         BSS     TC30
03A5 40          840         LD      A,#0            ; 1-H CLOCK 0-CLEAR
03A6 1A          841         ST      A,@HL+
03A7 0A          842         INC     @HL             ; 10H CLOCK COUNT
03A8 B5          843         BSS     TC40
                 844 ;
03A9 44          845 TC30:   LD      A,#4            ; HH = 24 ?
03AA 16          846         CMPR    A,@HL
03AB B5          847         BSS     TC40
03AC 18          848         INC     L
03AD 42          849         LD      A,#2
03AE 16          850         CMPR    A,@HL
03AF B5          851         BSS     TC40
03B0 40          852         LD      A,#0            ; CLOCK CLEAR
03B1 1B          853         ST      A,@HL-
03B2 1B          854         ST      A,@HL-
03B3 1B          855         ST      A,@HL-
03B4 1B          856         ST      A,@HL-
03B5 2A          857 TC40:   RET
                 858 ;
                 859 ;------ADD BY  BINARY-------
03B6 3F0A        860 BADD:   ST      A,H'0A          ; COUNTER SAVE
03B8 2FFA        861 BADD2:  ADD     H'0A,#H'F       ; COUNTER = 0 ?
03BA 63CC        862         BS      BADD8
03BC 06          863         TEST    CF
03BD E7          864         LD      L,#H'7
03BE 3CAB        865         LD      A,H'AB          ; B(..H) = B(..H) + O(.

ROM PAGE NO.15

03C0 15          866         ADDC    A,@HL
03C1 1A          867         ST      A,@HL+
03C2 3CAC        868         LD      A,H'AC          ; B(.H.) = B(.H.) + O(.
03C4 15          869         ADDC    A,@HL
03C5 1A          870         ST      A,@HL+
03C6 3CAD        871         LD      A,H'AD          ; B(H..) = B(H..) + O(H
03C8 15          872         ADDC    A,@HL
03C9 0F          873         ST      A,@HL
03CA 63B8        874         BS      BADD2
03CC 2A          875 BADD8:  RET
                 876 ;

ROM PAGE NO.16

0400             877         ORG     H'400
                 878 ;
                 879 ;
                 880 ;------ACCUMULATE----- W1(8,F-B) = W1(8,F-B) + W2(9,F-
0400 EB          881 ADDS:   LD      L,#H'B
0401 06          882 ADD2:   TEST    CF
```

```
0402 C9        883 ADDS1:   LD     H,#H'9
0403 0C        884         LD     A,@HL
0404 C8        885         LD     H,#H'8
0405 15        886         ADDC   A,@HL
0406 8D        887         BSS    ADDS4           ; CF = OFF
0407 04        888 ADDS2:  TESTP  CF
0408 3806      889         ADD    A,#6
040A 1A        890 ADDS3:  ST     A,@HL+
040B 82        891         BSS    ADDS1
040C 2A        892         RET
040D D9        893 ADDS4:  CMPR   A,#H'9          ; ANS. =< 9 ?
040E 06        894         TEST   CF
040F 87        895         BSS    ADDS2           ;-NO-
0410 8A        896         BSS    ADDS3           ;-YES-
               897 ;
               898 ;
               899 ;-------ACCUMULATE----- W1(8,F-B) = W1(8,F-B) * W1(8,F-
0411 EA        900 MUL:    LD     L,#H'A
0412 C8        901 MUL01:  LD     H,#H'8
0413 0C        902         LD     A,@HL
0414 CA        903         LD     H,#H'A
0415 1A        904         ST     A,@HL+
0416 92        905         BSS    MUL01
0417 C8        906         LD     H,#H'8
0418 EA        907         LD     L,#H'A
0419 F0        908 MUL02:  ST     #0,@HL+
041A 99        909         BSS    MUL02
041B EF        910         LD     L,#H'F
041C CA        911 MUL03:  LD     H,#H'A
041D 40        912         LD     A,#0
041E 16        913         CMPR   A,@HL
041F A1        914         BSS    MUL04
0420 AF        915         BSS    MUL05
0421 11        916 MUL04:  MOV    L,A
0422 3F0B      917         ST     A,H'0B
0424 EA        918         LD     L,#H'A
0425 2401      919         CALL   ADD2            ; W1 <--- W1 + W2
0427 3C0B      920         LD     A,H'0B
0429 31        921         XCH    A,L
042A CA        922         LD     H,#H'A
042B 0B        923         DEC    @HL
042C 40        924         LD     A,#0
042D 16        925         CMPR   A,@HL
042E A1        926         BSS    MUL04
042F 19        927 MUL05:  DEC    L
0430 3899      928         CMPR   L,#H'9
0432 BF        929         BSS    MUL09
0433 11        930         MOV    L,A
0434 3F0B      931         ST     A,H'0B
0436 C8        932         LD     H,#H'8
0437 EA        933         LD     L,#H'A
0438 45        934         LD     A,#5
0439 2231      935         CALL   LSHIFT
043B 3C0B      936         LD     A,H'0B
043D 31        937         XCH    A,L
043E 9C        938         BSS    MUL03
043F 2A        939 MUL09:  RET

ROM PAGE NO.17

0440           940         ORG    H'440
               941 ;
               942 ;
               943 ;-------ACCUMULATE----- W1(8,F-B) = W1(8,F-B) - W2(9,F-
0440 04        944 SUB:    TESTP  CF
0441 C9        945 SUB1:   LD     H,#H'9
0442 0C        946         LD     A,@HL
```

```
0443 C8         947            LD      H,#H'8
0444 14         948            SUBRC   A,@HL
0445 04         949            TESTP   CF
0446 8A         950            BSS     SUB2
0447 380A       951            ADD     A,#H'A
0449 06         952            TEST    CF
044A 1A         953 SUB2:      ST      A,@HL+
044B 81         954            BSS     SUB1
044C 2A         955            RET
                956 ;
                957 ;
                958 ;------ACCUMULATE-----  W3(A,F-B) = W1(8,F-B) / W2(9,F-
044D C8         959 DIV:       LD      H,#H'8
044E 90         960            BSS     D02
044F C9         961 D01:       LD      H,#H'9
0450 EF         962 D02:       LD      L,#H'F
0451 45         963            LD      A,#5
0452 2227       964            CALL    RSHIFT
0454 38D8       965            CMPR    H,#8
0456 8F         966            BSS     D01
0457 CA         967            LD      H,#H'A
0458 EA         968            LD      L,#H'A
0459 40         969            LD      A,#0
045A 1A         970 D04:       ST      A,@HL+
045B 9A         971            BSS     D04
045C 45         972 D05:       LD      A,#5
045D 247E       973            CALL    COMP          ; W1 : W2 COMPEAR
045F 04         974            TESTP   CF
0460 B0         975            BSS     D09
0461 C8         976            LD      H,#H'8
0462 EA         977            LD      L,#H'A
0463 45         978            LD      A,#5
0464 2231       979            CALL    LSHIFT
0466 CA         980            LD      H,#H'A
0467 EA         981            LD      L,#H'A
0468 45         982            LD      A,#5
0469 2231       983            CALL    LSHIFT
046B 2FFB       984            ADD     H'B,#H'F
046D AF         985            BSS     D06
046E 9C         986            BSS     D05
046F 2A         987 D06:       RET
                988 ;
0470 EA         989 D09:       LD      L,#H'A
0471 2440       990            CALL    SUB
0473 CA         991            LD      H,#H'A
0474 EA         992            LD      L,#H'A
0475 0A         993 D10:       INC     @HL
0476 4A         994            LD      A,#H'A
0477 16         995            CMPR    A,@HL
0478 9C         996            BSS     D05
0479 F0         997            ST      #0,@HL+
047A B5         998            BSS     D10
047B 9C         999            BSS     D05
                1000 ;
                1001 ;

ROM PAGE NO.17

047E            1002           ORG     H'47E
                1003 ;
                1004 ;------COMPAIR ------- W1(8,F-B) : W2(9,F-B)
047E EF         1005 COMP:      LD      L,#H'F
047F 3F0A       1006 COMP2:     ST      A,H'0A

ROM PAGE NO.18 *

0481 C9         1007 CR1:       LD      H,#H'9
```

```
0482  0C      1008          LD      A,@HL
0483  C8      1009          LD      H,#H'8
0484  16      1010          CMPR    A,@HL
0485  8D      1011          BSS     CR2
0486  19      1012          DEC     L
0487  2FFA    1013          ADD     H'A,#H'F
0489  8B      1014          BSS     CR15
048A  81      1015          BSS     CR1
048B  41      1016  CR15:   LD      A,#1
048C  0E      1017          TESTP   ZF
048D  2A      1018  CR2:    RET
              1019  ;
              1020  ;
              1021  ;------- M(A,9-7) <--- W3  ; DECIMAL TO BINARY
              1022  ;
048E  CA      1023  DBCVA:  LD      H,#H'A
048F  E7      1024          LD      L,#H'7
0490  3CAB    1025          LD      A,H'AB
0492  06      1026          TEST    CF
0493  15      1027  DBC02:  ADDC    A,@HL
0494  0F      1028          ST      A,@HL
0495  06      1029          TEST    CF
0496  A2      1030          BSS     DBC10
0497  04      1031          TESTP   CF
0498  18      1032          INC     L
0499  40      1033          LD      A,#0
049A  93      1034          BSS     DBC02
              1035  ;
049B  CA      1036  DBCNV:  LD      H,#H'A
049C  E7      1037          LD      L,#H'7
049D  3CAB    1038          LD      A,H'AB          ; M(A,9-7) <--- W3(...9
049F  1A      1039          ST      A,@HL+
04A0  F0      1040          ST      #0,@HL+
04A1  F0      1041          ST      #0,@HL+
04A2  3CAC    1042  DBC10:  LD      A,H'AC          ; M(A,9-7) <--- W3(.9.
04A4  09      1043  DBC12:  DEC     A
04A5  A7      1044          BSS     DBC14
04A6  AF      1045          BSS     DBC20           ; SKIP IF ZERO
04A7  E7      1046  DBC14:  LD      L,#H'7
04A8  384A    1047          ADD     @HL,#H'A
04AA  A4      1048          BSS     DBC12           ; BRANCH IF CF = 0
04AB  18      1049  DBC16:  INC     L
04AC  0A      1050          INC     @HL
04AD  A4      1051          BSS     DBC12
04AE  AB      1052          BSS     DBC16
              1053  ;
04AF  ED      1054  DBC20:  LD      L,#H'D
04B0  0B      1055          DEC     @HL
04B1  B3      1056          BSS     DBC22
04B2  BF      1057          BSS     DBC30           ; SKIP IF ZERO
04B3  E7      1058  DBC22:  LD      L,#H'7
04B4  06      1059          TEST    CF
04B5  44      1060          LD      A,#4
04B6  15      1061          ADDC    A,@HL
04B7  1A      1062          ST      A,@HL+
04B8  46      1063          LD      A,#6
04B9  15      1064          ADDC    A,@HL
04BA  1A      1065          ST      A,@HL+
04BB  06      1066          TEST    CF
04BC  AF      1067          BSS     DBC20
04BD  0A      1068          INC     @HL
04BE  AF      1069          BSS     DBC20
              1070  ;
04BF  2A      1071  DBC30:  RET
```

ROM PAGE NO.19

```
04C0            1072            ORG     H'4C0
                1073    ;******************************************************
                1074    ;*
                1075    ;*      MAIN ROUTINE
                1076    ;*
                1077    ;******************************************************
                1078    ;
04C0  2C01      1079    START:  OUT     #0,%01           ; PORT <--- LOW
04C2  2C02      1080            OUT     #0,%02
04C4  2C06      1081            OUT     #0,%06
04C6  2C07      1082            OUT     #0,%07
04C8  2C04      1083            OUT     #0,%04
04CA  3B78      1084            CLR     %08,3
04CC  3B58      1085            CLR     %08,1
04CE  2C09      1086            OUT     #0,%09
04D0  2C05      1087            OUT     #0,%05
                1088    ;
                1089    ;
                1090    ;       INITIAL SHORI
                1091    ;
04D2  C0        1092            LD      H,#0             ; RAM CLEAR
04D3  E0        1093            LD      L,#0
04D4  F0        1094    INI01:  ST      #0,@HL+
04D5  64D4      1095            BS      INI01
04D7  38C1      1096            ADD     H,#1
04D9  64D4      1097            BS      INI01
04DB  41        1098            LD      A,#1             ; STEP FREQ. = 1
04DC  3F86      1099            ST      A,H'86
04DE  C1        1100            LD      H,#1             ; F-BANK INITIALIZE
04DF  E2        1101    INI02:  LD      L,#2
04E0  F1        1102            ST      #1,@HL+
04E1  E0        1103            LD      L,#0
04E2  F4        1104            ST      #4,@HL+
04E3  38C1      1105            ADD     H,#1
04E5  38DD      1106            CMPR    H,#H'D
04E7  64DF      1107            BS      INI02
04E9  391C      1108            SET     H'C,1            ; BLINK FLAG ON
                1109    ;
                1110    ;-------HOLD    PROC.--------
04EB  40        1111    HOLD:   LD      A,#0             ; 4-MS(2-MS) WAIT
04EC  3FBC      1112            ST      A,H'BC
04EE  3FBD      1113            ST      A,H'BD
04F0  3CBC      1114    HOLD1:  LD      A,H'BC
04F2  08        1115            INC     A
04F3  3FBC      1116            ST      A,H'BC
04F5  D0        1117            CMPR    A,#0
04F6  64F0      1118            BS      HOLD1
04F8  3CBD      1119            LD      A,H'BD
04FA  08        1120            INC     A
04FB  3FBD      1121            ST      A,H'BD
04FD  D8        1122            CMPR    A,#8
04FE  64F0      1123            BS      HOLD1
```

ROM PAGE NO.20

```
0500  4C        1124    HOLDC:  LD      A,#H'C           ; HOLD-CMMND SET
0501  3A80      1125            OUT     A,%H'10
0503  2D0F      1126            ST      #H'0,H'0F        ; SMODE <--- INITIAL
                1127    ;
0505  4C        1128            LD      A,#12            ; (SPW) <--- 12
0506  3FFF      1129            ST      A,H'FF
0508  4F        1130            LD      A,#H'F           ; DC(H) <--- "F"
0509  3FFE      1131            ST      A,H'FE
050B  2291      1132            CALL    CLEAR            ; DISPLAY "F"CLEAR
050D  40        1133            LD      A,#0             ; I-TIMER OFF
```

```
050E 3A89      1134            OUT     A,%H'19
0510 CF        1135            LD      H,#H'F
0511 E4        1136            LD      L,#4
0512 F8        1137            ST      #H'8,aHL+       ; TC1 <--- "FF8"
0513 FF        1138            ST      #H'F,aHL+
0514 FF        1139            ST      #H'F,aHL+
0515 48        1140            LD      A,#8            ; TIMER(1) ON
0516 3A8C      1141            OUT     A,%H'1C
0518 40        1142            LD      A,#0            ; TIMER(2) OFF
0519 3A8D      1143            OUT     A,%H'1D
051B 4D        1144            LD      A,#H'D          ; "EIR" SET
051C 13        1145            XCH     A,EIR
051D 3640      1146            EICLR   IL,0            ; "EIF" ON
051F 390C      1147            SET     H'C,0           ; COUNT MODE = 1-KHZ
0521 2D4E      1148            ST      #H'4,H'E        ; DISPLAY = CLOCK(1)
0523 2D06      1149            ST      #H'0,H'6        ; TIMER REQUEST OFF
0525 2D07      1150            ST      #H'0,H'7        ; TIMER PASS-FLAG OFF
0527 2D28      1151            ST      #H'2,H'8        ; KEY-IN REQUEST ON
0529 2D09      1152            ST      #H'0,H'9        ; KEY,ISIO OFF
052B 664C      1153            BS      PWOF0
               1154    ;***********************************************
               1155    ;*                                              *
               1156    ;*  0-0)-(0)       L O O P   ( M A I N )        *
               1157    ;*                                              *
               1158    ;***********************************************
               1159    ;
               1160    ;-------C-MODE   SET-------
052D 2ECF      1161    MAIN:   CMPR    H'F,#H'G
052F 6554      1162            BS      CC00
0531 C7        1163            LD      H,#H'7
0532 EF        1164            LD      L,#H'F
0533 3BC9      1165            TESTP   %09,0           ; R80 : HIGH ?
0535 6548      1166            BS      CMS20
               1167    ;
0537 3BC9      1168    CMS10:  TESTP   %09,0           ; R80 : HIGH ?
0539 6548      1169            BS      CMS20
053B 3BC9      1170            TESTP   %09,0           ; R80 : HIGH ?
053D 6548      1171            BS      CMS20
053F 390C      1172            SET     H'C,0           ; C-MODE = 1-KHZ

ROM PAGE NO.21 *

0541 50        1173            SET     aHL,0           ; LED(1KHZ) ON
0542 56        1174            CLR     aHL,2
0543 40        1175            LD      A,#0            ; 1/10 COUNT = 0
0544 3F96      1176            ST      A,H'96
0546 6554      1177            BS      CC00
               1178    ;
0548 3B89      1179    CMS20:  TEST    %09,0           ; R80 : LOW  ?
054A 6537      1180            BS      CMS10
054C 3B89      1181            TEST    %09,0           ; R80 : LOW  ?
054E 6537      1182            BS      CMS10
0550 394C      1183            CLR     H'C,0           ; C-MODE = 100HZ
0552 54        1184            CLR     aHL,0           ; LED(100HZ) ON
0553 52        1185            SET     aHL,2
               1186    ;
               1187    ;-------BLINK    SHORI-------
0554 399C      1188    CC00:   TEST    H'C,1           ; BLINK FLAG ON ?
0556 6587      1189            BS      CC20            ;-OFF-
0558 39EE      1190            TESTP   H'E,2           ; DISPLAY : CLOCK ?
055A 6560      1191            BS      CC10
055C 399E      1192            TEST    H'E,1
055E 6587      1193            BS      CC20            ;-NO-
0560 39FE      1194    CC10:   TESTP   H'E,3           ; ERROR ?
0562 6587      1195            BS      CC20
0564 3CC0      1196            LD      A,H'C0          ; KETASU = 0 ?
0566 D0        1197            CMPR    A,#0
```

```
0567 6587    1198           BS      CC20            ;-NO-
0569 21F3    1199           CALL    WAITRT          ; TIMER WAIT
056B 3C46    1200           LD      A,H'46
056D D5      1201           CMPR    A,#5            ; 1-S CLOCK = 5 ?
056E 6574    1202           BS      CC14            ;-NO-
0570 4F      1203           LD      A,#H'F          ; DISPLAY OFF
0571 CF      1204           LD      H,#H'F
0572 6579    1205           BS      CC16
             1206 ;
0574 DA      1207 CC14:     CMPR    A,#10           ; 1-S CLOCK = 10 ?
0575 6644    1208           BS      PWCHK           ;-NO-
0577 40      1209           LD      A,#H'0          ; DISPLAY ON
0578 CA      1210           LD      H,#H'A
             1211 ;
0579 3FC1    1212 CC16:     ST      A,H'C1
057B 3FC2    1213           ST      A,H'C2
057D 3FC4    1214           ST      A,H'C4
057F 3FC5    1215           ST      A,H'C5

ROM PAGE NO.22 *

0581 30      1216           XCH     A,H
0582 3FC3    1217           ST      A,H'C3
0584 40      1218           LD      A,#0            ; PERIOD OFF
0585 3FC6    1219           ST      A,H'C6
             1220 ;
             1221 ;------CLOCK     COUNT-------
0587 C4      1222 CC20:     LD      H,#4            ; 1-S CLOCK < 10 ?
0588 E6      1223           LD      L,#6
0589 0C      1224           LD      A,@HL
058A D9      1225           CMPR    A,#9
058B 04      1226           TESTP   CF
058C 6644    1227           BS      PWCHK
058E 3846    1228           ADD     @HL,#6          ; 1-S CLOCK - (10)
0590 C6      1229           LD      H,#H'6
0591 EB      1230           LD      L,#H'B
0592 0A      1231           INC     @HL             ; 10S TIMER COUNT
0593 4B      1232           LD      A,#11
0594 16      1233           CMPR    A,@HL           ; 10S TIMER = 10 ?
0595 6598    1234           BS      CC22            ;-NO-
0597 FA      1235           ST      #10,@HL+        ; 10S TIMER - (10)
0598 39DC    1236 CC22:     TESTP   H'C,1           ; BLINK FLAG ON ?
059A 6644    1237           BS      PWCHK
059C C5      1238           LD      H,#H'5
059D E6      1239           LD      L,#H'6
059E 0A      1240           INC     @HL             ; 10S CLOCK COUNT
059F 4A      1241           LD      A,#10
05A0 16      1242           CMPR    A,@HL           ; 10S CLOCK = 10 ?
05A1 6644    1243           BS      PWCHK           ;-NO-
05A3 F0      1244           ST      #0,@HL+         ; 10S CLOCK CLEAR
05A4 C2      1245           LD      H,#H'2          ; 10S CLOCK HOSEI
05A5 E6      1246           LD      L,#H'6
05A6 3842    1247           ADD     @HL,#2
05A8 C7      1248           LD      H,#H'7
05A9 E7      1249           LD      L,#H'7
05AA 0A      1250           INC     @HL             ; 1-M CLOCK COUNT
05AB 46      1251           LD      A,#6
05AC 16      1252           CMPR    A,@HL           ; 1-M CLOCK = 6 ?
05AD 6644    1253           BS      PWCHK           ;-NO-
05AF F0      1254           ST      #0,@HL+         ; 1-M CLOCK <--- 0
05B0 C2      1255           LD      H,#H'2          ; 1-M CLOCK HOSEI
05B1 E6      1256           LD      L,#H'6
05B2 0A      1257           INC     @HL
05B3 CC      1258           LD      H,#H'C          ; CLOCK(1) COUNT
05B4 E8      1259           LD      L,#H'8
05B5 2378    1260           CALL    TIMCNT
05B7 39AC    1261           TEST    H'C,2           ; CLOCK(2) INPUT ?
```

```
05B9 65BF      1262           BS      CC24                ;-NO-
05BB CC        1263           LD      H,#H'C              ; CLOCK(2) COUNT
05BC EC        1264           LD      L,#H'C
05BD 2378      1265           CALL    TIMCNT
05BF 3CC0      1266 CC24:     LD      A,H'C0

ROM PAGE NO.23 *

05C1 D0        1267           CMPR    A,#0                ; KETASU = 0 ?
05C2 65D6      1268           BS      CC30                ;-NO-
05C4 39AE      1269           TEST    H'E,2               ; CLOCK(1) DISPLAY ?
05C6 65CB      1270           BS      CC26                ;-NO-
05C8 E8        1271           LD      L,#H'8              ; CLOCK(1) DISPLAY
05C9 65D0      1272           BS      CC28
               1273 ;
05CB 399E      1274 CC26:     TEST    H'E,1               ; CLOCK(2) DISPLAY ?
05CD 65D6      1275           BS      CC30                ;-NO-
05CF EC        1276           LD      L,#H'C              ; CLOCK(2) DISPLAY
05D0 CC        1277 CC28:     LD      H,#H'C
05D1 43        1278           LD      A,#3
05D2 223F      1279           CALL    LOAD
05D4 22D9      1280           CALL    TDSPLY              ; CLOCK DISPLAY
               1281 ;
               1282 ;-------PROGRAM MODE-------
05D6 2EFF      1283 CC30:     CMPR    H'F,#H'F            ; PROGRAM MODE ?
05D8 6644      1284           BS      PWCHK               ;-NO-
05DA 3CD7      1285           LD      A,H'D7              ; T-BANK NO SAVE
05DC 3FC0      1286           ST      A,H'C0
05DE 41        1287           LD      A,#1
05DF 3FD7      1288           ST      A,H'D7              ; T-BANK NO <--- 1
05E1 CC        1289           LD      H,#H'C              ; W2 <--- CLOCK(1)
05E2 E8        1290           LD      L,#H'8
05E3 43        1291           LD      A,#3
05E4 223F      1292           CALL    LOAD
05E6 C9        1293           LD      H,#H'9
05E7 EB        1294           LD      L,#H'B
05E8 43        1295           LD      A,#3
05E9 2251      1296           CALL    STORE
05EB 3CD7      1297 CC32:     LD      A,H'D7              ; W1 <--- ON-TIME
05ED 30        1298           XCH     A,H
05EE E8        1299           LD      L,#H'8
05EF 43        1300           LD      A,#3
05F0 226B      1301           CALL    MOVEL
05F2 EE        1302           LD      L,#H'E
05F3 43        1303           LD      A,#3
05F4 247F      1304           CALL    COMP2               ; CLOCK(1) = ON-TIME ?
05F6 6615      1305           BS      CC36
05F8 3CD7      1306           LD      A,H'D7
05FA 30        1307           XCH     A,H
05FB E7        1308           LD      L,#H'7
05FC 0C        1309           LD      A,@HL
05FD D0        1310           CMPR    A,#0                ; F-LINK NO. = 0 ?
05FE 0E        1311           TESTP   ZF
05FF 6615      1312           BS      CC36

ROM PAGE NO.24 *

0601 30        1313           XCH     A,H                 ; WORK <--- F-BANK
0602 E0        1314           LD      L,#H'0
0603 0C        1315           LD      A,@HL
0604 3FB0      1316           ST      A,H'B0
0606 E1        1317           LD      L,#H'1
0607 44        1318           LD      A,#4
0608 223F      1319           CALL    LOAD
060A 2D1E      1320           ST      #H'1,H'E            ; DISPLAY = "FREQ"
060C 3B35      1321           SET     %05,3               ; SUPPLY ON
060E 3B34      1322           SET     %04,3               ; PROG.-CTL ON
```

```
0610 40      1323           LD      A,#0            ; KETASU <--- 0
0611 3FC0    1324           ST      A,H'C0
0613 6D83    1325           BS      PLLST
             1326  ;
0615 CD      1327  CC36:    LD      H,#H'D
0616 E7      1328           LD      L,#H'7
0617 0A      1329           INC     aHL             ; T-BANK NO. COUNT
0618 46      1330           LD      A,#6
0619 16      1331           CMPR    A,aHL           ; T-BANK NO. = 6 ?
061A 65EB    1332           BS      CC32            ;-NO-
             1333  ;
061C 40      1334           LD      A,#0            ; T-BANK NO. RECV
061D 3DC0    1335           XCH     A,H'C0
061F 0F      1336           ST      A,aHL
0620 0E      1337           TESTP   ZF              ; T-BANK NO. = 0 ?
0621 6644    1338           BS      PWCHK
             1339  ;
0623 30      1340           XCH     A,H             ; W1 <--- OFF TIME
0624 EC      1341           LD      L,#H'C
0625 43      1342           LD      A,#3
0626 226B    1343           CALL    MOVEL
0628 EE      1344           LD      L,#H'E
0629 43      1345           LD      A,#3
062A 247F    1346           CALL    COMP2           ; OFF-TIME = CLOCK(1)
062C 6644    1347           BS      PWCHK           ;-NO-
             1348  ;
062E 40      1349           LD      A,#0            ; T-LINK <--- 0
062F 3FD7    1350           ST      A,H'D7
0631 2291    1351           CALL    CLEAR           ; DISPLAY CLEAR
0633 229A    1352           CALL    LEDMCL          ; LED(JMODE) OFF
0635 2D4E    1353           ST      #H'4,H'E        ; DISPLAY CLOCK(1)
0637 CC      1354           LD      H,#H'C
0638 E8      1355           LD      L,#H'8
0639 43      1356           LD      A,#3
063A 223F    1357           CALL    LOAD
063C 22D9    1358           CALL    TDSPLY
063E 2C04    1359           OUT     #0,%04          ; PORT RESET

ROM PAGE NO.25

0640 2C09    1360           OUT     #0,%09
0642 2C05    1361           OUT     #0,%05
             1362  ;
0644 39FF    1363  PWCHK:   TESTP   H'F,3           ; POWER ON ?
0646 66BB    1364           BS      TIMER
             1365  ;
             1366  ;
             1367  ;        POWER OFF SHORI
             1368  ;
0648 39BC    1369           TEST    H'C,3           ; P/W OFF MODE ?
064A 665F    1370           BS      PWOF1           ;-NO-
064C 397C    1371  PWOF0:   CLR     H'C,3           ; RESET P/W OFF MODE
064E C6      1372           LD      H,#H'6          ; CLR LED(SMODE)
064F EE      1373           LD      L,#H'E
0650 F0      1374           ST      #0,aHL+
0651 F0      1375           ST      #0,aHL+
0652 C7      1376           LD      H,#H'7
0653 EE      1377           LD      L,#H'E
0654 F0      1378           ST      #0,aHL+
0655 F0      1379           ST      #0,aHL+
0656 40      1380           LD      A,#0            ; KETASU <--- 0
0657 3FC0    1381           ST      A,H'C0
0659 3F6B    1382           ST      A,H'6B          ; TIMER = 0
065B 2D28    1383           ST      #H'2,H'8        ; KEY REQUEST ON
065D 6697    1384           BS      PWOF3
             1385  ;
065F 3988    1386  PWOF1:   TEST    8,0             ; KEY RECIEVED ?
```

```
0661  66A0       1337          BS      PWOF4         ;-NO-
0663  3C7B       1338          LD      A,H'7B        ; IN-KEY SAVE
0665  3F79       1339          ST      A,H'79
0667  3C7A       1340          LD      A,H'7A
0669  3F78       1391          ST      A,H'78
066B  3949       1392          CLR     H'9,0         ; IN-KEY REQUEST
066D  3959       1393          CLR     H'9,1
066F  3948       1394          CLR     H'8,0
0671  3918       1395          SET     H'8,1
0673  C7         1396          LD      H,#7
0674  E9         1397          LD      L,#H'9
0675  42         1398          LD      A,#2
0676  16         1399          CMPR    A,@HL         ; CLOCK KEY ?
0677  66A0       1400          BS      PWOF4         ;-NO-
0679  E8         1401          LD      L,#H'8
067A  16         1402          CMPR    A,@HL
067B  66A0       1403          BS      PWOF4         ;-NO-
             1404 ;
067D  21E8       1405          CALL    PEEP
067F  3F7D       1406          ST      A,H'7D

ROM PAGE NO.26 *

0681  39AE       1407          TEST    H'E,2         ; CLOCK(1) DISPLAY ?
0683  668A       1408          BS      PWOF2         ;-NO-
0685  2D2E       1409          ST      #2,H'E        ; DISPLAY STATUS SET
0687  EC         1410          LD      L,#H'C        ; CLOCK(2) DISPLAY
0688  669A       1411          BS      PWOF35
             1412 ;
068A  399E       1413 PWOF2:   TEST    H'E,1         ; CLOCK(2) DISPLAY ?
068C  6697       1414          BS      PWOF3         ;-NO-
068E  2D1E       1415          ST      #1,H'E        ; DISPLAY STATUS SET
0690  C7         1416          LD      H,#H'7        ; LED(TIME2) OFF
0691  EF         1417          LD      L,#H'F
0692  55         1418          CLR     @HL,1
0693  2291       1419          CALL    CLEAR         ; DISPLAY CLEAR
0695  66A0       1420          BS      PWOF4
             1421 ;
0697  2D4E       1422 PWOF3:   ST      #4,H'E        ; DISPLAY STATUS SET
0699  E8         1423          LD      L,#H'8        ; CLOCK(1) DISPLAY
069A  CC         1424 PWOF35:  LD      H,#H'C
069B  43         1425          LD      A,#3
069C  223F       1426          CALL    LOAD
069E  22D9       1427          CALL    TDSPLY
             1428 ;
06A0  3B88       1429 PWOF4:   TEST    %08,0         ; POWER ON ?
06A2  652D       1430          BS      MAIN          ;-NO-
06A4  3818       1431 PWOF5:   SET     %08,1         ; R81,R83,R90 HIGH
06A6  3B38       1432          SET     %08,3
06A8  3809       1433          SET     %09,0
06AA  3A28       1434          IN      %08,A         ; SET INPUT-MODE
06AC  3A29       1435          IN      %09,A
06AE  2D9F       1436          ST      #H'9,H'F      ; STATUS INITIALIZE
06B0  2D1E       1437          ST      #H'1,H'E
06B2  2D0D       1438          ST      #H'0,H'D
06B4  3835       1439          SET     %05,3         ; SUPPLY ON
06B6  C7         1440          LD      H,#H'7        ; LED(KEY) ON
06B7  EE         1441          LD      L,#H'E
06B8  51         1442          SET     @HL,1
06B9  6D77       1443          BS      PLLLD
             1444 ;
             1445 ;
             1446 ;        TIMER SHORI
             1447 ;
06BB  3996       1448 TIMER:   TEST    H'6,1         ; 100MS TIMER ?
06BD  66CB       1449          BS      TS20
06BF  3997       1450          TEST    H'7,1         ; 100MS KEIKA ?
```

ROM PAGE NO.27 *

```
06C1  66CB        1451          BS      TS20
06C3  3956        1452          CLR     H'6,1                ; TIMER RESET
06C5  3957        1453          CLR     H'7,1
06C7  3845        1454          CLR     %05,0                ; MUTE OFF
06C9  3B55        1455          CLR     %05,1
                  1456   ;
06CB  2EBF        1457  TS20:   CMPR    H'F,#H'B             ; S-MODE = STEP ?
06CD  0E          1458          TESTP   ZF
06CE  66D7        1459          BS      TS40
06D0  2ECF        1460          CMPR    H'F,#H'C             ; S-MODE = MANUAL ?
06D2  0E          1461          TESTP   ZF-
06D3  6723        1462          BS      TS60
06D5  6732        1463          BS      TS80
                  1464   ;
                  1465   ;-------STEP    MODE-------
06D7  39B8        1466  TS40:   TEST    H'8,3                ; KEIZOKU FLAG ON ?
06D9  6732        1467          BS      TS80
06DB  39A8        1468          TEST    H'8,2                ; CHUDAN FLAG ON ?
06DD  66E3        1469          BS      TS42                 ;-OFF-
                  1470   ;
06DF  2D28        1471          ST      #2,H'8
06E1  676E        1472          BS      KEYINQ
                  1473   ;
06E3  40          1474  TS42:   LD      A,#0                 ; 10SEC TIMER <--- 0
06E4  3F6B        1475          ST      A,H'6B
06E6  39A7        1476          TEST    H'7,2                ; 300MS KEIKA ?
06E8  676E        1477          BS      KEYINQ               ;-NO-
06EA  3967        1478          CLR     H'7,2                ; TIMER CLEAR
06EC  3C6A        1479          LD      A,H'6A
06EE  D2          1480          CMPR    A,#2                 ; 3SEC KEIKA ?
06EF  0E          1481          TESTP   ZF
06F0  66F7        1482          BS      TS50
06F2  08          1483          INC     A
06F3  3F6A        1484          ST      A,H'6A               ; TIMER COUNT
06F5  676E        1485          BS      KEYINQ
                  1486   ;
06F7  C8          1487  TS50:   LD      H,#H'8               ; WORK1 <--- WORK
06F8  EB          1488          LD      L,#H'B
06F9  44          1489          LD      A,#4
06FA  2251        1490          CALL    STORE
06FC  C9          1491          LD      H,#H'9               ; WORK2 <--- STEP FREQ
06FD  EB          1492          LD      L,#H'B
06FE  3C86        1493          LD      A,H'86
```

ROM PAGE NO.28

```
0700  1A          1494          ST      A,@HL+
0701  3C87        1495          LD      A,H'87
0703  1A          1496          ST      A,@HL+
0704  3C97        1497          LD      A,H'97
0706  1A          1498          ST      A,@HL+
0707  F0          1499          ST      #0,@HL+
0708  F0          1500          ST      #0,@HL+
0709  39DD        1501          TESTP   H'D,1                ; ZENKAI = UP ?
070B  6716        1502          BS      TS52
070D  EB          1503          LD      L,#H'B
070E  2440        1504          CALL    SUB                  ; W(1) <--- W(1) - W(2)
0710  2345        1505          CALL    WAVEC2               ; F-BAND CHECK
0712  676E        1506          BS      KEYINQ
0714  671C        1507          BS      TS54
                  1508   ;
0716  2400        1509  TS52:   CALL    ADDS                 ; W(1) <--- W(1) + W(2)
0718  2345        1510          CALL    WAVEC2
071A  676E        1511          BS      KEYINQ
                  1512   ;
071C  C8          1513  TS54:   LD      H,#H'8               ; WORK <--- NEW FREQ.
```

```
071D EB        1514          LD      L,#H'B
071E 44        1515          LD      A,#4
071F 223F      1516          CALL    LOAD
0721 6D83      1517          BS      PLLST
               1518 ;
               1519 ;------- MANUAL MODE -------
0723 2309      1520 TS60:    CALL    FCONV           ; WORK <--- DISPLAY
0725 E5        1521          LD      L,#5            ; WORK = CURRENT ?
0726 CB        1522 TS62:    LD      H,#H'B
0727 0C        1523          LD      A,@HL
0728 CD        1524          LD      H,#H'D
0729 16        1525          CMPR    A,@HL
072A 6D83      1526          BS      PLLST           ;-NO-
072C 19        1527          DEC     L
072D 0E        1528          TESTP   ZF
072E 676E      1529          BS      KEYINQ
0730 6726      1530          BS      TS62
               1531 ;
               1532 ;------- 10-SEC TIMER -------
0732 4A        1533 TS80:    LD      A,#10
0733 3E6B      1534          CMPR    A,H'6B          ; 10S TIMER = 10 ?
0735 676E      1535          BS      KEYINQ          ;-NO-
0737 40        1536          LD      A,#0            ; 10S TIMER <--- 0
0738 3F6B      1537          ST      A,H'6B
073A 3C0E      1538          LD      A,H'0E          ; ERROR OR CLOCK ?
073C 383E      1539          AND     A,#H'E
073E 676E      1540          BS      KEYINQ
               1541 ;

ROM PAGE NO.29

0740 2EEF      1542          CMPR    H'F,#H'E        ; TIME MODE ?
0742 6757      1543          BS      TS32            ;-NO-
0744 398D      1544          TEST    H'D,0           ; BANK NO. ?
0746 676E      1545          BS      KEYINQ          ;-NO-
0748 40        1546          LD      A,#0
0749 3EC0      1547          CMPR    A,H'C0          ; KETASU = 0 ?
074B 676E      1548          BS      KEYINQ
074D 39DD      1549          TESTP   H'D,1           ; ON-TIME DISPLAY ?
074F 676E      1550          BS      KEYINQ
0751 394D      1551          CLR     H'D,0           ; BANK-NO. OFF
               1552 ;        LD      A,#0            ; T-LINK = 0
0753 3FD7      1553          ST      A,H'D7
0755 675C      1554          BS      TS84
               1555 ;
0757 3CC0      1556 TS82:    LD      A,H'C0          ; KETA-SU = 0 ?
0759 0E        1557          TESTP   ZF
075A 676E      1558          BS      KEYINQ
075C 2D1E      1559 TS84:    ST      #1,H'E          ; DISPLAY <--- FREQ.
075E 3CD0      1560          LD      A,H'D0          ; F-CURR. DISPLAY
0760 3FB0      1561          ST      A,H'B0
0762 CD        1562          LD      H,#H'D
0763 E1        1563          LD      L,#H'1
0764 44        1564          LD      A,#4
0765 223F      1565          CALL    LOAD
0767 22B4      1566          CALL    FDSPLY
0769 40        1567          LD      A,#0            ; KETASU <--- 0
076A 3FC0      1568          ST      A,H'C0
076C 21E8      1569          CALL    PEEP
               1570 ;
               1571 ;
               1572 ; 5-0)-(0)    KAKU KEY NO SHORI
               1573 ;
076E 3988      1574 KEYINQ:  TEST    8,0             ; KEY RECIEVED ?
0770 652D      1575          BS      MAIN            ;-NO-
               1576 ;
0772 40        1577          LD      A,#0            ; 10SEC TIMER <--- 0
```

| | | | | | |
|---|---|---|---|---|---|
| 0773 3F6B | 1578 | | ST | A,H'6B | |
| 0775 3C7A | 1579 | | LD | A,H'7A | ; K-PORT CONV. |
| 0777 04 | 1580 | | TESTP | CF | |
| 0778 07 | 1581 | | RORC | A | |
| 0779 CF | 1582 | | LD | H,#H'F | |
| 077A 31 | 1583 | | XCH | A,L | |
| 077B 29FC | 1584 | | XCH | HL,H'FC | |
| 077D 33 | 1585 | | LDL | A,@DC | |
| 077E CF | 1586 | | LD | H,#H'F | |
| 077F EC | 1587 | | LD | L,#H'C | |

ROM PAGE NO.30

| | | | | | |
|---|---|---|---|---|---|
| 0780 0F | 1588 | | ST | A,@HL | |
| 0781 3C7B | 1589 | | LD | A,H'7B | ; P-PORT CONVERT |
| 0783 05 | 1590 | | ROLC | A | |
| 0784 05 | 1591 | | ROLC | A | |
| 0785 383C | 1592 | | AND | A,#H'C | |
| 0787 1D | 1593 | | OR | A,@HL | |
| 0788 1A | 1594 | | ST | A,@HL+ | |
| 0789 06 | 1595 | | TEST | CF | |
| 078A 678F | 1596 | | BS | KK02 | |
| 078C FD | 1597 | | ST | #H'D,@HL+ | |
| 078D 6790 | 1598 | | BS | KK04 | |
| 078F FC | 1599 | KK02: | ST | #H'C,@HL+ | |
| 0790 33 | 1600 | KK04: | LDL | A,@DC | ; TRL-ED KEY SET |
| 0791 3F78 | 1601 | | ST | A,H'78 | |
| 0793 32 | 1602 | | LDH | A,@DC+ | |
| 0794 3F79 | 1603 | | ST | A,H'79 | |
| | 1604 | ; | | | |
| 0796 3959 | 1605 | | CLR | 9,1 | ; KEY REQUEST SET |
| 0798 3949 | 1606 | | CLR | 9,0 | |
| 079A 2D28 | 1607 | | ST | #H'2,H'8 | |
| | 1608 | ; | | | |
| 079C 39BE | 1609 | | TEST | H'E,3 | ; ERROR DISPLAY ? |
| 079E 67AE | 1610 | | BS | KK22 | |
| 07A0 3C79 | 1611 | | LD | A,H'79 | ; CLEAR KEY ? |
| 07A2 D2 | 1612 | | CMPR | A,#2 | |
| 07A3 652D | 1613 | | BS | MAIN | ;-NO- |
| 07A5 3C78 | 1614 | | LD | A,H'78 | |
| 07A7 D1 | 1615 | | CMPR | A,#1 | |
| 07A8 652D | 1616 | | BS | MAIN | ;-NO- |
| 07AA 397E | 1617 | | CLR | H'E,3 | ; ERROR FLAG RESET . |
| 07AC 67C3 | 1618 | | BS | KK24 | |
| | 1619 | ; | | | |
| 07AE 42 | 1620 | KK22: | LD | A,#2 | ; CLEAR KEY ? |
| 07AF 3E79 | 1621 | | CMPR | A,H'79 | |
| 07B1 67F0 | 1622 | | BS | KK30 | ;-NO- |
| 07B3 41 | 1623 | | LD | A,#1 | |
| 07B4 3E78 | 1624 | | CMPR | A,H'78 | |
| 07B6 67F0 | 1625 | | BS | KK30 | ;-NO- |
| 07B8 3CC0 | 1626 | | LD | A,H'C0 | ; KETA-SU = 0? |
| 07BA 0E | 1627 | | TESTP | ZF | |
| 07BB 67F0 | 1628 | | BS | KK30 | |
| 07BD 2EBF | 1629 | | CMPR | H'F,#H'B | ; STEP MODE ? |
| 07BF 67C3 | 1630 | | BS | KK24 | ;-NO- |

ROM PAGE NO.31 *

| | | | | | |
|---|---|---|---|---|---|
| 07C1 2D1E | 1631 | | ST | #1,H'E | ; DISPLAY = FREQ. |
| 07C3 2EEF | 1632 | KK24: | CMPR | H'F,#H'E | ; TIME MODE ? |
| 07C5 0E | 1633 | | TESTP | ZF | |
| 07C6 67F0 | 1634 | | BS | KK30 | |
| 07C8 21E3 | 1635 | | CALL | PEEP | |
| 07CA 40 | 1636 | | LD | A,#0 | ; KETASU <--- 0 |
| 07CB 3FC0 | 1637 | | ST | A,H'C0 | |
| 07CD 39AE | 1638 | | TEST | H'E,2 | ; CLOCK(1) DISPLAY ? |

```
07CF  67D4      1639         BS    KK26          ;-NO-
07D1  E8        1640         LD    L,#H'8        ; CLOCK(1) DISPLAY
07D2  67D9      1641         BS    KK27
                1642 ;
07D4  399E      1643 KK26:   TEST  H'E,1         ; CLOCK(2) DISPLAY ?
07D6  67E1      1644         BS    KK28          ;-NO-
07D8  EC        1645         LD    L,#H'C        ; CLOCK(2) DISPLAY
07D9  CC        1646 KK27:   LD    H,#H'C
07DA  43        1647         LD    A,#3
07DB  223F      1648         CALL  LOAD
07DD  22D9      1649         CALL  TDSPLY
07DF  652D      1650         BS    MAIN
                1651 ;
07E1  2D1E      1652 KK28:   ST    #1,H'E        ; DISPLAY <--- FREQ.
07E3  3CD0      1653         LD    A,H'D0        ; FREQ. DISPLAY
07E5  3FB0      1654         ST    A,H'B0
07E7  CD        1655         LD    H,#H'D
07E8  E1        1656         LD    L,#H'1
07E9  44        1657         LD    A,#4
07EA  223F      1658         CALL  LOAD
07EC  22B4      1659         CALL  FDSPLY
07EE  652D      1660         BS    MAIN
                1661 ;
07F0  3C0F      1662 KK30:   LD    A,H'0F
07F2  D9        1663         CMPR  A,#H'9        ; MODE = NORMAL ?
07F3  0E        1664         TESTP ZF
07F4  6810      1665         BS    FREQ
07F6  DA        1666         CMPR  A,#H'A        ; MODE = CLOCK ?
07F7  0E        1667         TESTP ZF
07F8  6843      1668         BS    CLOCK
07FA  DB        1669         CMPR  A,#H'B        ; MODE = STEP ?
07FB  0E        1670         TESTP ZF
07FC  68CB      1671         BS    STEP
07FE  DC        1672         CMPR  A,#H'C        ; MODE = MANUAL ?
07FF  0E        1673         TESTP ZF

ROM PAGE NO.32

0800  69B2      1674         BS    MANUAL
0802  DD        1675         CMPR  A,#H'D        ; MODE = MEMORY ?
0803  0E        1676         TESTP ZF
0804  69DD      1677         BS    MEMORY
0806  DE        1678         CMPR  A,#H'E        ; MODE = TIME ?
0807  0E        1679         TESTP ZF
0808  6A7E      1680         BS    TIME
080A  DF        1681         CMPR  A,#H'F        ; MODE = PROGRAM ?
080B  0E        1682         TESTP ZF
080C  68C6      1683         BS    PROGRM
                1684 ;
080E  652D      1685         BS    MAIN
                1686 ;
                1687 ;
                1688 ;      NORMAL MODE SHORI
                1689 ;
0810  C7        1690 FREQ:   LD    H,#H'7        ; S-MODE KEY ?
0811  E9        1691         LD    L,#H'9
0812  0C        1692         LD    A,@HL
0813  D8        1693         CMPR  A,#8
0814  6821      1694         BS    FQ10          ;-NO-
0816  21E8      1695         CALL  PEEP
0818  3C78      1696         LD    A,H'78
081A  D6        1697         CMPR  A,#6          ; TIME MODE ?
081B  6C22      1698         BS    MODE          ;-NO-
081D  2D0D      1699         ST    #H'0,H'D      ; RECALL ONLY
081F  6C22      1700         BS    MODE
                1701 ;
0821  D1        1702 FQ10:   CMPR  A,#1          ; J-MODE KEY ?
```

```
0822 0E        1703          TESTP   ZF
0823 6D93      1704          BS      PLLJM
               1705  ;
0825 D0        1706  FQ20:   CMPR    A,#0          ; "0"-"9","." ?
0826 0E        1707          TESTP   ZF
0827 6CFC      1708          BS      FREQIN
               1709  ;
0829 D2        1710          CMPR    A,#2          ; ENTRY KEY ?
082A 652D      1711          BS      MAIN          ;-NO-
082C E8        1712          LD      L,#H'8
082D 0C        1713          LD      A,@HL
082E D0        1714          CMPR    A,#0
082F 652D      1715          BS      MAIN          ;-NO-
               1716  ;
0831 3CC0      1717          LD      A,H'C0
0833 0E        1718          TESTP   ZF            ; KETASU = 0 ?
0834 652D      1719          BS      MAIN
               1720  ;
0836 21E8      1721          CALL    PEEP
0838 2309      1722          CALL    FCONV         ; WORK <--- DISPLAY
083A 2340      1723          CALL    WAVECH        ; FREQ. CHECK
083C 6CDA      1724          BS      ERDISP
083E 40        1725          LD      A,#0          ; KETASU = 0
083F 3FC0      1726          ST      A,H'C0

ROM PAGE NO.33 *

0841 6D83      1727          BS      PLLST
               1728  ;
               1729  ;
               1730  ;       CLOCK MODE SHORI
               1731  ;
0843 3C79      1732  CLOCK:  LD      A,H'79
0845 D8        1733          CMPR    A,#8          ; S-MODE KEY ?
0846 686F      1734          BS      CM20          ;-NO-
0848 3C78      1735          LD      A,H'78
084A D7        1736          CMPR    A,#7          ; PROGRAM KEY ?
084B 6851      1737          BS      CM02          ;-NO-
084D 21E8      1738          CALL    PEEP
084F 6C22      1739          BS      MODE
               1740  ;
0851 D2        1741  CM02:   CMPR    A,#2          ; CLOCK KEY ?
0852 652D      1742          BS      MAIN          ;-NO-
0854 21E8      1743          CALL    PEEP
0856 39AE      1744          TEST    H'E,2         ; CLOCK(1) DISPLAY ?
0858 686A      1745          BS      CM10
085A 396E      1746          CLR     H'E,2         ; DISPLAY STATUS SET
085C 391E      1747          SET     H'E,1
085E EC        1748          LD      L,#H'C        ; CLOCK(2) DISPLAY
085F CC        1749          LD      H,#H'C
0860 43        1750          LD      A,#3
0861 223F      1751          CALL    LOAD
0863 22D9      1752          CALL    TDSPLY
0865 40        1753          LD      A,#0          ; KETASU <--- 0
0866 3FC0      1754          ST      A,H'C0
0868 652D      1755          BS      MAIN
               1756  ;
086A 41        1757  CM10:   LD      A,#1          ; INKEY <--- FREQ.
086B 3F73      1758          ST      A,H'78
086D 6C22      1759          BS      MODE
               1760  ;
086F 3C79      1761  CM20:   LD      A,H'79
0871 D0        1762          CMPR    A,#0          ; "0"-"9" ?
0872 0E        1763          TESTP   ZF
0873 6D41      1764          BS      CLOKIN
0875 3C79      1765          LD      A,H'79
0877 D2        1766          CMPR    A,#2          ; ENTRY KEY ?
```

```
0878 652D    1767        BS      MAIN            ;-NO-
087A 3C78    1768        LD      A,H'78
087C D0      1769        CMPR    A,#0
087D 652D    1770        BS      MAIN            ;-NO-
087F 3CC0    1771        LD      A,H'C0

ROM PAGE NO.34 *

0881 0E      1772        TESTP   ZF              ; KETASU = 0 ?
0882 652D    1773        BS      MAIN
             1774 ;
0884 21E8    1775        CALL    PEEP
0886 2329    1776        CALL    TCONV
0888 39EE    1777        TESTP   H'E,2           ; CLOCK(1) DISPLAY ?
088A 689C    1778        BS      CM30
088C CB      1779        LD      H,#H'B          ; W(3,4) <--- W(1,2)
088D E3      1780        LD      L,#3
088E 41      1781        LD      A,#1
088F 2251    1782        CALL    STORE
0891 CC      1783        LD      H,#H'C          ; W(1,2) <--- CLK(1)(M
0892 E8      1784        LD      L,#8
0893 41      1785        LD      A,#1
0894 223F    1786        CALL    LOAD
0896 3CC0    1787        LD      A,H'C0          ; KETASU = KETASU + 2
0898 3802    1788        ADD     A,#2
089A 3FC0    1789        ST      A,H'C0
089C 2360    1790 CM30:  CALL    TCHK            ; TIME CHECK
089E 6CDA    1791        BS      ERDISP
08A0 40      1792        LD      A,#0            ; KETASU = 0
08A1 3FC0    1793        ST      A,H'C0
08A3 395C    1794        CLR     H'C,1           ; BLINK-FLAG OFF
08A5 22D9    1795        CALL    TDSPLY
08A7 39AE    1796        TEST    H'E,2           ; CLOCK(1) DISPLAY ?
08A9 68C2    1797        BS      CM40            ;-NO-
08AB 40      1798        LD      A,#0            ; CLOCK CLEAR
08AC 3F26    1799        ST      A,H'26
08AE 3F36    1800        ST      A,H'36
08B0 3F46    1801        ST      A,H'46
08B2 3F56    1802        ST      A,H'56
08B4 3F77    1803        ST      A,H'77
08B6 CC      1804        LD      H,#H'C          ; CLOCK(1) <--- WORK
08B7 E8      1805        LD      L,#H'8
08B8 43      1806        LD      A,#3
08B9 2251    1807        CALL    STORE
08BB 39AC    1808        TEST    H'C,2           ; CLOCK(2) INPUT ?
08BD 652D    1809        BS      MAIN            ;-NO-
08BF 41      1810        LD      A,#1            ; CLOCK(2) <--- MM

ROM PAGE NO.35
08C0 68C5    1811        BS      CM42
             1812 ;
08C2 392C    1813 CM40:  SET     H'C,2           ; SET INPUT STATUS
08C4 43      1814        LD      A,#3            ; CLOCK(2) <--- WORK
08C5 CC      1815 CM42:  LD      H,#H'C
08C6 EC      1816        LD      L,#H'C
08C7 2251    1817        CALL    STORE
08C9 652D    1818        BS      MAIN
             1819 ;
             1820 ;
             1821 ;      STEP MODE SHORI
             1822 ;
08CB 3C79    1823 STEP:  LD      A,H'79
08CD D8      1824        CMPR    A,#8            ; S-MODE KEY ?
08CE 68E6    1825        BS      SM10            ;-NO-
08D0 3C78    1826        LD      A,H'78
08D2 D6      1827        CMPR    A,#6            ; TIME KEY ?
08D3 68D9    1828        BS      SM01            ;-NO-
```

| | | | | | |
|---|---|---|---|---|---|
| 08D5 2D0D | 1829 | | ST | #H'0,H'D | ; RECALL ONLY |
| 08D7 68DF | 1830 | | BS | SM02 | |
| 08D9 D3 | 1831 | SM01: | CMPR | A,#3 | ; STEP KEY ? |
| 08DA 68DF | 1832 | | BS | SM02 | |
| 08DC 41 | 1833 | | LD | A,#1 | ; INKEY <--- FREQ. |
| 08DD 3F78 | 1834 | | ST | A,H'78 | |
| 08DF 21E8 | 1835 | SM02: | CALL | PEEP | |
| 08E1 C7 | 1836 | | LD | H,#H'7 | ; LED(STEP) OFF |
| 08E2 EE | 1837 | | LD | L,#H'E | |
| 08E3 54 | 1838 | | CLR | @HL,0 | |
| 08E4 6C22 | 1839 | | BS | MODE | |
| | 1840 | ; | | | |
| 08E6 D1 | 1841 | SM10: | CMPR | A,#1 | ; J-MODE KEY ? |
| 08E7 0E | 1842 | | TESTP | ZF | |
| 08E8 6D93 | 1843 | | BS | PLLJM | |
| | 1844 | ; | | | |
| 08EA D0 | 1845 | SM20: | CMPR | A,#0 | ; "0"-"9","." ? |
| 08EB 6921 | 1846 | | BS | SM30 | ;-NO- |
| 08ED 3C78 | 1847 | | LD | A,H'78 | |
| 08EF DA | 1848 | | CMPR | A,#H'A | ; "." ? |
| 08F0 0E | 1849 | | TESTP | ZF | |
| 08F1 652D | 1850 | | BS | MAIN | |
| | 1851 | ; | | | |
| 08F3 2D0E | 1852 | | ST | #0,H'E | ; DISPLAY <--- STEP |
| 08F5 3CC0 | 1853 | | LD | A,H'C0 | |
| 08F7 D5 | 1854 | | CMPR | A,#5 | ; KETASU = 5 ? |
| 08F8 68FD | 1855 | | BS | SM22 | ;-NO- |
| 08FA 40 | 1856 | | LD | A,#0 | ; KETASU <--- 0 |
| 08FB 3FC0 | 1857 | | ST | A,H'C0 | |
| 08FD D3 | 1858 | SM22: | CMPR | A,#3 | ; KETASU = 3 ? |
| 08FE 0E | 1859 | | TESTP | ZF | |
| 08FF 652D | 1860 | | BS | MAIN | |

ROM PAGE NO.36 *

| | | | | | |
|---|---|---|---|---|---|
| 0901 D2 | 1861 | | CMPR | A,#2 | ; KETASU = 2 ? |
| 0902 6CFC | 1862 | | BS | FREQIN | ;-NO- |
| 0904 3CC2 | 1863 | | LD | A,H'C2 | |
| 0906 D1 | 1864 | | CMPR | A,#1 | ; 1.. KHZ ? |
| 0907 652D | 1865 | | BS | MAIN | ;-NO- |
| 0909 3CC1 | 1866 | | LD | A,H'C1 | |
| 090B D0 | 1867 | | CMPR | A,#0 | ; 10. KHZ ? |
| 090C 652D | 1868 | | BS | MAIN | ;-NO- |
| 090E 3C78 | 1869 | | LD | A,H'78 | |
| 0910 D0 | 1870 | | CMPR | A,#0 | ; 100 KHZ ? |
| 0911 652D | 1871 | | BS | MAIN | ;-NO- |
| 0913 21E8 | 1872 | | CALL | PEEP | |
| 0915 21F3 | 1873 | | CALL | WAITRT | |
| 0917 40 | 1874 | | LD | A,#0 | |
| 0918 3DC2 | 1875 | | XCH | A,H'C2 | ; 100 KHZ DISPLAY |
| 091A 3FC3 | 1876 | | ST | A,H'C3 | |
| 091C 43 | 1877 | | LD | A,#3 | ; KETASU = 3 |
| 091D 3FC0 | 1878 | | ST | A,H'C0 | |
| 091F 652D | 1879 | | BS | MAIN | |
| | 1880 | ; | | | |
| 0921 D2 | 1881 | SM30: | CMPR | A,#2 | ; CL/RCLL/ENT ? |
| 0922 6941 | 1882 | | BS | SM40 | ;-NO- |
| 0924 3C78 | 1883 | | LD | A,H'78 | |
| 0926 D3 | 1884 | | CMPR | A,#3 | ; RECALL KEY ? |
| 0927 652D | 1885 | | BS | MAIN | ;-NO- |
| 0929 21E8 | 1886 | | CALL | PEEP | |
| 092B 2D0E | 1887 | | ST | #0,H'E | ; DISPLAY <--- STEP |
| 092D CB | 1888 | | LD | H,#H'B | ; WORK <--- STEP FREQ. |
| 092E E1 | 1889 | | LD | L,#H'1 | |
| 092F 3C86 | 1890 | | LD | A,H'86 | |
| 0931 1A | 1891 | | ST | A,@HL+ | |
| 0932 3C87 | 1892 | | LD | A,H'87 | |

```
0934 1A      1893         ST      A,aHL+
0935 3C97    1894         LD      A,H'97
0937 1A      1895         ST      A,aHL+
0938 F0      1896         ST      #0,aHL+
0939 F0      1897         ST      #0,aHL+
093A 22B4    1898         CALL    FDSPLY
093C 45      1899         LD      A,#5              ; KETASU <--- 5
093D 3FC0    1900         ST      A,H'C0
093F 652D    1901         BS      MAIN
             1902 ;

ROM PAGE NO.37 *

0941 D4      1903 SM40:   CMPR    A,#4              ; IN-KEY = UP/DOWN ?
0942 652D    1904         BS      MAIN              ;-NO-
0944 3C78    1905         LD      A,H'78
0946 D0      1906         CMPR    A,#0              ; IN-KEY = UP ?
0947 694D    1907         BS      SM42              ;-NO-
0949 2D2D    1908         ST      #H'2,H'D          ; UP-KEY MODE
094B 6952    1909         BS      SM44
094D D1      1910 SM42:   CMPR    A,#1              ; IN-KEY = DOWN ?
094E 652D    1911         BS      MAIN              ;-NO-
0950 2D1D    1912         ST      #H'1,H'D          ; DOWN-KEY MODE
0952 C6      1913 SM44:   LD      H,#H'6            ; TIMER CLEAR
0953 E8      1914         LD      L,#H'8
0954 F0      1915         ST      #0,aHL+
0955 F0      1916         ST      #0,aHL+
0956 F0      1917         ST      #0,aHL+
0957 3967    1918         CLR     H'7,2             ; 300MS TIMER SET
0959 3926    1919         SET     H'6,2
095B 2DA8    1920         ST      #H'A,H'8          ; KEY REQUEST SET
095D 3919    1921         SET     H'9,1
095F 3909    1922         SET     H'9,0
             1923 ;
0961 CD      1924         LD      H,#H'D            ; WORK <--- CURRENT
0962 E1      1925         LD      L,#H'1
0963 44      1926         LD      A,#4
0964 223F    1927         CALL    LOAD
0966 C8      1928         LD      H,#H'8            ; WORK1 <--- WORK
0967 EB      1929         LD      L,#H'B
0968 44      1930         LD      A,#4
0969 2251    1931         CALL    STORE
096B 3CC0    1932         LD      A,H'C0            ; KETASU = 0 ?
096D 0E      1933         TESTP   ZF
096E 6934    1934         BS      SM60
0970 3CC3    1935         LD      A,H'C3            ; S-FREQ. <--- DISPLAY
0972 DF      1936         CMPR    A,#H'F
0973 6976    1937         BS      SM52
0975 40      1938         LD      A,#0
0976 3F97    1939 SM52:   ST      A,H'97
0978 3CC2    1940         LD      A,H'C2
097A DF      1941         CMPR    A,#H'F
097B 697E    1942         BS      SM54
097D 40      1943         LD      A,#0
097E 3F87    1944 SM54:   ST      A,H'87

ROM PAGE NO.38

0980 3CC1    1945         LD      A,H'C1
0982 3F86    1946         ST      A,H'86
0984 C9      1947 SM60:   LD      H,#H'9            ; WORK2 <--- STEP FREQ
0985 EB      1948         LD      L,#H'B
0986 3C86    1949         LD      A,H'86
0988 1A      1950         ST      A,aHL+
0989 3C87    1951         LD      A,H'87
098B 1A      1952         ST      A,aHL+
098C 3C97    1953         LD      A,H'97
```

```
098E 1A      1954          ST     A,@HL+
098F F0      1955          ST     #0,@HL+
0990 F0      1956          ST     #0,@HL+
0991 39DD    1957          TESTP  H'D,1           ; ZENKAI = UP ?
0993 699E    1958          BS     SM62
0995 EB      1959          LD     L,#H'B
0996 2440    1960          CALL   SUB             ; W(1) <--- W(1) - W(2)
0998 2345    1961          CALL   WAVEC2          ; F-BAND CHECK
099A 652D    1962          BS     MAIN
099C 69A4    1963          BS     SM64
             1964 ;
099E 2400    1965 SM62:    CALL   ADDS            ; W(1) <--- W(1) + W(2)
09A0 2345    1966          CALL   WAVEC2
09A2 652D    1967          BS     MAIN
             1968 ;
09A4 21E8    1969 SM64:    CALL   PEEP
09A6 2D1E    1970          ST     #1,H'E          ; FREQ. DISPLAY
09A8 40      1971          LD     A,#0            ; KETASU = 0
09A9 3FC0    1972          ST     A,H'C0
09AB C8      1973          LD     H,#H'8          ; NEW FREQ. DISPLAY
09AC EB      1974          LD     L,#H'B
09AD 44      1975          LD     A,#4
09AE 223F    1976          CALL   LOAD
09B0 6D83    1977          BS     PLLST
             1978 ;
             1979 ;
             1980 ;
             1981 ;        MANUAL MODE SHORI
             1982 ;
09B2 3C79    1983 MANUAL:  LD     A,H'79
09B4 D8      1984          CMPR   A,#8            ; S-MODE KEY ?
09B5 69D8    1985          BS     MN10            ;-NO-
09B7 3C78    1986          LD     A,H'78
09B9 D6      1987          CMPR   A,#6            ; TIME KEY ?
09BA 69C0    1988          BS     MN01            ;-NO-
09BC 2D0D    1989          ST     #H'0,H'D        ; RECALL ONLY
09BE 69C6    1990          BS     MN02

ROM PAGE NO.39

09C0 D4      1991 MN01:    CMPR   A,#4            ; MANUAL KEY ?
09C1 69C6    1992          BS     MN02            ;-NO-
09C3 41      1993          LD     A,#1            ; IN-KEY <--- FREQ.
09C4 3F78    1994          ST     A,H'78
09C6 21E8    1995 MN02:    CALL   PEEP
09C8 C6      1996          LD     H,#6            ; LED(MANUAL) OFF
09C9 EE      1997          LD     L,#H'E
09CA 54      1998          CLR    @HL,0
09CB C7      1999          LD     H,#H'7          ; LED(KEY)   ON
09CC EE      2000          LD     L,#H'E
09CD 51      2001          SET    @HL,1
09CE EF      2002          LD     L,#H'F          ; LED(C-MODE) OFF
09CF F0      2003          ST     #0,@HL+
09D0 3B44    2004          CLR    %04,0           ; MANUAL-CTL OFF
09D2 3B54    2005          CLR    %04,1
09D4 3B64    2006          CLR    %04,2
09D6 6C22    2007          BS     MODE
             2008 ;
09D8 D1      2009 MN10:    CMPR   A,#1            ; J-MODE KEY ?
09D9 652D    2010          BS     MAIN            ;-NO-
09DB 6D93    2011          BS     PLLJM
             2012 ;
             2013 ;
             2014 ;        MEMORY MODE SHORI
             2015 ;
09DD 3C79    2016 MEMORY:  LD     A,H'79
09DF D8      2017          CMPR   A,#8            ; S-MODE KEY ?
09E0 69FE    2018          BS     MM10            ;-NO-
```

```
09E2  3C78      2019           LD      A,H'78
09E4  D6        2020           CMPR    A,#6            ; TIME KEY ?
09E5  69F1      2021           BS      MM01            ;-NO-
09E7  3CD6      2022           LD      A,H'D6
09E9  D0        2023           CMPR    A,#0            ; F-LINK = 0 ?
09EA  0E        2024           TESTP   ZF
09EB  652D      2025           BS      MAIN
09ED  2D8D      2026           ST      #H'8,H'D        ; MODE = SET TIME
09EF  69F7      2027           BS      MM02
                2028   ;
09F1  D5        2029   MM01:   CMPR    A,#5            ; MEMO KEY ?
09F2  652D      2030           BS      MAIN            ;-NO-
09F4  41        2031           LD      A,#1            ; KEY <--- FREQ.
09F5  3F78      2032           ST      A,H'78
09F7  21E8      2033   MM02:   CALL    PEEP
09F9  C6        2034           LD      H,#H'6
09FA  EF        2035           LD      L,#H'F
09FB  57        2036           CLR     @HL,3           ; LED(MEMO) OFF
09FC  6C22      2037           BS      MODE
                2038   ;
09FE  3C79      2039   MM10:   LD      A,H'79

ROM PAGE NO.40

0A00  D0        2040           CMPR    A,#0            ; "0"-"9","." ?
0A01  6A1C      2041           BS      MM20            ;-NO-
0A03  3C78      2042           LD      A,H'78
0A05  DA        2043           CMPR    A,#H'A          ; "." ?
0A06  0E        2044           TESTP   ZF
0A07  652D      2045           BS      MAIN
0A09  21E8      2046           CALL    PEEP
0A0B  2291      2047           CALL    CLEAR           ; IN-KEY DISPLAY
0A0D  3C78      2048           LD      A,H'78
0A0F  3FC1      2049           ST      A,H'C1
0A11  D0        2050           CMPR    A,#0
0A12  6A17      2051           BS      MM12
0A14  41        2052           LD      A,#1
0A15  3FC2      2053           ST      A,H'C2
0A17  41        2054   MM12:   LD      A,#1            ; KETASU <--- 1
0A18  3FC0      2055           ST      A,H'C0
0A1A  652D      2056           BS      MAIN
                2057   ;
0A1C  3C79      2058   MM20:   LD      A,H'79
0A1E  D2        2059           CMPR    A,#2            ; CL/ENT/RCLL ?
0A1F  652D      2060           BS      MAIN            ;-NO-
0A21  3CC0      2061           LD      A,H'C0
0A23  D0        2062           CMPR    A,#0            ; KETASU = 0 ?
0A24  0E        2063           TESTP   ZF
0A25  652D      2064           BS      MAIN
0A27  3C78      2065           LD      A,H'78
0A29  D1        2066           CMPR    A,#1            ; CLEAR KEY ?
0A2A  6A3E      2067           BS      MM30            ;-NO-
0A2C  21E8      2068           CALL    PEEP
0A2E  3CC1      2069           LD      A,H'C1          ; F-CURR(I) = 10KHZ AM
0A30  D0        2070           CMPR    A,#0
0A31  6A34      2071           BS      MM22
0A33  4A        2072           LD      A,#10
0A34  30        2073   MM22:   XCH     A,H
0A35  E0        2074           LD      L,#H'0
0A36  F4        2075           ST      #4,@HL+
0A37  44        2076           LD      A,#4
0A38  223B      2077           CALL    MCLER
0A3A  E2        2078           LD      L,#H'2
0A3B  F1        2079           ST      #1,@HL+
0A3C  652D      2030           BS      MAIN
                2081   ;
0A3E  D0        2082   MM30:   CMPR    A,#0            ; ENTRY KEY ?
0A3F  6A63      2083           BS      MM40            ;-NO-
```

ROM PAGE NO.41 *

```
0A41 21E8    2084           CALL    PEEP
0A43 3CD0    2085           LD      A,H'D0        ; WORK <--- CURRENT
0A45 3FB0    2086           ST      A,H'B0
0A47 CD      2087           LD      H,#H'D
0A48 E1      2088           LD      L,#1
0A49 44      2089           LD      A,#4
0A4A 223F    2090           CALL    LOAD
0A4C 3CC1    2091           LD      A,H'C1        ; F-BANK NO. <--- DSPLY
0A4E D0      2092           CMPR    A,#0
0A4F 6A52    2093           BS      MM32
0A51 4A      2094           LD      A,#H'A
0A52 30      2095 MM32:     XCH     A,H           ; F-BANK(I) <--- WORK
0A53 E0      2096           LD      L,#H'0
0A54 3CB0    2097           LD      A,H'B0
0A56 1A      2098           ST      A,@HL+
0A57 44      2099           LD      A,#4
0A58 2251    2100           CALL    STORE
0A5A C7      2101           LD      H,#H'7        ; S-MODE = FREQ.
0A5B E8      2102           LD      L,#H'8
0A5C F1      2103           ST      #1,@HL+
0A5D F8      2104           ST      #8,@HL+
0A5E C6      2105           LD      H,#H'6        ; LED(MEMO) OFF
0A5F EF      2106           LD      L,#H'F
0A60 57      2107           CLR     @HL,3
0A61 6C22    2108           BS      MODE
             2109 ;
0A63 D3      2110 MM40:     CMPR    A,#3          ; RECALL KEY ?
0A64 652D    2111           BS      MAIN          ;-NO-
0A66 21E8    2112           CALL    PEEP
0A68 3CC1    2113           LD      A,H'C1
0A6A D0      2114           CMPR    A,#0
0A6B 6A6E    2115           BS      MM42
0A6D 4A      2116           LD      A,#10
0A6E 3FD6    2117 MM42:     ST      A,H'D6        ; F-BANK NO. STORE
0A70 30      2118           XCH     A,H           ; F-BANK(I) DISPLAY
0A71 E0      2119           LD      L,#H'0
0A72 0C      2120           LD      A,@HL
0A73 3FB0    2121           ST      A,H'B0
0A75 E1      2122           LD      L,#H'1
0A76 44      2123           LD      A,#4
0A77 223F    2124           CALL    LOAD
0A79 40      2125           LD      A,#0          ; KETASU <--- 0
0A7A 3FC0    2126           ST      A,H'C0
0A7C 6D83    2127           BS      PLLST
             2128 ;
             2129 ;
             2130 ;         TIMER MODE SHORI
             2131 ;
0A7E 3C79    2132 TIME:     LD      A,H'79
```

ROM PAGE NO.42

```
0A80 D8      2133           CMPR    A,#8          ; S-MODE KEY ?
0A81 6A8C    2134           BS      TM10          ;-NO-
0A83 3C78    2135           LD      A,H'78
0A85 D6      2136           CMPR    A,#6          ; TIME KEY ?
0A86 652D    2137           BS      MAIN          ;-NO-
0A88 21E8    2138           CALL    PEEP
0A8A 6BBE    2139           BS      TM80
             2140 ;
0A8C D0      2141 TM10:     CMPR    A,#0          ; "0"-"9","." ?
0A8D 6A96    2142           BS      TM20          ;-NO-
0A8F 39BD    2143           TEST    H'D,3         ; RECALL MODE ?
0A91 6A97    2144           BS      TM12
0A93 39CD    2145           TESTP   H'D,0         ; BANK NO. INPUT ZUMI ?
```

```
0A95 6AB0    2146           BS      TM14
0A97 3C78    2147  TM12:    LD      A,H'78          ; "1"-"5" ?
0A99 09      2148           DEC     A
0A9A D4      2149           CMPR    A,#4
0A9B 06      2150           TEST    CF
0A9C 652D    2151           BS      MAIN            ;-NO-
             2152  ;
0A9E 390D    2153           SET     H'D,0           ; BANK-NO. FLAG ON
0AA0 395D    2154           CLR     H'D,1
0AA2 396D    2155           CLR     H'D,2
0AA4 2291    2156           CALL    CLEAR           ; IN-VALUE DISPLAY
0AA6 3C78    2157           LD      A,H'78
0AA8 3FC1    2158           ST      A,H'C1
0AAA 3FD7    2159           ST      A,H'D7          ; T-BANK NO. <--- INPUT
0AAC 21E8    2160           CALL    PEEP
0AAE 652D    2161           BS      MAIN
             2162  ;
0AB0 39AD    2163  TM14:    TEST    H'D,2           ; OFF TIME INPUT ZUMI ?
0AB2 6D41    2164           BS      CLOKIN          ;-NO-
0AB4 652D    2165           BS      MAIN
             2166  ;
0AB6 D4      2167  TM20:    CMPR    A,#4            ; ON/OFF ?
0AB7 6AF7    2168           BS      TM30            ;-NO-
0AB9 39BD    2169           TEST    H'D,3           ; RECALL MODE ?
0ABB 652D    2170           BS      MAIN
0ABD 3CC0    2171           LD      A,H'C0
0ABF 0E      2172           TESTP   ZF              ; KETASU = 0 ?

ROM PAGE NO.43
0AC0 652D    2173           BS      MAIN
0AC2 3C78    2174           LD      A,H'78
0AC4 D2      2175           CMPR    A,#2            ; ON KEY ?
0AC5 6AD8    2176           BS      TM22            ;-NO-
0AC7 39DD    2177           TESTP   H'D,1           ; ON TIME INPUT ?
0AC9 652D    2178           BS      MAIN
0ACB 21E8    2179           CALL    PEEP
0ACD 2329    2180           CALL    TCONV
0ACF 2360    2181           CALL    TCHK            ; TIME CHECK
0AD1 6CDA    2182           BS      ERDISP
0AD3 391D    2183           SET     H'D,1           ; ON TIME INPUT FLAG 0
0AD5 E8      2184           LD      L,#H'8          ; ON TIME <--- WORK
0AD6 6AEE    2185           BS      TM28
             2186  ;
0AD8 D3      2187  TM22:    CMPR    A,#3            ; OFF KEY ?
0AD9 652D    2188           BS      MAIN            ;-NO-
0ADB 399D    2189           TEST    H'D,1           ; ON  TIME INPUT ?
0ADD 652D    2190           BS      MAIN            ;-NO-
0ADF 39ED    2191           TESTP   H'D,2           ; OFF TIME INPUT ?
0AE1 652D    2192           BS      MAIN
0AE3 21E8    2193           CALL    PEEP
0AE5 2329    2194           CALL    TCONV           ; WORK <--- DISPLAY
0AE7 2360    2195           CALL    TCHK
0AE9 6CDA    2196           BS      ERDISP
0AEB 392D    2197           SET     H'D,2           ; OFF TIME INPUT FLAG
0AED EC      2198           LD      L,#H'C          ; OFF TIME <--- WORK
0AEE CB      2199  TM28:    LD      H,#H'B
0AEF 43      2200           LD      A,#3
0AF0 2251    2201           CALL    STORE
0AF2 40      2202           LD      A,#0            ; KETASU <--- 0
0AF3 3FC0    2203           ST      A,H'C0
0AF5 652D    2204           BS      MAIN
             2205  ;
0AF7 D2      2206  TM30:    CMPR    A,#2            ; CL/ENT/RCLL/TCL ?
0AF8 652D    2207           BS      MAIN            ;-NO-
0AFA 3C78    2208           LD      A,H'78
0AFC D1      2209           CMPR    A,#1            ; CLEAR KEY ?
0AFD 6B4B    2210           BS      TM40            ;-NO-
0AFF 39BD    2211           TEST    H'D,3           ; RECALL MODE ?
```

ROM PAGE NO.44 *

```
0B01 6B30      2212            BS      TM36
0B03 3CC0      2213            LD      A,H'C0
0B05 D0        2214            CMPR    A,#0         ; KETASU = 0 ?
0B06 0E        2215            TESTP   ZF
0B07 6B0F      2216            BS      TM32
0B09 39DD      2217            TESTP   H'D,1        ; ON TIME INPUT ?
0B0B 6B15      2218            BS      TM33
0B0D 6B26      2219            BS      TM35
               2220    ;
0B0F 39AD      2221    TM32:   TEST    H'D,2        ; OFF TIME INPUT ZUMI
0B11 6B20      2222            BS      TM34         ;-NO-
0B13 396D      2223            CLR     H'D,2        ; OFF TIME INPUT FLAG
0B15 21E8      2224    TM33:   CALL    PEEP
0B17 CB        2225            LD      H,#H'B       ; ON TIME DISPLAY
0B18 E8        2226            LD      L,#H'8
0B19 43        2227            LD      A,#3
0B1A 223F      2228            CALL    LOAD
0B1C 22D9      2229            CALL    TDSPLY
0B1E 6B46      2230            BS      TM38
               2231    ;
0B20 399D      2232    TM34:   TEST    H'D,1        ; ON TIME INPUT ZUMI ?
0B22 6B30      2233            BS      TM36         ;-NO-
0B24 395D      2234            CLR     H'D,1        ; ON TIME INPUT FLAG OFF
0B26 21E8      2235    TM35:   CALL    PEEP
0B28 2291      2236            CALL    CLEAR        ; T-BANK NO. DISPLAY
0B2A 3CD7      2237            LD      A,H'D7
0B2C 3FC1      2238            ST      A,H'C1
0B2E 6B46      2239            BS      TM38
               2240    ;
0B30 398D      2241    TM36:   TEST    H'D,0        ; BANK NO. INPUT ZUMI ?
0B32 652D      2242            BS      MAIN
0B34 21E8      2243            CALL    PEEP
0B36 394D      2244            CLR     H'D,0        ; BANK NO. INPUT FLAG 0
0B38 3CD0      2245            LD      A,H'D0       ; WORK <--- CURRENT
0B3A 3FB0      2246            ST      A,H'B0
0B3C CD        2247            LD      H,#H'D
0B3D E1        2248            LD      L,#H'1
0B3E 44        2249            LD      A,#4
0B3F 223F      2250            CALL    LOAD
```

ROM PAGE NO.45 *

```
0B41 22B4      2251            CALL    FDSPLY       ; FREQ. DISPLAY
0B43 40        2252            LD      A,#0         ; T-BANK NO <--- 0
0B44 3FD7      2253            ST      A,H'D7
0B46 40        2254    TM38:   LD      A,#0         ; KETASU <--- 0
0B47 3FC0      2255            ST      A,H'C0
0B49 652D      2256            BS      MAIN
               2257    ;
0B4B D2        2258    TM40:   CMPR    A,#2         ; TIMECL KEY ?
0B4C 6B5B      2259            BS      TM50         ;-NO-
0B4E 398D      2260            TEST    H'D,0        ; BANK NO. INPUT ZUMI ?
0B50 652D      2261            BS      MAIN
0B52 21E8      2262            CALL    PEEP
0B54 3CD7      2263            LD      A,H'D7       ; T-CURRENT CLEAR
0B56 30        2264            XCH     A,H
0B57 E7        2265            LD      L,#H'7
0B58 F0        2266            ST      #0,@HL+
0B59 6BBE      2267            BS      TM80
               2268    ;
0B5B D0        2269    TM50:   CMPR    A,#0         ; ENTRY KEY ?
0B5C 6B78      2270            BS      TM60         ;-NO-
0B5E 39AD      2271            TEST    H'D,2        ; OFF-TIME INPUT ZUMI ?
0B60 652D      2272            BS      MAIN         ;-NO-
0B62 39BD      2273            TEST    H'D,3        ; TIME-SET MODE ?
```

```
0B64 652D      2274            BS      MAIN            ;-NO-
0B66 21E8      2275            CALL    PEEP
0B68 3CD7      2276            LD      A,H'D7          ; T-BANK(I) <--- CURR.
0B6A 30        2277            XCH     A,H
0B6B E7        2278            LD      L,#H'7
0B6C 3CD6      2279            LD      A,H'D6
0B6E 1A        2280            ST      A,@HL+
0B6F 296C      2281            XCH     HL,H'6C
0B71 CB        2282            LD      H,#H'B
0B72 E8        2283            LD      L,#H'8
0B73 47        2284            LD      A,#7
0B74 2255      2285            CALL    MOVE
0B76 6BBE      2286            BS      TM80
               2287    ;
0B78 D3        2288    TM60:   CMPR    A,#3            ; RECALL KEY ?
0B79 652D      2289            BS      MAIN            ;-NO-
0B7B 398D      2290            TEST    H'D,0           ; BANK NO. INPUT ZUMI ?
0B7D 652D      2291            BS      MAIN
0B7F 390E      2292            SET     H'E,0           ; BANK NO. ON

ROM PAGE NO.46 *

0B81 3CD7      2293            LD      A,H'D7
0B83 30        2294            XCH     A,H
0B84 E7        2295            LD      L,#7
0B85 40        2296            LD      A,#0
0B86 16        2297            CMPR    A,@HL
0B87 0E        2298            TESTP   ZF
0B88 652D      2299            BS      MAIN
0B8A 21E8      2300            CALL    PEEP
0B8C 44        2301            LD      A,#4            ; KETASU : 10-SEC TIMER
0B8D 3FC0      2302            ST      A,H'C0          ; SET RECALL-MODE
0B8F 397D      2303            CLR     H'D,3
0B91 399D      2304            TEST    H'D,1           ; ON TIME INPUT ZUMI ?
0B93 6BAF      2305            BS      TM74
0B95 39AD      2306            TEST    H'D,2           ; OFF TIME INPUT ZUMI ?
0B97 6BA5      2307            BS      TM72
0B99 EC        2308            LD      L,#H'C
0B9A 43        2309            LD      A,#3
0B9B 223F      2310            CALL    LOAD            ; WORK <--- OFF TIME
0B9D 395D      2311            CLR     H'D,1           ; ON-OFF TIME FLAG OFF
0B9F 396D      2312            CLR     H'D,2
0BA1 22D9      2313            CALL    TDSPLY          ; DISPLAY <--- TIME
0BA3 652D      2314            BS      MAIN
               2315    ;
0BA5 E8        2316    TM72:   LD      L,#8            ; WORK <--- ON TIME
0BA6 43        2317            LD      A,#3
0BA7 223F      2318            CALL    LOAD
0BA9 392D      2319            SET     H'D,2           ; OFF TIME FLAG ON
0BAB 22D9      2320            CALL    TDSPLY
0BAD 652D      2321            BS      MAIN
               2322    ;
0BAF E7        2323    TM74:   LD      L,#H'7
0BB0 0C        2324            LD      A,@HL
0BB1 30        2325            XCH     A,H
0BB2 E0        2326            LD      L,#0
0BB3 0C        2327            LD      A,@HL
0BB4 3FB0      2328            ST      A,H'B0
0BB6 E1        2329            LD      L,#1
0BB7 44        2330            LD      A,#4
0BB8 223F      2331            CALL    LOAD
0BBA 391D      2332            SET     H'D,1           ; ON TIME FLAG ON
0BBC 6D83      2333            BS      PLLST
0BBE C7        2334    TM80:   LD      H,#H'7          ; LED(STIME) OFF
0BBF EF        2335            LD      L,#H'F
```

ROM PAGE NO.47

```
OBC0 57       2336           CLR     @HL,3
OBC1 41       2337           LD      A,#1          ; IN-KEY <--- FREQ.
OBC2 3F78     2338           ST      A,H'78
OBC4 6C22     2339           BS      MODE
              2340 ;
              2341 ;
              2342 ;         PROGRAM MODE SHORI
              2343 ;
OBC6 48       2344 PROGRM:   LD      A,#8          ; PROGRAM KEY ?
OBC7 3E79     2345           CMPR    A,H'79
OBC9 652D     2346           BS      MAIN
OBCB 47       2347           LD      A,#7
OBCC 3E78     2348           CMPR    A,H'78
OBCE 6BD9     2349           BS      PM10
OBD0 21E8     2350           CALL    PEEP
OBD2 C6       2351           LD      H,#6          ; LED(PROG.) OFF
OBD3 EF       2352           LD      L,#H'F
OBD4 56       2353           CLR     @HL,2
OBD5 3B74     2354           CLR     %04,3         ; PROG.-CTL OFF
OBD7 66A4     2355           BS      PWOF5
              2356 ;
OBD9 42       2357 PM10:     LD      A,#2          ; CLOCK KEY ?
OBDA 3E78     2358           CMPR    A,H'78
OBDC 652D     2359           BS      MAIN
OBDE 21E8     2360           CALL    PEEP
OBE0 39AE     2361           TEST    H'E,2         ; CLOCK(1) DISPLAY ?
OBE2 6BEB     2362           BS      PM20
OBE4 396E     2363           CLR     H'E,2         ; DISPLAY STATUS SET
OBE6 391E     2364           SET     H'E,1
OBE8 EC       2365           LD      L,#H'C        ; CLOCK2 DISPLAY
OBE9 6C1A     2366           BS      PM32
              2367 ;
OBEB 399E     2368 PM20:     TEST    H'E,1         ; CLOCK(2) DISPLAY ?
OBED 6C0E     2369           BS      PM30
OBEF 395E     2370           CLR     H'E,1         ; DISPLAY STATUS SET
OBF1 390E     2371           SET     H'E,0
OBF3 3CD7     2372           LD      A,H'D7        ; L-NO(TIME) = 0 ?
OBF5 0E       2373           TESTP   ZF
OBF6 6C05     2374           BS      PM25
OBF8 3CD0     2375           LD      A,H'D0        ; WORK <--- F-CURRENT
OBFA 3FB0     2376           ST      A,H'B0
OBFC CD       2377           LD      H,#H'D
OBFD E1       2378           LD      L,#H'1
OBFE 44       2379           LD      A,#4
OBFF 223F     2380           CALL    LOAD
```

ROM PAGE NO.48 *

```
0C01 22B4     2381           CALL    FDSPLY
0C03 652D     2382           BS      MAIN
              2383 ;
0C05 229A     2384 PM25:     CALL    LEDMCL        ; DISPLAY CLEAR
0C07 2291     2385           CALL    CLEAR
0C09 C7       2386           LD      H,#H'7        ; LED(TIME2) OFF
0C0A EF       2387           LD      L,#H'F
0C0B 55       2388           CLR     @HL,1
0C0C 652D     2389           BS      MAIN
              2390 ;
0C0E 394E     2391 PM30:     CLR     H'E,0         ; DISPLAY STATUS SET
0C10 392E     2392           SET     H'E,2
0C12 3CD7     2393           LD      A,H'D7
0C14 D0       2394           CMPR    A,#0          ; T-LINK = 0 ?
0C15 6C19     2395           BS      PM31          ;-NO-
0C17 229A     2396           CALL    LEDMCL
0C19 E8       2397 PM31:     LD      L,#H'8        ; CLOCK(1) DISPLAY
```

```
OC1A  CC       2398 PM32:   LD     H,#H'C
OC1B  43       2399         LD     A,#3
OC1C  223F     2400         CALL   LOAD
OC1E  22D9     2401         CALL   TDSPLY
OC20  652D     2402         BS     MAIN
               2403 ;
               2404 ;
               2405 ; 5-9)           SHORI MODE SETTEI SHORI
               2406 ;
OC22  40       2407 MODE:   LD     A,#0              ; KETASU, PERIOD <--- (
OC23  3FC0     2408         ST     A,H'C0
OC25  3FC6     2409         ST     A,H'C6
OC27  3C78     2410         LD     A,H'78
OC29  D2       2411         CMPR   A,#2              ; S-MODE = CLOCK ?
OC2A  0E       2412         TESTP  ZF
OC2B  6C4C     2413         BS     MD30
OC2D  3CD0     2414         LD     A,H'D0            ; CURRENT DISPLAY
OC2F  3FB0     2415         ST     A,H'B0
OC31  CD       2416         LD     H,#H'D
OC32  E1       2417         LD     L,#H'1
OC33  44       2418         LD     A,#4
OC34  223F     2419         CALL   LOAD
OC36  22B4     2420         CALL   FDSPLY
               2421 ;
OC38  3C78     2422         LD     A,H'78
OC3A  D4       2423         CMPR   A,#4              ; S-MODE = STEP ?
OC3B  0E       2424         TESTP  ZF
OC3C  6C68     2425         BS     MD50
OC3E  3828     2426         OR     A,#H'8            ; S-MODE SETTING

ROM PAGE NO.49

OC40  3F0F     2427         ST     A,H'0F
               2428 ;
OC42  2E9F     2429 MD20:   CMPR   H'F,#9            ; FREQ. MODE ?
OC44  6C5B     2430         BS     MD40              ;-NO-
               2431 ;
               2432 ;-------FREQ.    MODE-------
OC46  2D1E     2433         ST     #H'1,H'E          ; STATUS INITIALIZE
OC48  2D0D     2434         ST     #H'0,H'D
OC4A  652D     2435         BS     MAIN
               2436 ;
               2437 ;-------CLOCK    MODE-------
OC4C  2DAF     2438 MD30:   ST     #H'A,H'F          ; S-MODE = CLOCK
OC4E  2D4E     2439         ST     #H'4,H'E          ; STATUS INITIALIZE
OC50  2D0D     2440         ST     #H'0,H'D
OC52  CC       2441         LD     H,#H'C            ; CLOCK(1) DISPLAY
OC53  E8       2442         LD     L,#H'8
OC54  43       2443         LD     A,#3
OC55  223F     2444         CALL   LOAD
OC57  22D9     2445         CALL   TDSPLY
OC59  652D     2446         BS     MAIN
               2447 ;
OC5B  2EBF     2448 MD40:   CMPR   H'F,#H'B          ; STEP MODE ?
OC5D  6C96     2449         BS     MD60              ;-NO-
               2450 ;
               2451 ;-------STEP     MODE-------
OC5F  2D1E     2452         ST     #H'1,H'E          ; S-STATUS SET
OC61  2D0D     2453         ST     #H'0,H'D
OC63  C7       2454         LD     H,#H'7            ; LED(STEP) ON
OC64  EE       2455         LD     L,#H'E
OC65  50       2456         SET    @HL,0
OC66  652D     2457         BS     MAIN
               2458 ;
               2459 ;-------MANUAL   MODE-------
OC68  3CC5     2460 MD50:   LD     A,H'C5
OC6A  D3       2461         CMPR   A,#3              ; 30-MHZ ?
```

```
OC6B 6C71    2462         BS    MD52           ;-NO-
OC6D 2DBD    2463         ST    #H'B,H'D       ; OVER FLAG SET
OC6F 6C83    2464         BS    MD56
             2465 ;
OC71 3CC2    2466 MD52:   LD    A,H'C2
OC73 DF      2467         CMPR  A,#H'F
OC74 6C7F    2468         BS    MD54
OC76 3CC1    2469         LD    A,H'C1
OC78 D1      2470         CMPR  A,#1           ; 10-KHZ ?
OC79 6C7F    2471         BS    MD54           ;-NO-
OC7B 2D7D    2472         ST    #H'7,H'D       ; UNDER FLAG SET
OC7D 6C83    2473         BS    MD56
             2474 ;
OC7F 2D1E    2475 MD54:   ST    #1,H'E         ; S-STATUS SET

ROM PAGE NO.50 *

OC81 2D3D    2476         ST    #3,H'D
OC83 C6      2477 MD56:   LD    H,#6           ; MANUAL(LED) ON
OC84 EE      2478         LD    L,#H'E
OC85 50      2479         SET   @HL,0
OC86 C7      2480         LD    H,#H'7         ; LED(KEY) OFF
OC87 EE      2481         LD    L,#H'E
OC88 55      2482         CLR   @HL,1
OC89 40      2483         LD    A,#0
OC8A 3F96    2484         ST    A,H'96         ; FREQ. CTR = 0
OC8C 3B24    2485         SET   %04,2          ; MANUAL-CTL ON
OC8E 3B14    2486         SET   %04,1
OC90 3B04    2487         SET   %04,0
OC92 2DCF    2488         ST    #H'C,H'F       ; S-MODE = MANUAL
OC94 652D    2489         BS    MAIN
             2490 ;
OC96 2EDF    2491 MD60:   CMPR  H'F,#H'D       ; MEMO MODE ?
OC98 6CA6    2492         BS    MD70           ;-NO-
             2493 ;
             2494 ;------MEMORY  MODE-------
OC9A 2D1E    2495         ST    #1,H'E         ; S-STATUS SET
OC9C 2D0D    2496         ST    #0,H'D
OC9E C6      2497         LD    H,#H'6         ; LED(MEMO) ON
OC9F EF      2498         LD    L,#H'F
OCA0 53      2499         SET   @HL,3
OCA1 40      2500         LD    A,#0           ; F-LINK = 0
OCA2 3FD6    2501         ST    A,H'D6
OCA4 652D    2502         BS    MAIN
             2503 ;
OCA6 2EEF    2504 MD70:   CMPR  H'F,#H'E       ; TIME MODE ?
OCA8 6CB4    2505         BS    MD80           ;-NO-
             2506 ;
             2507 ;------TIME    MODE-------
OCAA 2D1E    2508         ST    #H'1,H'E       ; S-STATUS SET
OCAC C7      2509         LD    H,#H'7         ; LED(STIME) ON
OCAD EF      2510         LD    L,#H'F
OCAE 53      2511         SET   @HL,3
OCAF 40      2512         LD    A,#0           ; T-LINK = 0
OCB0 3FD7    2513         ST    A,H'D7
OCB2 652D    2514         BS    MAIN
             2515 ;
OCB4 2EFF    2516 MD80:   CMPR  H'F,#H'F       ; PROGRAM MODE ?
OCB6 652D    2517         BS    MAIN           ;-NO-
             2518 ;
             2519 ;------PROGRAM MODE-------
OCB8 2D4E    2520         ST    #4,H'E         ; S-STATUS SET
OCBA 2D0D    2521         ST    #0,H'D
OCBC C6      2522         LD    H,#H'6         ; LED(PROG.) ON
OCBD EF      2523         LD    L,#H'F
OCBE 52      2524         SET   @HL,2
OCBF C7      2525         LD    H,#H'7         ; LED(KEY) OFF
```

ROM PAGE NO.51

```
0CC0  EE      2526          LD      L,#H'E
0CC1  55      2527          CLR     @HL,1
0CC2  CC      2528          LD      H,#H'C           ; CLOCK(1) DISPLAY
0CC3  E8      2529          LD      L,#H'8
0CC4  43      2530          LD      A,#3
0CC5  223F    2531          CALL    LOAD
0CC7  22D9    2532          CALL    TDSPLY
0CC9  40      2533          LD      A,#0             ; T-LINK = 0
0CCA  3FD7    2534          ST      A,H'D7
0CCC  229A    2535          CALL    LEDMCL           ; LED(JMODE) OFF
0CCE  2C04    2536          OUT     #0,%04           ; SUPPLY OFF
0CD0  2C09    2537          OUT     #0,%09
0CD2  3BE5    2538 MD88:    TESTP   %05,2            ; PEEP OFF ?
0CD4  6CD2    2539          BS      MD88             ;-NO-
0CD6  2C05    2540          OUT     #0,%05
0CD8  652D    2541          BS      MAIN
              2542 ;
              2543 ;        ERROR DISPLAY SHORI
              2544 ;
0CDA  393E    2545 ERDISP:  SET     H'E,3            ; ERROR FLAG SET
0CDC  CC      2546          LD      H,#H'C
0CDD  E1      2547          LD      L,#H'1
0CDE  FC      2548          ST      #H'C,@HL+
0CDF  FD      2549          ST      #H'D,@HL+
0CE0  FC      2550          ST      #H'C,@HL+
0CE1  FC      2551          ST      #H'C,@HL+
0CE2  FB      2552          ST      #H'B,@HL+
0CE3  F0      2553          ST      #0,@HL+
0CE4  652D    2554          BS      MAIN
              2555 ;
```

ROM PAGE NO.51

```
0CFC          2556          ORG     H'CFC
              2557 ;
              2558 ;
              2559 ;        FREQUENCY NYURYOKU SHORI
              2560 ;
0CFC  3C78    2561 FREQIN:  LD      A,H'78
0CFE  DA      2562          CMPR    A,#H'A           ; "." KEY ?
0CFF  9A      2563          BSS     FI20             ;-NO-
              2564 ;
```

ROM PAGE NO.52

```
0D00  3CC0    2565 FI10:    LD      A,H'C0           ; KETASU = 0 ?
0D02  0E      2566          TESTP   ZF
0D03  8E      2567          BSS     FI12
0D04  3CC6    2568          LD      A,H'C6
0D06  D0      2569          CMPR    A,#0             ; PERIOD = 0 ?
0D07  BF      2570          BSS     FI90             ;-NO-
0D08  3CC0    2571          LD      A,H'C0
0D0A  D2      2572          CMPR    A,#2             ; KETASU > 2 ?
0D0B  06      2573          TEST    CF
0D0C  BF      2574          BSS     FI90
0D0D  94      2575          BSS     FI14             ;-NO-
              2576 ;
0D0E  2291    2577 FI12:    CALL    CLEAR            ; DISPLAY CLEAR
0D10  CC      2578          LD      H,#H'C
0D11  L0      2579          LD      L,#H'0
0D12  F1      2580          ST      #1,@HL+          ; KETASU <--- 1
0D13  F0      2581          ST      #0,@HL+          ; "0" DISPLAY
0D14  21E8    2582 FI14:    CALL    PEEP
0D16  41      2583          LD      A,#1             ; PERIOD SET
0D17  3FC6    2584          ST      A,H'C6
```

```
0D19 BF         2585           BSS    F190
                2586 ;
0D1A 3CC0       2587 FI20:     LD     A,H'C0
0D1C D0         2588           CMPR   A,#0          ; KETASU = 0 ?
0D1D A5         2589           BSS    FI22          ;-NO-
0D1E 3C78       2590           LD     A,H'78        ; INPUT = 0 ?
0D20 0E         2591           TESTP  ZF
0D21 BF         2592           BSS    F190
0D22 2291       2593           CALL   CLEAR
0D24 AD         2594           BSS    FI26
                2595 ;
0D25 D5         2596 FI22:     CMPR   A,#5          ; KETASU = 5 ?
0D26 A8         2597           BSS    FI24
0D27 BF         2598           BSS    F190
                2599 ;
0D28 3CC6       2600 FI24:     LD     A,H'C6
0D2A D4         2601           CMPR   A,#4          ; PERIOD = 4 ?
0D2B AD         2602           BSS    FI26
0D2C BF         2603           BSS    F190
                2604 ;
0D2D 21E8       2605 FI26:     CALL   PEEP
0D2F CC         2606           LD     H,#H'C        ; DISPLAY <--- L-SHIFT
0D30 E1         2607           LD     L,#H'1
0D31 44         2608           LD     A,#4
0D32 2231       2609           CALL   LSHIFT
0D34 3C78       2610           LD     A,H'78        ; DISPLAY(1) <--- INPUT
0D36 E1         2611           LD     L,#H'1
0D37 1B         2612           ST     A,@HL-
0D38 0A         2613           INC    @HL           ; KETASU COUNT
0D39 40         2614           LD     A,#0          ; PERIOD INPUT ?
0D3A E6         2615           LD     L,#H'6
0D3B 16         2616           CMPR   A,@HL
0D3C BE         2617           BSS    FI28
0D3D BF         2618           BSS    F190
0D3E 0A         2619 FI28:     INC    @HL
0D3F 652D       2620 FI90:     BS     MAIN
                2621 ;
                2622 ;
                2623 ;          CLOCK NYURYOKU SHORI
                2624 ;

ROM PAGE NO.53 *

0D41 3C78       2625 CLOKIN:   LD     A,H'78
0D43 DA         2626           CMPR   A,#H'A        ; "." KEY ?
0D44 0E         2627           TESTP  ZF
0D45 652D       2628           BS     MAIN
                2629 ;
0D47 40         2630           LD     A,#0          ; KETA-SU = 0 ?
0D48 3EC0       2631           CMPR   A,H'C0
0D4A 8E         2632           BSS    CI10
0D4B 2291       2633           CALL   CLEAR         ; CLEAR SHORI
0D4D A9         2634           BSS    CI30
                2635 ;
0D4E 3CC0       2636 CI10:     LD     A,H'C0        ; KETASU = 4 ?
0D50 D4         2637           CMPR   A,#H'4
0D51 94         2638           BSS    CI12
0D52 652D       2639           BS     MAIN
                2640 ;
0D54 399E       2641 CI12:     TEST   H'E,1         ; CLOCK(2) ?
0D56 9B         2642           BSS    CI20          ;-NO-
0D57 D2         2643           CMPR   A,#2          ; KETASU = 2 ?
0D58 9B         2644           BSS    CI20
0D59 652D       2645           BS     MAIN
                2646 ;
0D5B 21F3       2647 CI20:     CALL   WAITRT        ; WAIT SHORI
0D5D 3CC4       2648           LD     A,H'C4        ; DISPLAY SHIFT
```

```
0D5F  3FC5      2649            ST      A,H'C5
0D61  3CC2      2650            LD      A,H'C2
0D63  3FC4      2651            ST      A,H'C4
0D65  3CC1      2652            LD      A,H'C1
0D67  3FC2      2653            ST      A,H'C2
0D69  4A        2654  CI30:     LD      A,#H'A           ; DISPLAY(3) <--- "A"
0D6A  3FC3      2655            ST      A,H'C3
0D6C  3C78      2656            LD      A,H'78           ; DISPLAY(1) <--- INPU
0D6E  3FC1      2657            ST      A,H'C1
0D70  CC        2658            LD      H,#H'C
0D71  E0        2659            LD      L,#H'0
0D72  0A        2660            INC     @HL
0D73  21E8      2661            CALL    PEEP
0D75  652D      2662            BS      MAIN
                2663  ;
                2664  ;
                2665  ; 5-12)           PLL OUTPUT PROC.
                2666  ;
0D77  3CD0      2667  PLLLD:    LD      A,H'D0           ; WORK <--- F.CURRENT
0D79  3FB0      2668            ST      A,H'B0
0D7B  CD        2669            LD      H,#H'D
0D7C  E1        2670            LD      L,#H'1
0D7D  44        2671            LD      A,#4
0D7E  223F      2672            CALL    LOAD

ROM PAGE NO.54

0D80  22B4      2673            CALL    FDSPLY
0D82  A7        2674            BSS     PLL1
                2675  ;
0D83  3CB0      2676  PLLST:    LD      A,H'B0           ; F.CURRENT <--- WORK
0D85  3FD0      2677            ST      A,H'D0
0D87  CD        2678            LD      H,#H'D
0D88  E1        2679            LD      L,#H'1
0D89  44        2680            LD      A,#4
0D8A  2251      2681            CALL    STORE
0D8C  2ECF      2682            CMPR    H'F,#H'C         ; MANUAL MODE ?
0D8E  0E        2683            TESTP   ZF
0D8F  A7        2684            BSS     PLL1
0D90  22B4      2685            CALL    FDSPLY
0D92  A7        2686            BSS     PLL1
                2687  ;
0D93  21E8      2688  PLLJM:    CALL    PEEP             ; J-MODE CHANGE
0D95  3C78      2689            LD      A,H'78
0D97  3FB0      2690            ST      A,H'B0
0D99  3FD0      2691            ST      A,H'D0
0D9B  229A      2692            CALL    LEDMCL
0D9D  22A2      2693            CALL    LEDMST
0D9F  2EBF      2694            CMPR    H'F,#H'B         ; STEP MODE ?
0DA1  A7        2695            BSS     PLL1             ;-NO-
0DA2  CD        2696            LD      H,#H'D           ; WORK <--- F.CURRENT
0DA3  E1        2697            LD      L,#H'1
0DA4  44        2698            LD      A,#4
0DA5  223F      2699            CALL    LOAD
                2700  ;
0DA7  3996      2701  PLL1:     TEST    H'6,1            ; 100MS TIMER REQUEST ?
0DA9  B5        2702            BSS     PL00             ;-NO-
0DAA  3997      2703  PLL2:     TEST    H'7,1            ; 100MS KEIKA ?
0DAC  AA        2704            BSS     PLL2
0DAD  3B55      2705            CLR     %05,1            ; MUTE OFF
0DAF  3B45      2706            CLR     %05,0
0DB1  3956      2707            CLR     H'6,1            ; TIMER OFF
0DB3  3957      2708            CLR     H'7,1
                2709  ;
0DB5  C8        2710  PL00:     LD      H,#H'8           ; W1 <--- WORK
0DB6  EB        2711            LD      L,#H'B
0DB7  44        2712            LD      A,#4
```

```
0DB8 2251      2713          CALL    STORE
0DBA C9        2714          LD      H,#H'9
0DBB EB        2715          LD      L,#H'B
0DBC F5        2716          ST      #5,@HL+         ; W2 <--- 00055
0DBD F5        2717          ST      #5,@HL+
0DBE F0        2718          ST      #0,@HL+
0DBF F0        2719          ST      #0,@HL+
```

ROM PAGE NO.55

```
0DC0 F0        2720          ST      #0,@HL+
0DC1 2400      2721          CALL    ADDS            ; W1 <--- W1 + W2
0DC3 C8        2722          LD      H,#H'8          ; W2 <--- 1KHZ
0DC4 E1        2723          LD      L,#H'1
0DC5 29FC      2724          XCH     HL,H'FC
0DC7 2263      2725          CALL    RREAD
0DC9 3CB0      2726          LD      A,H'B0
0DCB D2        2727          CMPR    A,#2            ; J-MODE : LSB ?
0DCC 91        2728          BSS     PL12            ;-NO-
0DCD EB        2729          LD      L,#H'B
0DCE 2440      2730          CALL    SUB
0DD0 95        2731          BSS     PL20
0DD1 D3        2732 PL12:    CMPR    A,#3            ; J-MODE : USB ?
0DD2 95        2733          BSS     PL20            ;-NO-
0DD3 2400      2734          CALL    ADDS
0DD5 C8        2735 PL20:    LD      H,#H'8          ; W2 <--- VCO CHECK FREQ
0DD6 E7        2736          LD      L,#H'7
0DD7 29FC      2737          XCH     HL,H'FC
0DD9 2263      2738 PL22:    CALL    RREAD
0DDB 44        2739          LD      A,#4
0DDC 247E      2740          CALL    COMP            ; W1 : W2
0DDE 04        2741          TESTP   CF
0DDF 99        2742          BSS     PL22
0DE0 3C9A      2743          LD      A,H'9A          ; EDIT PLL(VCO)
0DE2 3FBA      2744          ST      A,H'BA
               2745 ;
0DE4 CA        2746          LD      H,#H'A          ; BIN = "1F4" + "005"
0DE5 E7        2747          LD      L,#H'7
0DE6 F9        2748          ST      #H'9,@HL+
0DE7 FF        2749          ST      #H'F,@HL+
0DE8 F1        2750          ST      #H'1,@HL+
0DE9 EB        2751          LD      L,#H'B          ; BIN = + "07D"*9....
0DEA FD        2752          ST      #H'D,@HL+
0DEB F7        2753          ST      #H'7,@HL+
0DEC F0        2754          ST      #H'0,@HL+
0DED 40        2755          LD      A,#0
0DEE 3D8F      2756          XCH     A,H'8F
0DF0 23B6      2757          CALL    BADD
0DF2 EB        2758          LD      L,#H'B          ; BIN = + "019"*.9...
0DF3 F9        2759          ST      #H'9,@HL+
0DF4 F1        2760          ST      #H'1,@HL+
0DF5 F0        2761          ST      #H'0,@HL+
0DF6 E0        2762          LD      L,#0
0DF7 3C8E      2763          LD      A,H'8E
0DF9 06        2764          TEST    CF
0DFA 07        2765          RORC    A
0DFB 31        2766          XCH     A,L
0DFC 05        2767          ROLC    A
0DFD 3F8E      2768          ST      A,H'8E
0DFF 11        2769          MOV     L,A
```

ROM PAGE NO.56

```
0E00 23B6      2770          CALL    BADD
               2771 ;
0E02 CA        2772          LD      H,#H'A          ; W3 <--- 00000-0
```

```
0E03  EA      2773          LD      L,#H'A
0E04  45      2774          LD      A,#5
0E05  223B    2775          CALL    MCLER
0E07  C7      2776          LD      H,#H'7
0E08  ED      2777          LD      L,#H'D          ; W2 <--- 00030-0
0E09  29FC    2778          XCH     HL,H'FC
0E0B  2263    2779          CALL    RREAD
0E0D  2D0B    2780          ST      #0,H'B
0E0F  244D    2781          CALL    DIV             ; W3 <--- W1 / W2
0E11  248E    2782          CALL    DBCVA           ; W3 BINARY
0E13  06      2783          TEST    CF              ; EDIT PLL(NP)
0E14  C0      2784          LD      H,#0
0E15  3CA7    2785          LD      A,H'A7
0E17  07      2786          RORC    A
0E18  30      2787          XCH     A,H
0E19  07      2788          RORC    A
0E1A  3FBC    2789          ST      A,H'BC
0E1C  10      2790          MOV     H,A
0E1D  05      2791          ROLC    A
0E1E  30      2792          XCH     A,H
0E1F  3CA8    2793          LD      A,H'A8
0E21  07      2794          RORC    A
0E22  30      2795          XCH     A,H
0E23  07      2796          RORC    A
0E24  3FBD    2797          ST      A,H'BD
0E26  10      2798          MOV     H,A
0E27  05      2799          ROLC    A
0E28  30      2800          XCH     A,H
0E29  3CA9    2801          LD      A,H'A9
0E2B  07      2802          RORC    A
0E2C  30      2803          XCH     A,H
0E2D  07      2804          RORC    A
0E2E  3FBE    2805          ST      A,H'BE
0E30  10      2806          MOV     H,A
0E31  3FBF    2807          ST      A,H'BF
              2808  ;
0E33  EB      2809  PL30:   LD      L,#H'B          ; WORK3 <--- WORK1
0E34  CA      2810          LD      H,#H'A
0E35  44      2811          LD      A,#4
0E36  227F    2812          CALL    MOVES
0E38  249B    2813          CALL    DBCNV           ; W3 BINARY
0E3A  CB      2814          LD      H,#H'B
0E3B  EB      2815          LD      L,#H'B
0E3C  3CA7    2816          LD      A,H'A7          ; EDIT PLL(A)
0E3E  1A      2817          ST      A,@HL+
0E3F  3CA8    2818          LD      A,H'A8

ROM PAGE NO.57 *

0E41  1D      2819          OR      A,@HL
0E42  0F      2820          ST      A,@HL
              2821  ;
              2822  ;-------EDIT    MSB(D-A)-------
0E43  C8      2823  PL40:   LD      H,#H'8          ; W1 <--- WORK
0E44  EB      2824          LD      L,#H'B
0E45  44      2825          LD      A,#4
0E46  2251    2826          CALL    STORE
0E48  C9      2827          LD      H,#H'9
0E49  E9      2828          LD      L,#H'9
0E4A  29FC    2829          XCH     HL,H'FC         ; DC <--- BAND ADRS
0E4C  2263    2830  PL42:   CALL    RREAD
0E4E  44      2831          LD      A,#4
0E4F  247E    2832          CALL    COMP            ; WORK1 : WORK2 COMPEAR
0E51  06      2833          TEST    CF
0E52  8C      2834          BSS     PL42
0E53  C7      2835          LD      H,#H'7
0E54  3C9A    2836          LD      A,H'9A
```

```
0E56  31      2837            XCH     A,L
0E57  29FC    2838            XCH     HL,H'FC
0E59  33      2839            LDL     A,@DC           ; MSB(BAND) <--- ROM TAI
0E5A  3FB6    2840            ST      A,H'B6
0E5C  32      2841            LDH     A,@DC+
0E5D  3FB7    2842            ST      A,H'B7
0E5F  41      2843            LD      A,#1
0E60  3E9A    2844            CMPR    A,H'9A          ; BAND = 1 ?
0E62  AA      2845            BSS     PL44            ;-NO-
0E63  4F      2846            LD      A,#H'F          ; MSB(R-F) <--- "FF"
0E64  3FB8    2847            ST      A,H'B8
0E66  3FB9    2848            ST      A,H'B9
0E68  6EC4    2849            BS      PL60
              2850    ;
0E6A  2D3B    2851    PL44:   ST      #3,H'B          ; W3 <--- W1 / W2
0E6C  244D    2852            CALL    DIV
0E6E  EB      2853            LD      L,#H'B          ; WORK1 <--- WORK3
0E6F  CA      2854            LD      H,#H'A
0E70  44      2855            LD      A,#4
0E71  226B    2856            CALL    MOVEL
0E73  CA      2857            LD      H,#H'A          ; DC <--- MSB ADDRESS
0E74  EE      2858            LD      L,#H'E
0E75  29FC    2859            XCH     HL,H'FC
0E77  2263    2860    PL46:   CALL    RREAD           ; W2 <--- MSB WAVE
0E79  44      2861            LD      A,#4
0E7A  247E    2862            CALL    COMP            ; W1 : W2
0E7C  BF      2863            BSS     PL48
0E7D  6E87    2864            BS      PL50
              2865    ;
0E7F  06      2866    PL48:   TEST    CF

ROM PAGE NO.58

0E80  87      2867            BSS     PL50
0E81  CF      2868            LD      H,#H'F
0E82  EC      2869            LD      L,#H'C
0E83  3843    2870            ADD     @HL,#3          ; DC <--- DC + 3
0E85  6E77    2871            BS      PL46
              2872    ;
0E87  C8      2873    PL50:   LD      H,#H'8          ; W1 R-SHIFT
0E88  EA      2874            LD      L,#H'A
0E89  44      2875            LD      A,#4
0E8A  227F    2876            CALL    MOVES
0E8C  40      2877            LD      A,#0
0E8D  3F8F    2878            ST      A,H'8F
0E8F  C9      2879            LD      H,#H'9          ; W2 <--- 00000-0
0E90  EA      2880            LD      L,#H'A
0E91  45      2881            LD      A,#5
0E92  223B    2882            CALL    MCLER
0E94  33      2883            LDL     A,@DC           ; W2 <--- MSB(MUL) DATA
0E95  3F9A    2884            ST      A,H'9A
0E97  32      2885            LDH     A,@DC+
0E98  3F9B    2886            ST      A,H'9B
0E9A  33      2887            LDL     A,@DC
0E9B  3F9C    2888            ST      A,H'9C
0E9D  2411    2889            CALL    MUL             ; W1 <--- W1 X W2
0E9F  C8      2890            LD      H,#H'8          ; W1 R-SHIFT
0EA0  ED      2891            LD      L,#H'D
0EA1  42      2892            LD      A,#2
0EA2  226B    2893            CALL    MOVEL
0EA4  40      2894            LD      A,#0
0EA5  3F8E    2895            ST      A,H'8E
0EA7  3F8F    2896            ST      A,H'8F
0EA9  32      2897            LDH     A,@DC+          ; W2 <--- MSB SUB DATA
0EAA  3F9B    2898            ST      A,H'9B
0EAC  33      2899            LDL     A,@DC
```

```
0EAD  3F9C    2900           ST     A,H'9C
0EAF  32      2901           LDH    A,@DC+
0EB0  3F9D    2902           ST     A,H'9D
0EB2  EB      2903           LD     L,#H'B
0EB3  2440    2904           CALL   SUB              ; W1 <--- W1 - W2
0EB5  EB      2905           LD     L,#H'B           ; WORK3 <--- WORK1
0EB6  CA      2906           LD     H,#H'A
0EB7  44      2907           LD     A,#4
0EB8  227F    2908           CALL   MOVES
0EBA  249B    2909           CALL   DBCNV            ; W3 BINARY
0EBC  3CA7    2910           LD     A,H'A7           ; MSB(R-F) <--- BINARY
0EBE  3FB8    2911           ST     A,H'B8
```

ROM PAGE NO.59

```
0EC0  3CA8    2912           LD     A,H'A8
0EC2  3FB9    2913           ST     A,H'B9
0EC4  39BF    2914 PL60:     TEST   H'F,3            ; POWER ON ?
0EC6  652D    2915           BS     MAIN             ;-NO-
0EC8  3CBA    2916           LD     A,H'BA           ; NEW VCO SAVE
0ECA  3F03    2917           ST     A,H'03
0ECC  2ECF    2918           CMPR   H'F,#H'C         ; S-MODE = MANUAL ?
0ECE  A5      2919           BSS    PL62             ;-NO-
0ECF  3C79    2920           LD     A,H'79
0ED1  D1      2921           CMPR   A,#1             ; J-MODE INPUT ?
0ED2  97      2922           BSS    PL61             ;-NO-
0ED3  48      2923           LD     A,#8             ; INPUT CLEAR
0ED4  3F79    2924           ST     A,H'79
0ED6  A5      2925           BSS    PL62
              2926 ;
0ED7  3C04    2927 PL61:     LD     A,H'04           ; OLD-VCO MAKE
0ED9  06      2928           TEST   CF
0EDA  07      2929           RORC   A
0EDB  3FFC    2930           ST     A,H'FC
0EDD  3CBA    2931           LD     A,H'BA           ; NEW-VCO MAKE
0EDF  06      2932           TEST   CF
0EE0  07      2933           RORC   A
0EE1  3EFC    2934           CMPR   A,H'FC           ; OLD-VCO = NEW-VCO ?
0EE3  0E      2935           TESTP  CF
0EE4  B0      2936           BSS    PL64
              2937 ;
0EE5  3B15    2938 PL62:     SET    %05,1            ; MUTE(1) ON
0EE7  40      2939           LD     A,#0
0EE8  3F76    2940           ST     A,H'76           ;  3-MS TIMER CLEAR
0EEA  3F67    2941           ST     A,H'67           ; 100MS TIMER REQUEST
0EEC  3957    2942           CLR    H'7,1
0EEE  3916    2943           SET    H'6,1
0EF0  CF      2944 PL64:     LD     H,#H'F           ; MSB(MODE) <--- JMODE
0EF1  3CB0    2945           LD     A,H'B0
0EF3  31      2946           XCH    A,L
0EF4  29FC    2947           XCH    HL,H'FC
0EF6  CF      2948           LD     H,#H'F
0EF7  EE      2949           LD     L,#H'E
0EF8  33      2950           LDL    A,@DC
0EF9  1F      2951           XOR    A,@HL
0EFA  3FA7    2952           ST     A,H'A7
0EFC  32      2953           LDH    A,@DC+
0EFD  1F      2954           XOR    A,@HL
0EFE  3831    2955           AND    A,#1
```

ROM PAGE NO.60

```
0F00  CB      2956           LD     H,#H'B
0F01  E6      2957           LD     L,#6
0F02  1D      2958           OR     A,@HL
0F03  0F      2959           ST     A,@HL
              2960 ;
```

```
0F04  45      2961 PL70:  LD      A,#H'5          ; PLL HENKAN
0F05  3FFD    2962        ST      A,H'FD
0F07  CB      2963        LD      H,#H'B
0F08  E6      2964        LD      L,#H'6
0F09  0C      2965 PL72:  LD      A,@HL
0F0A  3FFC    2966        ST      A,H'FC
0F0C  33      2967        LDL     A,@DC
0F0D  1A      2968        ST      A,@HL+
0F0E  89      2969        BSS     PL72
0F0F  3CA7    2970        LD      A,H'A7
0F11  3FFC    2971        ST      A,H'FC
0F13  33      2972        LDL     A,@DC
0F14  3FA7    2973        ST      A,H'A7
              2974 ;
0F16  42      2975        LD      A,#2
0F17  3E76    2976 PL80:  CMPR    A,H'76          ; 3-MS KEIKA ?
0F19  97      2977        BSS     PL80            ;-NO-
              2978 ;
0F1A  3C03    2979        LD      A,H'03
0F1C  3E04    2980        CMPR    A,H'04
0F1E  0E      2981        TESTP   ZF
0F1F  AB      2982        BSS     PL82
0F20  3B05    2983        SET     %05,0           ; MUTE(2) ON
0F22  40      2984        LD      A,#0            ; 100MS TIMER REQUEST
0F23  3F67    2985        ST      A,H'67
0F25  3916    2986        SET     H'6,1
0F27  3957    2987        CLR     H'7,1
0F29  3C03    2988        LD      A,H'03
0F2B  3F04    2989 PL82:  ST      A,H'04          ; VCO SAVE
0F2D  3B29    2990        SET     %09,2           ; PORT(R9) INITIALIZE
0F2F  3B19    2991        SET     %09,1
0F31  3939    2992        SET     H'9,3           ; ISIO ON
0F33  4F      2993        LD      A,#H'F          ; COUNTER <--- "F"
0F34  3FA6    2994        ST      A,H'A6
0F36  42      2995        LD      A,#2            ; SET OUTPUT COMMAND
0F37  3A8F    2996        OUT     A,%H'1F
0F39  3CBF    2997        LD      A,H'BF          ; SET FIRST DATA
0F3B  3AAF    2998        OUT     A,%H'0F
0F3D  4A      2999        LD      A,#H'A          ; "EISO" ON
0F3E  3A8F    3000        OUT     A,%H'1F

ROM PAGE NO.61

0F40  652D    3001        BS      MAIN
              3002 ;
              3003 ;*******************************************************

ROM PAGE NO.61

0F50          3004        ORG     H'F50
              3005 ;
              3006 ; ----< PATTERN TABLE >----
              3007 ;
              3008 ;         PLLOUT HENKAN TABLE
0F50  00      3009        DATA    H'00            ; 0
0F51  08      3010        DATA    H'08            ; 1
0F52  04      3011        DATA    H'04            ; 2
0F53  0C      3012        DATA    H'0C            ; 3
0F54  02      3013        DATA    H'02            ; 4
0F55  0A      3014        DATA    H'0A            ; 5
0F56  06      3015        DATA    H'06            ; 6
0F57  0E      3016        DATA    H'0E            ; 7
0F58  01      3017        DATA    H'01            ; 8
0F59  09      3018        DATA    H'09            ; 9
0F5A  05      3019        DATA    H'05            ; 10
0F5B  0D      3020        DATA    H'0D            ; 11
0F5C  03      3021        DATA    H'03            ; 12
```

```
OF5D  0B        3022            DATA    H'0B            ; 13
OF5E  07        3023            DATA    H'07            ; 14
OF5F  0F        3024            DATA    H'0F            ; 15
                3025    ;
OF60  00        3026            DATA    H'00            ; PLA,LED PORT
OF61  80        3027            DATA    H'80            ; R73
OF62  40        3028            DATA    H'40            ; R72
OF63  20        3029            DATA    H'20            ; R71
OF64  10        3030            DATA    H'10            ; R70
OF65  08        3031            DATA    H'08            ; R63
OF66  04        3032            DATA    H'04            ; R62
OF67  02        3033            DATA    H'02            ; R61
                3034    ;
OF68  00        3035            DATA    H'00            ; 10(KHZ)
OF69  01        3036            DATA    H'01
OF6A  00        3037            DATA    H'00
OF6B  00        3038            DATA    H'00
OF6C  00        3039            DATA    H'00
OF6D  30        3040            DATA    H'30
                3041    ;
OF6E  00        3042            DATA    H'00            ; NO USE
OF6F  00        3043            DATA    H'00
                3044    ;
                3045    ; MSB BAND TABLE
OF70  00        3046            DATA    H'00            ; -
OF71  80        3047            DATA    H'80            ; (1)
OF72  40        3048            DATA    H'40            ; (2)
OF73  20        3049            DATA    H'20            ; (3)
OF74  10        3050            DATA    H'10            ; (4)
OF75  08        3051            DATA    H'08            ; (5)
OF76  04        3052            DATA    H'04            ; (6)
OF77  02        3053            DATA    H'02            ; (7)
                3054    ;
                3055    ; LED MODE TABLE
OF78  20        3056            DATA    H'20            ; (0)
OF79  04        3057            DATA    H'04            ; (1)
OF7A  08        3058            DATA    H'08            ; (2)
OF7B  40        3059            DATA    H'40            ; (3)
OF7C  80        3060            DATA    H'80            ; (4)
                3061    ;
                3062    ;
OF7D  00        3063            DATA    H'00            ; 0.080-0
OF7E  08        3064            DATA    H'08
OF7F  00        3065            DATA    H'00
                3066    ;

ROM PAGE NO.62

OF80  00        3067            DATA    H'00
                3068    ;
                3069    ; USB/LSB COUNT AREA (+,- 1 KHZ)
OF81  10        3070            DATA    H'10            ; 0.001-0
OF82  00        3071            DATA    H'00
OF83  00        3072            DATA    H'00
                3073    ;
                3074    ; FREQ COUNT AREA
OF84  50        3075            DATA    H'50            ; STD 40.455
OF85  45        3076            DATA    H'45
OF86  40        3077            DATA    H'40
                3078    ;
                3079    ; VCO CHECK TABLE
OF87  79        3080            DATA    H'79            ; (1) 44.457-1H
OF88  05        3081            DATA    H'05
OF89  04        3082            DATA    H'04
OF8A  68        3083            DATA    H'68            ; (2) 48.456-1L
OF8B  05        3084            DATA    H'05
```

```
OF8C 08        3085        DATA    H'08
OF8D 15        3086        DATA    H'15            ; (3)  53.221-2H
OF8E 82        3087        DATA    H'82
OF8F 12        3088        DATA    H'12
OF90 64        3089        DATA    H'64            ; (4)  58.456-2L
OF91 05        3090        DATA    H'05
OF92 18        3091        DATA    H'18
OF93 63        3092        DATA    H'63            ; (5)  64.176-1H
OF94 77        3093        DATA    H'77
OF95 23        3094        DATA    H'23
OF96 92        3095        DATA    H'92            ; (6)  (MAX)-1L
OF97 99        3096        DATA    H'99
OF98 99        3097        DATA    H'99
               3098    ;
               3099    ; BAND CHECK TABLE
OF99 77        3100        DATA    H'77            ; (1)  12.757-7
OF9A 75        3101        DATA    H'75
OF9B 12        3102        DATA    H'12
OF9C 06        3103        DATA    H'06            ; (2)   5.230-6
OF9D 23        3104        DATA    H'23
OF9E 05        3105        DATA    H'05
OF9F 45        3106        DATA    H'45            ; (3)   2.144-5
OFA0 14        3107        DATA    H'14
OFA1 02        3108        DATA    H'02
OFA2 94        3109        DATA    H'94            ; (4)   0.879-4
OFA3 87        3110        DATA    H'87
OFA4 00        3111        DATA    H'00
OFA5 03        3112        DATA    H'03            ; (5)   0.360-3
OFA6 36        3113        DATA    H'36
OFA7 00        3114        DATA    H'00
OFA8 02        3115        DATA    H'02            ; (6)   0.150-2
OFA9 15        3116        DATA    H'15
OFAA 00        3117        DATA    H'00
OFAB 01        3118        DATA    H'01            ; (7)   0.010-1
OFAC 01        3119        DATA    H'01
OFAD 00        3120        DATA    H'00
               3121    ;
               3122    ; MSB CHECK TABLE
OFAE 00        3123        DATA    H'00            ; (1)  1.300*179-142
OFAF 30        3124        DATA    H'30
OFB0 01        3125        DATA    H'01
OFB1 79        3126        DATA    H'79
OFB2 21        3127        DATA    H'21
OFB3 14        3128        DATA    H'14
OFB4 00        3129        DATA    H'00            ; (2)  2.000*149-103
OFB5 00        3130        DATA    H'00
OFB6 02        3131        DATA    H'02
OFB7 49        3132        DATA    H'49
OFB8 31        3133        DATA    H'31
OFB9 10        3134        DATA    H'10
OFBA 90        3135        DATA    H'90            ; (3)  (MAX)*133-071
OFBB 99        3136        DATA    H'99
OFBC 99        3137        DATA    H'99
OFBD 33        3138        DATA    H'33
OFBE 11        3139        DATA    H'11
OFBF 07        3140        DATA    H'07
               3141    ;
               3142    ; IN-KEY CONVERT TABLE

ROM PAGE NO.63

OFC0 13        3143        DATA    H'13            ; 0<0> USB
OFC1 42        3144        DATA    H'42            ; 0<1> ON
OFC2 41        3145        DATA    H'41            ; 0<2> DOWN
OFC3 14        3146        DATA    H'14            ; 0<3> AM
OFC4 12        3147        DATA    H'12            ; 1<0> LSB
OFC5 43        3148        DATA    H'43            ; 1<1> OFF
```

```
0FC6  83      3149        DATA    H'83        ; 1<2>  STEP
0FC7  86      3150        DATA    H'86        ; 1<3>  TIME
0FC8  11      3151        DATA    H'11        ; 2<0>  CW
0FC9  82      3152        DATA    H'82        ; 2<1>  CLOCK
0FCA  85      3153        DATA    H'85        ; 2<2>  MEMO
0FCB  40      3154        DATA    H'40        ; 2<3>  UP
0FCC  10      3155        DATA    H'10        ; 3<0>  FM
0FCD  22      3156        DATA    H'22        ; 3<1>  TIME/CL
0FCE  23      3157        DATA    H'23        ; 3<2>  RECALL
0FCF  FF      3158        DATA    H'FF        ; 3<3>  ---
0FD0  84      3159        DATA    H'84        ; 4<0>  MANUAL
0FD1  87      3160        DATA    H'87        ; 4<1>  PROGRAM
0FD2  21      3161        DATA    H'21        ; 4<2>  CLEAR
0FD3  FF      3162        DATA    H'FF        ; 4<3>  ---
0FD4  01      3163        DATA    H'01        ; 5<0>  "1"
0FD5  04      3164        DATA    H'04        ; 5<1>  "4"
0FD6  07      3165        DATA    H'07        ; 5<2>  "7"
0FD7  00      3166        DATA    H'00        ; 5<3>  "0"
0FD8  02      3167        DATA    H'02        ; 6<0>  "2"
0FD9  05      3168        DATA    H'05        ; 6<1>  "5"
0FDA  08      3169        DATA    H'08        ; 6<2>  "8"
0FDB  0A      3170        DATA    H'0A        ; 6<3>  "."
0FDC  03      3171        DATA    H'03        ; 7<0>  "3"
0FDD  06      3172        DATA    H'06        ; 7<1>  "6"
0FDE  09      3173        DATA    H'09        ; 7<2>  "9"
0FDF  20      3174        DATA    H'20        ; 7<3>  ENTRY
              3175    ;
              3176    ; DISPLAY PATTERN
0FE0  7E      3177        DATA    H'7E        ; "0"
0FE1  30      3178        DATA    H'30        ; "1"
0FE2  6D      3179        DATA    H'6D        ; "2"
0FE3  79      3180        DATA    H'79        ; "3"
0FE4  33      3181        DATA    H'33        ; "4"
0FE5  5B      3182        DATA    H'5B        ; "5"
0FE6  5F      3183        DATA    H'5F        ; "6"
0FE7  72      3184        DATA    H'72        ; "7"
0FE8  7F      3185        DATA    H'7F        ; "8"
0FE9  7B      3186        DATA    H'7B        ; "9"
0FEA  01      3187        DATA    H'01        ; "-"
0FEB  4F      3188        DATA    H'4F        ; "E"
0FEC  05      3189        DATA    H'05        ; "R"
0FED  1D      3190        DATA    H'1D        ; "O"
0FEE  00      3191        DATA    H'00        ; ---
0FEF  00      3192        DATA    H'00        ; " "
              3193    ;
              3194    ; PATTERN AREA    NUMERIC---> BIT
0FF0  01      3195        DATA    H'01        ; (0)
0FF1  02      3196        DATA    H'02        ; (1)
0FF2  04      3197        DATA    H'04        ; (2)
0FF3  08      3198        DATA    H'08        ; (3)
0FF4  10      3199        DATA    H'10        ; (4)
0FF5  20      3200        DATA    H'20        ; (5)
0FF6  40      3201        DATA    H'40        ; (6)
0FF7  80      3202        DATA    H'80        ; (7)
              3203    ;
              3204    ; PATTERN AREA    U = BIT---> NUMERIC
              3205    ;                 L = PORT--> NUMERIC
0FF8  00      3206        DATA    H'00        ; <01> <0>
0FF9  11      3207        DATA    H'11        ; <02> <1>
0FFA  22      3208        DATA    H'22        ; <04> <2>
0FFB  32      3209        DATA    H'32        ; <08> <2-1>
0FFC  43      3210        DATA    H'43        ; <10> <3>
0FFD  53      3211        DATA    H'53        ; <20> <3-1>
0FFE  63      3212        DATA    H'63        ; <40> <3-2>
0FFF  73      3213        DATA    H'73        ; <80> <3-2-1>
              3214    ;
```

```
3215 ;            END
3216              END
ASSEMBLY COMPLETE,      0 PROGRAM ERROR(S)
```

SYMBOL TABLE

| | | | | | | | |
|---|---|---|---|---|---|---|---|
| ADD2 | 0401 | ADDS | 0400 | ADDS1 | 0402 | ADDS2 | 0407 |
| ADDS3 | 040A | ADDS4 | 040D | BADD | 03B6 | BADD2 | 03B8 |
| BADD8 | 03CC | CC00 | 0554 | CC10 | 0560 | CC14 | 0574 |
| CC16 | 0579 | CC20 | 0587 | CC22 | 0598 | CC24 | 05BF |
| CC26 | 05CB | CC28 | 05D0 | CC30 | 05D6 | CC32 | 05EB |
| CC36 | 0615 | CI10 | 0D4E | CI12 | 0D54 | CI20 | 0D5B |
| CI30 | 0D69 | CLEAR | 0291 | CLOCK | 0843 | CLOKIN | 0D41 |
| CLR1 | 0294 | CM02 | 0851 | CM10 | 086A | CM20 | 086F |
| CM30 | 089C | CM40 | 08C2 | CM42 | 08C5 | CMS10 | 0537 |
| CMS20 | 0548 | COMP | 047E | COMP2 | 047F | CR1 | 0481 |
| CR15 | 048B | CR2 | 048D | D01 | 044F | D02 | 0450 |
| D04 | 045A | D05 | 045C | D06 | 046F | D09 | 0470 |
| D10 | 0475 | DBC02 | 0493 | DBC10 | 04A2 | DBC12 | 04A4 |
| DBC14 | 04A7 | DBC16 | 04AB | DBC20 | 04AF | DBC22 | 04B3 |
| DBC30 | 04BF | DBCNV | 049B | DBCVA | 048E | DIV | 044D |
| ERDISP | 0CDA | FCONV | 0309 | FCONV1 | 0312 | FCONV2 | 0318 |
| FCONV4 | 031D | FCONV5 | 0320 | FD1 | 02C7 | FD2 | 02CF |
| FD3 | 02D5 | FD4 | 02D6 | FDSPLY | 02B4 | * FI10 | 0D00 |
| FI12 | 0D0E | FI14 | 0D14 | FI20 | 0D1A | FI22 | 0D25 |
| FI24 | 0D28 | FI26 | 0D2D | FI28 | 0D3E | FI90 | 0D3F |
| FQ10 | 0821 | * FQ20 | 0825 | FREQ | 0810 | FREQIN | 0CFC |
| HOLD | 04EB | HOLD1 | 04F0 | * HOLDC | 0500 | IN101 | 04D4 |
| IN102 | 04DF | INT1 | 01A1 | INT12 | 01B2 | INT2 | 01C4 |
| INT22 | 01D1 | IOVF1 | 000E | ISIO | 01FB | ISIO1 | 0209 |
| ISIO2 | 0211 | ISIO3 | 021B | ISIO9 | 0222 | KEYINQ | 076E |
| KK02 | 078F | KK04 | 0790 | KK22 | 07AE | KK24 | 07C3 |
| KK26 | 07D4 | KK27 | 07D9 | KK28 | 07E1 | KK30 | 07F0 |
| LEDMCL | 029A | LEDMST | 02A2 | LOAD | 023F | LOAD1 | 0245 |
| LOAD2 | 0250 | LSFT1 | 0234 | LSFT2 | 023A | LSHIFT | 0231 |
| MAIN | 052D | MANUAL | 09B2 | MCLER | 023B | * MD20 | 0C42 |
| MD30 | 0C4C | MD40 | 0C5B | MD50 | 0C68 | MD52 | 0C71 |
| MD54 | 0C7F | MD56 | 0C83 | MD60 | 0C96 | MD70 | 0CA6 |
| MD80 | 0CB4 | MD88 | 0CD2 | MEMORY | 09DD | MM01 | 09F1 |
| MM02 | 09F7 | MM10 | 09FE | MM12 | 0A17 | MM20 | 0A1C |
| MM22 | 0A34 | MM30 | 0A3E | MM32 | 0A52 | MM40 | 0A63 |
| MM42 | 0A6E | MN01 | 09C0 | MN02 | 09C6 | MN10 | 09D8 |
| MODE | 0C22 | MOVE | 0255 | MOVEL | 026B | MOVEL1 | 0273 |
| MOVEL2 | 027E | MOVES | 027F | MOVES1 | 0285 | MOVES2 | 0290 |
| MUL | 0411 | MUL01 | 0412 | MUL02 | 0419 | MUL03 | 041C |
| MUL04 | 0421 | MUL05 | 042F | MUL09 | 043F | PE1 | 01F2 |
| PEEP | 01E8 | PL00 | 0DB5 | PL12 | 0DD1 | PL20 | 0DD5 |
| PL22 | 0DD9 | * PL30 | 0E33 | * PL40 | 0E43 | PL42 | 0E4C |
| PL44 | 0E6A | PL46 | 0E77 | PL48 | 0E7F | PL50 | 0E87 |
| PL60 | 0EC4 | PL61 | 0ED7 | PL62 | 0EE5 | PL64 | 0EF0 |
| * PL70 | 0F04 | PL72 | 0F09 | PL80 | 0F17 | PL82 | 0F2B |
| PLL1 | 0DA7 | PLL2 | 0DAA | PLLJM | 0D93 | PLLLD | 0D77 |
| PLLST | 0D83 | PM10 | 0BD9 | PM20 | 0BEB | PM25 | 0C05 |
| PM30 | 0C0E | PM31 | 0C19 | PM32 | 0C1A | PROGRM | 0BC6 |
| PWCHK | 0644 | PWOF0 | 064C | PWOF1 | 065F | PWOF2 | 068A |
| PWOF3 | 0697 | PWOF35 | 069A | PWOF4 | 06A0 | PWOF5 | 06A4 |
| RR1 | 0265 | RREAD | 0263 | RSFT1 | 022A | RSFT2 | 0230 |
| RSHIFT | 0227 | SM01 | 08D9 | SM02 | 08DF | SM10 | 08E6 |
| * SM20 | 08EA | SM22 | 08FD | SM30 | 0921 | SM40 | 0941 |
| SM42 | 094D | SM44 | 0952 | SM52 | 0976 | SM54 | 097E |
| SM60 | 0984 | SM62 | 099E | SM64 | 09A4 | START | 04C0 |
| STEP | 08CB | STORE | 0251 | STORE1 | 0257 | STORE2 | 0262 |
| SUB | 0440 | SUB1 | 0441 | SUB2 | 044A | TC10 | 0383 |
| TC12 | 038A | TC20 | 0394 | TC22 | 03A1 | TC30 | 03A9 |
| TC40 | 03B5 | TCHK | 0360 | TCHK1 | 0372 | TCHK2 | 0373 |
| TCONV | 0329 | TCONV2 | 0339 | TCONV9 | 033F | TDS10 | 02E4 |

| | | | | | | | |
|---|---|---|---|---|---|---|---|
| TDS20 | 02EA | TDS25 | 02F6 | TDS30 | 02F9 | TDSPLY | 02D9 |
| TIMCNT | 0378 | TIME | 0A7E | TIMER | 06BB | TM10 | 0A8C |
| TM12 | 0A97 | TM14 | 0AB0 | TM20 | 0AB6 | TM22 | 0AD8 |
| TM28 | 0AEE | TM30 | 0AF7 | TM32 | 0B0F | TM33 | 0B15 |
| TM34 | 0B20 | TM35 | 0B26 | TM36 | 0B30 | TM38 | 0B46 |
| TM40 | 0B4B | TM50 | 0B5B | TM60 | 0B78 | TM72 | 0BA5 |
| TM74 | 0BAF | TM80 | 0BBE | TR10 | 0040 | TR12 | 0049 |
| TR14 | 0054 | TR16 | 005A | TR18 | 005D | TR20 | 0063 |
| TR21 | 0071 | TR22 | 007B | TR23 | 0081 | TR30 | 008D |
| TR31 | 0094 | TR32 | 00A5 | TR33 | 00AC | TR40 | 00B4 |
| TR402 | 00BD | TR405 | 00C4 | TR41 | 00CD | TR42 | 00D1 |
| TR43 | 00DE | TR44 | 00E3 | TR45 | 00F4 | TR46 | 00F8 |
| TR47 | 00FA | TR48 | 0102 | TR50 | 0109 | TR502 | 0112 |
| TR51 | 0119 | TR55 | 012E | TR56 | 0136 | TR562 | 0139 |
| TR57 | 013E | TR58 | 0146 | TR59 | 014E | TR60 | 0150 |
| TR61 | 0156 | TR65 | 0167 | TR66 | 016E | TR665 | 0173 |
| TR67 | 0175 | TR68 | 0177 | TR685 | 0180 | TR69 | 0188 |
| TR695 | 018B | TR90 | 0194 | TS20 | 06CB | TS40 | 06D7 |
| TS42 | 06E3 | TS50 | 06F7 | TS52 | 0716 | TS54 | 071C |
| TS60 | 0723 | TS62 | 0726 | TS80 | 0732 | TS82 | 0757 |
| TS84 | 075C | W1 | 035A | W2 | 035C | W3 | 035D |
| WAIT1 | 01F6 | WAIT2 | 01FA | WAITRT | 01F3 | WAVEC2 | 0345 |
| WAVECH | 0340 | | | | | | |

DEFINED   329 USER SYMBOL(S)

The invention is claimed as follows:

1. A signal strength meter linearity control system for a radio receiver, said radio receiver including an automatic gain control circuit for producing an automatic gain control signal and a signal strength meter coupled for response to said automatic gain control signal; said control system comprising: current controlling circuit means coupled with said signal strength meter and responsive to a predetermined current control signal for controlling the current flow through said signal strength meter in a predetermined fashion so as to increase the linear range of response of said signal strength meter to the automatic gain control signal; and signalling circuit means coupled with said automatic gain control circuit and with said current controlling circuit means and responsive to said automatic gain control signal for producing said predetermined current control signal in a predetermined systematic fashion; wherein said current controlling circuit means comprises resistive means and switching means for alternately switching said resistive means into and out of series circuit with said signal strength meter.

2. A system according to claim 1 wherein said switching means includes control input means responsive to said predetermined current control signal for switching said resistive means into circuit with said signal strength meter.

3. A system according to claim 1 wherein said signalling circuit means comprises a lambda-shaped negative resistance device coupled intermediate said automatic gain control circuit and said switching means.

4. A system according to claim 3 wherein said switching means comprises transistor means having a pair of current carrying electrodes coupled respectively with said signal strength meter and said resistive means and a control electrode coupled with said lambda-shaped negative resistance device.

* * * * *